United States Patent
Placko et al.

(10) Patent No.: US 8,126,686 B2
(45) Date of Patent: Feb. 28, 2012

(54) UNIVERSAL METHOD FOR MODELING THE INTERACTIONS BETWEEN AT LEAST ONE WAVE AND AT LEAST ONE OBJECT, THE SURFACE OF EACH OBJECT DEFINING AN INTERFACE BETWEEN AT LEAST TWO MEDIA

(75) Inventors: Dominique Placko, Creteil (FR); Tribikram Kundu, Tucson, AZ (US); Aurélie Cruau, Noisy le Grand (FR); Nicolas Liebeaux, Cachan (FR)

(73) Assignees: Centre National de la Recherche Scientifique (FR); University of Arizona, Tucson, AZ (US)

(*) Notice: Subject to any disclaimer, the term of this patent is extended or adjusted under 35 U.S.C. 154(b) by 327 days.

(21) Appl. No.: 12/158,757

(22) PCT Filed: Dec. 20, 2006

(86) PCT No.: PCT/EP2006/070020
§ 371 (c)(1),
(2), (4) Date: Feb. 23, 2009

(87) PCT Pub. No.: WO2007/071735
PCT Pub. Date: Jun. 28, 2007

(65) Prior Publication Data
US 2010/0010781 A1    Jan. 14, 2010

(30) Foreign Application Priority Data
Dec. 23, 2005  (FR) ..................................... 05 13219

(51) Int. Cl.
G06G 7/56 (2006.01)
G06G 7/48 (2006.01)
(52) U.S. Cl. ................................ 703/5; 703/6

(58) Field of Classification Search .................. 703/5, 6
See application file for complete search history.

(56) References Cited

FOREIGN PATENT DOCUMENTS
FR         2847051         5/2004

OTHER PUBLICATIONS

Placko et al. "A Theoretical Study of Magnetic and Ultrasonic Sensors: Dependence of Magnetic Potential and Acoustic Pressure on the Sensor Geometry" SPIE vol. 4335, 2001.*

(Continued)

Primary Examiner — Saif Alhija
(74) Attorney, Agent, or Firm — Lowe Hauptman Ham & Berner, LLP

(57) ABSTRACT

A method for modeling the interactions between objects. The surface the objects define an interface between media. A set of elementary characteristic functions are chosen that correspond to the field of application. The physical properties the media are defined. Each object is modelled as a mesh and elementary point sources are associated with either side of each mesh element. The type of boundary conditions are determined for each interface. The global matrix for the interactions between the various objects is constructed, depending on the type of boundary conditions, the properties of the media and the configuration of the system. The global matrix is inverted. The inverted matrix is multiplied by a column matrix of the excitation boundary conditions. A column matrix is obtained containing the elementary point sources. At every point, the physical quantities representative of the interactions are calculated and an analytical model of the interactions is obtained.

10 Claims, 17 Drawing Sheets

OTHER PUBLICATIONS

Tribikram, Kundu, Dominique Placko, "Modeling of Ultrasonic Field by Distributed Point Source Method (Chapter 2 of Ultrasonic Nondesctructive Evaluation: Engineering and Biological Material Characterization)." 2004, CRC Press, ISBN 0-08493-1462-3, XP002385842, pp. 172-173.

Placko, D. et al. "Ultrasonic Filed Computation in the Presence of a Scatterer of Finite Dimension." Proceedings of the SPIE—The International Society for Optical Engineering SPIE-Int. Soc. Opt. Eng USA, vol. 5047, 2003, pp. 169-179, XP002358609, ISSN: 0277-786X.

Ahmad, Rais et al. "Modeling of Phase Array Transducers." Journal of the Acoustical Society of America, AIP/Acoustical Society of America, Melville, NY, US, vol. 117, No. 4, Apr. 2005, pp. 1762-1776, XP01207864, ISSN: 0001-4966.

Liebeaux, N. et al. "The Distributed Sources Method: A Concept for Open Magnetic Cores Modelling." European Physical Journal Applied Physics, EDP Sciences, Les Ulis, FR, vol. 20, No. 2, Nov. 2002, pp. 145-150, XP008021970, ISSN: 1286-0042.

Cruau, Aurelie et al. "V-Shaped Micromechanical Tunable Capacitors for RF Applications." Miscrosyst Technol; Microsystem Technologies; Symposium on Design, Test, Integration and Packaging of MEMS/MOEMS Dec. 2005, vol. 12, No. 1-2 Spec. Iss., Oct. 25, 2005, pp. 15-20, XP002385849.

Placko, D. et al. "Theoretical Computation of Acoustic Pressure Generated by Ultrasonic Sensors in the Presence of an Interface." Proceedings of the SPIE—The International Society for Optical Engineering SPIE-Int. Soc. Opt. Eng USA, vol. 4702, 2002, pp. 157-168, XP008021971, ISSN: 0277-786X.

Banerjee, Sourav et al. "Ultrasonic Field Modeling in Multilayered Fluid Structures Using the Distributed Point Source Method Technique." J Appl Mech Trans ASME; Journal of Applied Mechanics, Transactions ASME Jul. 2006, vol. 73, No. 4, Jul. 2006, pp. 598-609, XP009083281.

C.V. Dodd and W.E. Deed, "Analytical Solutions to Eddy Current Probecoil Problems." Journal of Applied Physics, 39 (6), pp. 2829 a 2838, 1968.

Michel Ney, Bases de l'electromagnetisme, Techniques de l'Ingenieur, ref. E1020.

"A High-Q Tunable Micromechanical capacitor with Movable Dielectric for RF Applications", J-B. Yoon et al., Int. EDM 2000, San Francisco.

4. "Study, design, fabrication and test of an RF MEMS variable Capacitance for the processing of frequencies between 0.5 and 20GHZ." Thesis Aurelie Cruau, Jan. 2005, Chapter 4, p. 120 and p. 125.

* cited by examiner

UNIVERSAL METHOD FOR MODELING THE INTERACTIONS BETWEEN AT LEAST ONE WAVE AND AT LEAST ONE OBJECT, THE SURFACE OF EACH OBJECT DEFINING AN INTERFACE BETWEEN AT LEAST TWO MEDIA

CROSS-REFERENCE TO RELATED APPLICATIONS

The present Application is based on International Application No. PCT/EP2006/070020, filed on Dec. 20, 2006, which in turn corresponds to French Application No. 0513219, filed on Dec. 23, 2005, and priority is hereby claimed under 35 USC §119 based on these applications. Each of these applications are hereby incorporated by reference in their entirety into the present application.

FIELD OF THE INVENTION

The present invention relates to a universal method for modeling the interaction between at least one wave and at least one object, the surface of each object defining an interface between at least two media.

BACKGROUND OF THE INVENTION

According to the French patent 2 847 051, a method is known that allows a physical quantity representative of an interaction between a wave and an obstacle to be evaluated. The implementation of this method is very useful in applications such as non-destructive testing. However, it can only be applied in a simple fashion to the case of a single interface separating one medium from another. Indeed, this method cannot be generalized to interactions with objects comprising several media, in particular owing to the high number of reflections and transmissions generated by the incident ultrasound wave when crossing the interfaces.

SUMMARY OF THE INVENTION

The subject of the present invention is a method for modeling the interactions between at least one wave and at least one object, the surface of each object defining an interface between at least two media with different physical properties, which method is simple to implement and is applicable in various fields of physics, for continuous, sinusoidal or pulsed time regimes, whatever the composition of the system studied.

In the whole of the following description, the notion of "system" will be used which, in the sense of the present invention, is a spatial domain within which the interactions that it is desired to model take place.

The method according to the invention is a method for modeling the interactions within a system between at least one wave and at least one object, the surface of each object defining an interface between at least two media, and it is characterized in that it comprises the following steps:

the set of elementary characteristic functions are chosen that correspond to the field of application in question (E1),
the physical properties of each medium considered composing the system are defined,
the geometrical structure of each object of the system is defined by modeling it as a mesh, and at least one test point is positioned at the surface of each mesh element,
at each test point, at least one test quantity is defined for each medium considered in order to establish continuity equations for the boundary conditions,
at least one elementary point source is associated with either side of each mesh element,
the objects are positioned with respect to one another within the space,
media are associated with the volumes bounded by the objects,
the type of boundary conditions are determined for each interface,
the global matrix for the interactions between the various objects is constructed, this matrix being formed from at least one matrix block characterizing the interactions between the objects taken in pairs, these interactions being linked to the propagation of the wave in the medium in question via the characteristic elementary functions chosen, the global matrix comprising, at the most, as many blocks as there are possible combinations between all the objects taken in pairs, the content of each block depending on the type of boundary conditions fixed at the test points, on the properties of the medium common to the two objects in question and on the geometrical configuration of these objects,
the global matrix is inverted,
the inverted matrix is multiplied by a column matrix containing the values of the excitation boundary conditions imposed by the user, and, where appropriate, zeros corresponding to the intrinsic boundary conditions,
a column matrix is obtained that contains the values of all of the elementary point sources,
at every observation point in the system, the physical quantities representative of the interactions within the system are calculated according to the regions of influence considered for the point sources;
an analytical model of the interactions within the system is obtained.

According to another feature of the invention, the test points are distributed randomly from one mesh element to the next in such a manner as to avoid favoring at least one particular direction of propagation.

According to another feature of the invention, macroscopic quantities are calculated in at least one part of the system.

According to another feature of the invention, the physical quantities created by all of the elementary point sources are displayed.

According to another feature of the invention, closed-volume objects are defined whose surface is always necessarily closed and forms a boundary between the medium external to the object and a medium internal to the object, and open-volume objects are defined whose surface is open owing to the fact that it represents an interface between semi-infinite media. When this interface is created, it is laterally bounded by a set of boundaries which are those of the workspace within which the interaction is being studied.

According to another feature of the invention, two kinds of boundary conditions are used, intrinsic boundary conditions and boundary conditions fixed by the user, the first representing the continuity of the scalar and/or vector quantities when crossing an interface between two media with determined or determinable properties, the second representing the a priori knowledge that the user has of the scalar and/or vector quantity for an interface.

BRIEF DESCRIPTION OF THE DRAWING

The present invention will be better understood upon reading the detailed description of one embodiment, taken as a non-limiting example and illustrated by the appended drawing, in which.

DETAILED DESCRIPTION OF THE DRAWING

Figure 1:
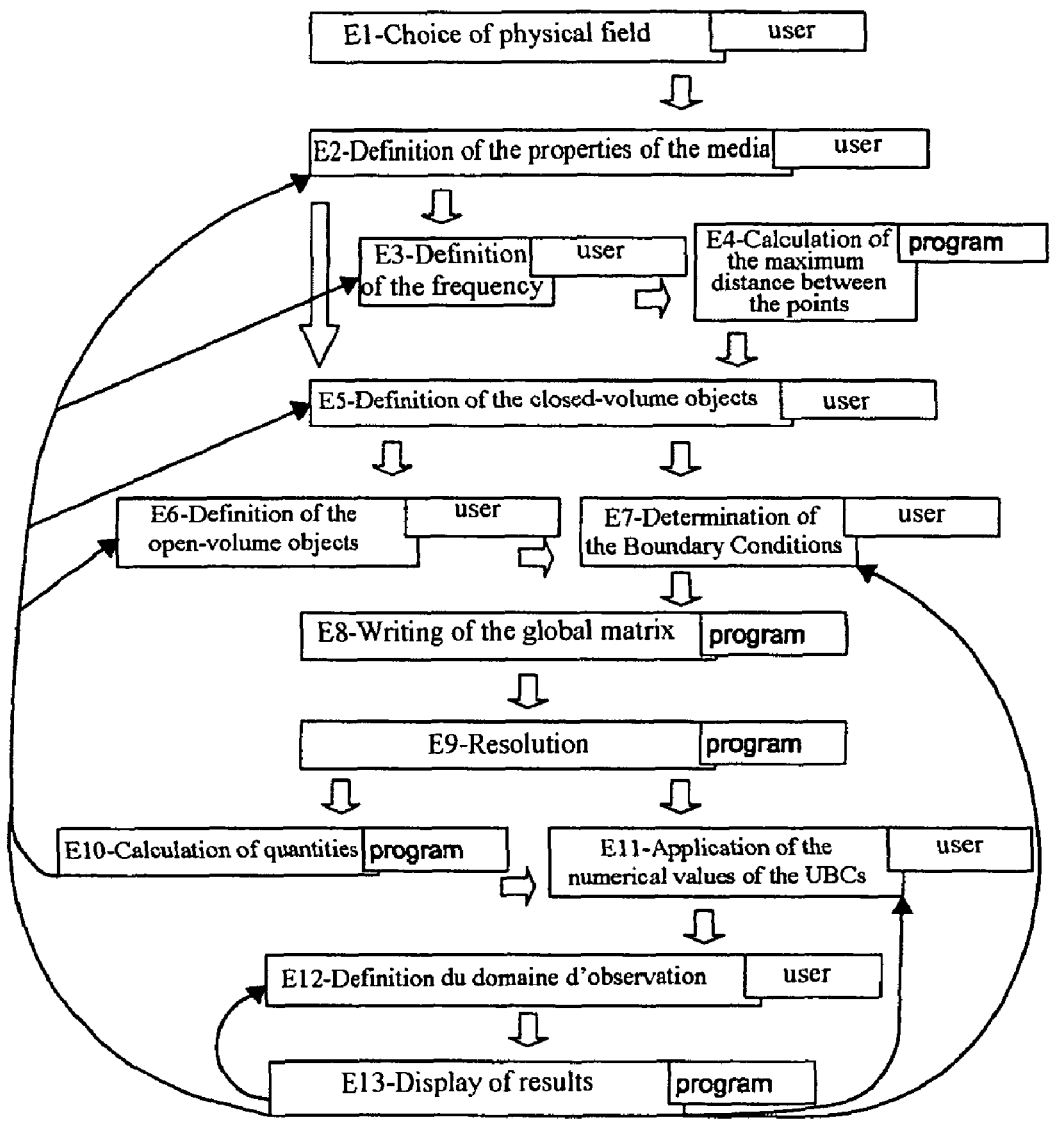
FIG. 1 is a simplified flow diagram of one embodiment of the method of the invention.

Since the principle of the method for modeling interactions between an incident wave and a homogeneous medium has been described in detail in said French patent 2 847 051, it will not be described again here, and will simply be mentioned under its abbreviation DPSM (Distributed Point Source Method). The present method is presented as an improvement on this method known for enabling it to be applied to non-homogeneous media.

Hereinbelow, several embodiments of the method of the invention will be described with reference non-destructive testing using ultrasound and using Foucault currents, but it will be understood that the invention is not limited to these applications alone, and that it can be implemented in all the applications implementing wave propagation phenomena in media comprising at least one interface, in very varied fields such as electromagnetism, magnetostatics, acoustics, optics, geophysics, Foucault currents, thermal phenomena, etc.

As mentioned hereinabove, the important feature forming the core of the invention consists in successively propagating the boundary conditions, using layers of point sources responsible for the synthesis of the quantities within a medium being considered, these layers of sources being disposed on either side of each of the interfaces.

Depending on the nature of the wave and the properties of the objects and media of a system in which the wave or waves propagate(s) causing said interactions, the modeling of these interactions consists, according to the invention, in formulating an equation for the response of each of the media, taken separately, to a point-like excitation, which results in one elementary characteristic function per medium considered. The physical nature of the sources used of course corresponds to the nature of the wave that it is desired to synthesize.

The calculation of the response to an excitation generally yields a scalar, vector or tensor potential and the characteristic quantities of the wave. The total response of the system is calculated medium by medium, by summing the contributions of all of the point sources radiating within the medium in question.

The global solution implies that the boundary conditions when crossing each of the interfaces are satisfied by imposing the continuity of the potential and of its derivative, in the direction normal to the interface in question, to within a constant. This set of conditions allows said global matrix to be obtained.

The number of equations obtained at each test point conditions the choice of the number of point sources placed on either side of the interface.

According to one exemplary embodiment of the invention in electrostatics, the electric potential corresponds to a scalar potential V and its derivative in the direction normal to the surface of the interface in question corresponds to the normal component of the electric field $\vec{E}$, and the quantity whose continuity is to be ensured is the component normal to the surface of the interface of the electric displacement $D_N = \in E_N$. Two equations with two unknowns are thus obtained at each test point if one source is placed on either side of each mesh element (namely, V and $D_N$). These sources are equivalent to electrostatic charges.

In electromagnetism, if the media in question are conducting, it will be noted that the potential is a vector, as is its component in the direction normal to the surface of the interface in question. Thus, for each test point, six equations with six unknowns are obtained $$\left(\text{namely, three components of } \vec{A} \text{ and three components of } \frac{\partial \vec{A}}{\partial \vec{n}}\right)$$

owing to the fact that, at each test point, there is a triplet on either side of the mesh element. The sources forming these triplets are equivalent to current elements respectively oriented along the Cartesian axes of these triplets.

The description of the system in equation form being thus formulated globally with the aid of a single global matrix that takes into account all the interactions between the various media. The value of the energy radiated by each source is then calculated using the inverse global matrix and boundary conditions fixed by the user, as described hereinabove.

Advantageously, said elementary characteristic function is a Green's function.

In the three explanatory diagrams that follow, a segment of straight line represents a portion of interface on either side of which, or on one side of which, spherical surfaces containing at least one point source are shown, these surfaces being tangent to the interface. These point sources and the spherical surfaces containing them result from a mesh that models, in the sense of the aforementioned French patent 2 847 051, either a transducer or an interface. In the diagrams hereinbelow, light gray circles correspond to intrinsic boundary conditions, and dark gray circles correspond to boundary conditions fixed by the user. Each mesh element is associated with a spherical surface containing at least one point source.

In one particular case, the point of contact between these spherical surfaces and the interface is a test point, but it will be clearly understood that several test points may be distributed within each mesh element.

The total number of unknown parameters for the sources must be equal to the total number of equations available, the number of equations being adjusted by a corresponding choice of the number of test points.

Intrinsic Boundary Conditions (IBC)

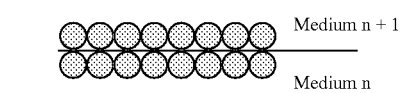

When crossing the interfaces, the 'natural' continuity is ensured by the IBCs. The sources shown in the medium n+1 only serve to propagate the wave into the medium n, and vice versa.

User Boundary Conditions (UBC)

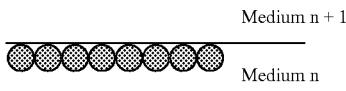

Medium n + 1
Medium n

The UBCs notably represent the presence of an excitation within the system. The figure hereinbelow shows, for example, a UBC valid toward the medium n+1. In this example, the sources of the Medium n+1 do not exist, since no quantity is calculated in the Medium n, but it will be clearly understood that this does not however exclude the possibility of placing sources in the Medium n+1, these sources radiating into the Medium n. For example, in electrostatics or in electrodynamics, the electrostatic potential, expressed in volts, on one electrode of a capacitor is constant and generally fixed by the user.

Mixed Boundary Conditions (IBC/UBC)

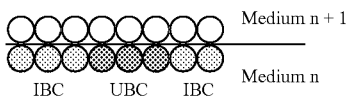

IBC  UBC  IBC   Medium n + 1
                Medium n

These boundary conditions adopt the definitions hereinabove. The other point sources mesh modeling the interface only serve to establish IBCs between the medium n and the medium n+1.

Whatever the boundary conditions, all the point sources may be configured individually and possess their own specific radiation pattern.

Once the physical properties have been defined of each medium forming a system with N objects within which the interactions being studied take place, and once the various interfaces have been mesh modeled, the global matrix of the interactions being studied is constructed in the following manner.

$$N \text{ blocks} \left\{ \begin{pmatrix} C \\ O \\ N \\ D \\ I \\ T \\ I \\ O \\ N \\ S \end{pmatrix} \right\} =$$

-continued $$\begin{pmatrix} [IBC]^{11} & [IBC]^{12} & \ldots & [UBC]^{1N} \\ & & [IBC]^{ij} & \\ \vdots & & & \vdots \\ [IBC]^{N1} & [UBC]^{N2} & \ldots & \ddots \end{pmatrix} \cdot \left. \begin{pmatrix} S \\ O \\ U \\ R \\ C \\ E \\ S \end{pmatrix} \right\} Nblocks$$

Since the system comprises N objects, the matrix comprises N×N blocks. These blocks, or elementary matrices, represent the conditions for passing between the various objects. The block with coordinates (i,j) represents the share of boundary conditions calculated on the interface of the object i due to the influence of the object j (the objects i and j interact in a common medium).

According to one feature of the invention, the total number of source components must be adapted to the total number of test points.

If there is a UBC on the object i (line i of the matrix), then the block vector CONDITIONS n° i comprises the value of the UBC in question.

When the user fixes the value of the sources associated with a UBC himself, the corresponding block CONDITIONS is equal to the value of these sources. The corresponding UBC matrix is an identity matrix.

If only IBCs are applicable on the object, then the corresponding block of the vector CONDITIONS is zero.

According to one feature of the invention, the elementary matrices [IBC] are formed from types of sub-matrix denoted M and Q in the examples described hereinbelow. These sub-matrices are calculated according to the fields of application (ultrasonics, electromagnetism, acoustics, etc.) in order to respectively ensure the continuity of the quantities at the interfaces, for example the normal and tangential components of a vector quantity, or else a scalar quantity and a normal vector component.

The same goes for UBC matrices, but one of the quantities is then imposed by the user.

After having presented the basic principles of the method of the invention, the various steps will now be described, with reference to the flow diagram in FIG. 1, that are implemented by the program of the invention in order to solve in practice the modeling of the interactions between objects bounding media with different properties. Since this program is interactive, it is stated for each of its steps whether it is executed on the initiative of the user or on that of the implementing computer, the latter principally carrying out equation calculation and display steps.

Given that the invention is applicable to very diverse physical fields, such as electromagnetism, magnetostatics, acoustics, Foucault currents or thermal phenomena, the first step (step E 1) is to require the user to choose all of the elementary characteristic functions corresponding to the field of application in question.

The user then defines the properties of the media within which the interactions to be modeled take place (step E 2). These properties comprise all the relevant parameters of the media. The type of properties of the media will depend on the problem being studied. For example, for electrostatics, the relative permittivity is an indispensable parameter. This step will allow the Correspondence Indicators to be created which indicate the media adjacent to each object. The objects are associated with two media according to the formulation: $i(\alpha, \beta)$ where i denotes the object and $\alpha$ and $\beta$ the media adjacent to i. Each object has its Correspondence Indicator, which allows the sources that are to be taken into account in the interactions to be determined, as presented hereinbelow with reference to several simplified examples.

Starting from step E 2, there are two possibilities: either carry out steps E 3, E 4 and E 5, or go directly to step E 5. Steps E3 and E4 are only carried out when wave propagation phenomena are to be taken into account. At step E 3, the user defines the frequency of the waves that are to be emitted by the transducer emitter. Once this frequency has been defined, the program calculates (step E 4) the maximum distance between the point sources (in other words their pitch, for a regular configuration of sources), depending on the characteristics of the interactions. This pitch is preferably less than a half wavelength of the wave responsible for these interactions.

At step E 5, the user defines closed-volume objects (hereinafter denoted CVO). This step essentially consists in defining such objects geometrically and in determining the pitch of the mesh so as to be able to implement the method of the invention, the mesh being generated in the manner described in said French DPSM patent.

According to the invention, a closed-volume object (CVO) is such that its surface is necessarily closed (for example, a sphere, a pyramid or a cube). This surface is a boundary between the external medium and a medium internal to the object, with different properties. If the user does not wish to calculate any quantity within this medium, he must then apply boundary conditions (determined by himself and here denoted UBC) to its surface. The volume of this object may tend toward zero (for example, for flat electrodes of a capacitor).

Again according to the invention, an open-volume object (here denoted OVO) is such that the surface of this object is open (in theory, this volume is closed at infinity). It represents a boundary between semi-infinite media. When an interface is created in order to represent this configuration, it is necessarily bounded laterally by a set of borders. These borders also become those of the study and no observation of quantities outside of the space bounded by these borders will be possible. This workspace is therefore automatically bounded. The objects and media considered by the invention necessarily belong to the workspace.

Figures 6, 7:
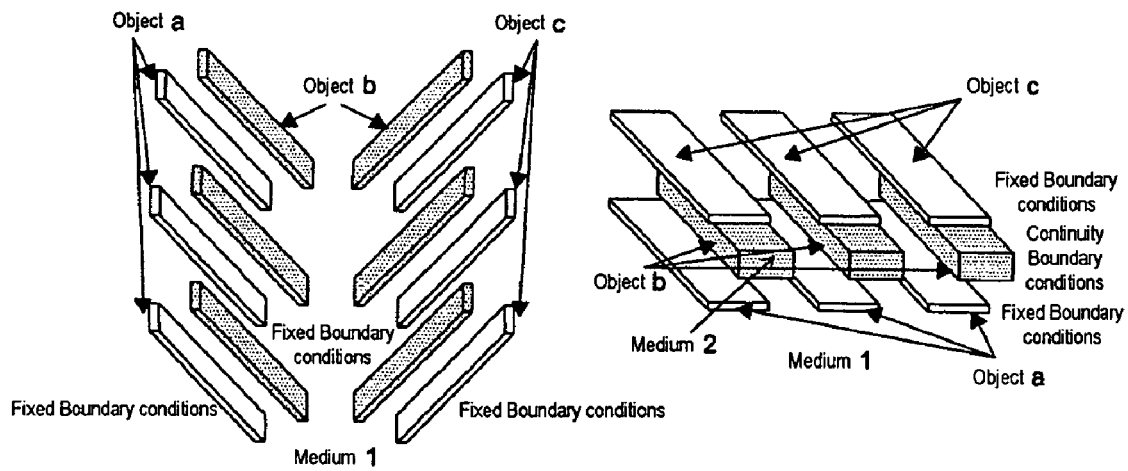
Figure 8:
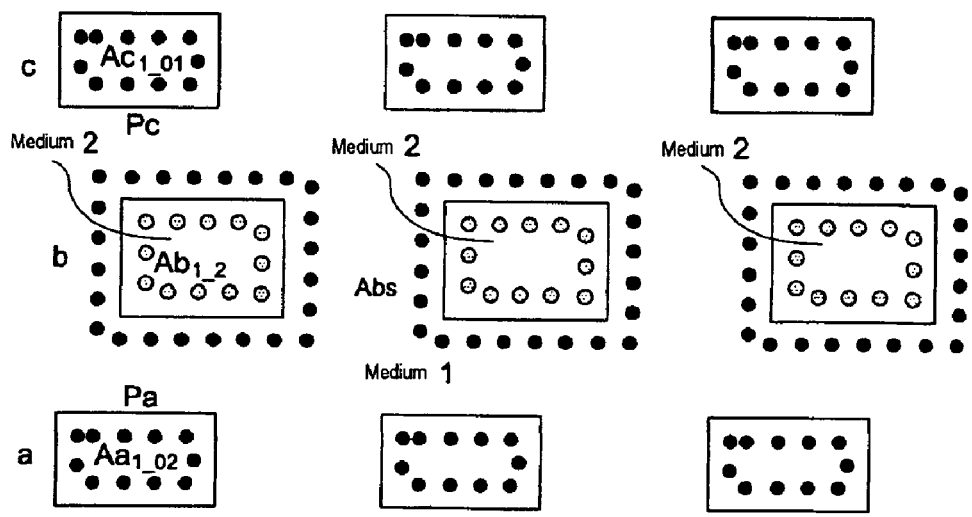

If the problem to be solved only comprises closed-volume objects, then it is not necessary to bound the workspace. By way of illustration, the problem of the study of the electric field created in space by two charged spheres does not require a workspace. Similarly, the example described hereinbelow with reference to FIGS. 6 to 8 shows two systems unbounded in space.

If the entire system is contained within a CVO with internal UBCs for the object, its surface bounds the workspace (as in the example described hereinabove with reference to FIGS. 4 and 5).

Indeed, a medium is defined by its homogeneous physical properties. A medium is necessarily closed, either because it is contained within a CVO or because it is bounded by one or more open-volume objects (here denoted OVO) and by the borders bounding the workspace. In order to define a medium, its localization and its physical properties must be known. In the description that follows, the media are referenced by numbers.

The surfaces of the objects define the interfaces between two media. In order to define an object, it is necessary to know:
1. its dimensions and its localization.
2. the boundary conditions applicable on its surface.
3. the media with which the object is in contact.

In the present description, objects are referenced by letters. The creation of the objects corresponds to a discretization of the surfaces of these objects into sets of points P with which the set of point sources responsible for synthesizing the waves propagating within the system are associated. These objects determine interfaces on which the Boundary Conditions (BC) are applied.

Starting from the step E 5, the user either proceeds via a step E 6 for defining OVOs (if such objects are present) in order to arrive at step E 7, or otherwise goes directly to step E 7.

The definition and/or the mesh modeling of all or part of the system can be provided by a device or a software application external to the invention.

Step E 7 consists in determining boundary conditions, which form one of the essential conditions for the implementation of the method of the invention. These boundary conditions are placed on an interface which is, as stated hereinabove, a separating surface between two media with different properties. Another feature of the invention is to associate layers of point sources only with the surfaces of the objects (whether they be OVOs or CVOs). The invention takes into account two types of boundary conditions:
1. Intrinsic boundary conditions (IBC), which represent the continuity of the scalar and/or vector quantities when crossing an interface between two media with known properties. According to the basic principle of the method of the invention, these IBCs will be satisfied thanks to sets of sources situated on either side of the surface. In the majority of cases, the user does not need to worry about these IBCs.
2. The boundary conditions fixed by the user (UBC), which represent the a priori knowledge that the user has of the scalar and/or vector quantities on the interface. According to the basic principle of the method of the invention, these UBCs will be satisfied thanks to a single set of sources situated on one side of the interface. It is noted that these boundary conditions represent the presence of sources of energy within the system. Such a UBC is, for example in a capacitor, the electric scalar potential difference between the electrodes, which is often known since fixed by the user.

Once the boundary conditions have been determined for all the interfaces, having received all the data required for its execution, the program will go to step E 8 for writing the global matrix.

This step E 8 begins firstly by determining the coupling matrices between interfaces which requires an operation known as masking. Masking denotes the fact that some objects in the system may mutually screen one another (projected shadow), as explained hereinbelow with reference to FIGS. 2 to 8. This operation for masking the objects from one another requires the application of a test function. The latter may be applied during the filling of the matrices or else separately in order to construct a masking matrix (filled with 0s or 1s). Element-by-element multiplication of this mask with the original coupling matrix calculated without test will enable the matrix effectively used in the algorithm to be obtained.

In order to determine which coupling matrices to calculate, a test procedure, described hereinbelow, has been established. Once all the coupling matrices have been calculated, the global matrix is organized by blocks. In the media definition step, a matrix containing the main information, namely the relative position of the media and the objects together with their properties, has been created using the correspondence indicators. Starting from this matrix, and by using tests allowing the objects to be coupled and according to which types of BC to be determined, the global matrix is written by blocks in such a manner as to systematically take all the interactions into account. By categorizing the source groups in the order of the interactions, the blocks will be placed principally on and around the diagonal.

With the object-medium Correspondence Indicators created in the preceding step, it may readily be tested whether two or more objects have a common medium. Then, the coupling matrices for the objects that interact in the same medium are written. For example, for two objects i and j having a common interaction medium $\alpha$, the matrices obtained will be written according to the formulation: $M_{i\_j}^{\alpha-\beta}$ or $Q_{i\_j}^{\alpha-\beta}$. This reads as the interaction of the object j on the object i in their common medium $\alpha$, the sources of j being in the medium $\beta$. Similarly, the sources associated with the object j, being in the medium $\beta$ and radiating into the medium $\alpha$, are denoted by $Aj_{\alpha\_\beta}$.

All the coupling matrices M and Q having the same common medium $\alpha$ must be of the same sign in the global matrix.

For each interface with IBCs, the continuity of the scalar quantity (matrix Q) and of the normal component of the vector quantity (matrix M) is ensured, at least in these examples. For example, in electrostatics, these quantities are the electric potential and the normal component of the field $\vec{D}$; in ultrasonics, the pressure and the normal component of the velocity.

For each interface with UBCs, a single matrix equation (matrix M or Q) is applied, since the boundary conditions on the surface are imposed by the user (for example, electrodes supplied with a given voltage).

Once the global matrix has been written, the program solves the matrix equation (step E9), this step essentially consisting in inverting the global matrix.

Owing to the fact that certain quantities (for example the capacitance of a capacitor) do not require the numerical values of the UBCs to be known in order to be calculated, they can therefore be obtained directly after the inversion, which the program does directly (step E 10). In the case where such quantities do not exist, or if, in addition to such quantities, other physical quantities need to be calculated, the user intervenes in order to supply the missing data to the program (step E 11).

The missing data for the calculation of the physical quantities necessary for the modeling of the interactions are requested from the user depending on the types of boundary conditions that were fixed at step E 7 (for example, the value of the constant potential on a metal electrode).

This missing data having been supplied by the user, he then goes to the step for defining the field of observation to be displayed (step E 12). The freedom of choice of the user for the calculations and observations will depend on whether he includes step E 6 or not: if the workspace was not bounded during this step (the system hosting the interactions only comprises CVOs), there is no restriction on the region of display. In the opposite case, he must define the workspace which will be automatically bounded.

Subsequently (step E 13), the program begins by mesh modeling the spaces provided by the user. Then, it calculates the physical quantities involved in the interactions being studied, according to the same procedure as that used for the calculation of the coupling matrices, this time applied to the points in the display space. Lastly, the program traces the graphical representations of the interaction phenomena within the system. The lateral arrows shown in FIG. 1 indicate that the program can be looped back so as to allow the user to return to the structure in order to modify it and to observe the new results obtained.

The possible modifications relate to the definitions (objects, media, boundary conditions, etc.), as indicated in FIG. 1 by the arrows starting from steps E 10 and E 13 and directed toward steps E 2, E 3, E 5, E6, E7, E11 and E12. These modifications allow the influence of a displacement (of the OVOs and/or of the OVFs), of a change in properties of the objects or of the media to be studied.

The three examples described hereinbelow with reference to FIGS. 2 to 8 illustrate the technique of writing the global matrix according to the invention.

Figure 2:
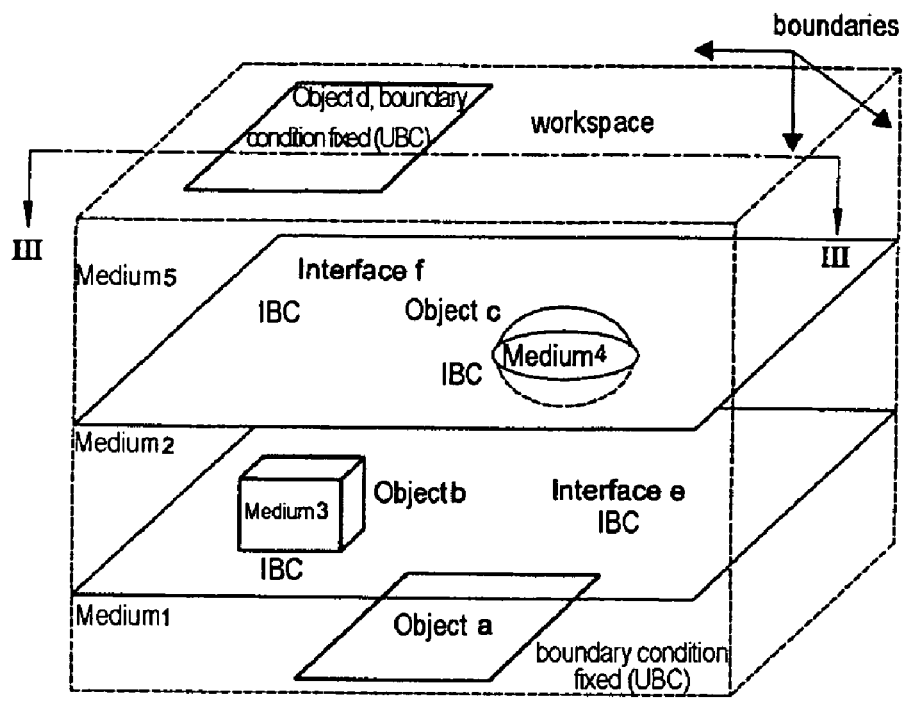
FIGS. 2 to 8 are simplified schematic diagrams of systems on which the method of the invention is implemented.
Figure 3:
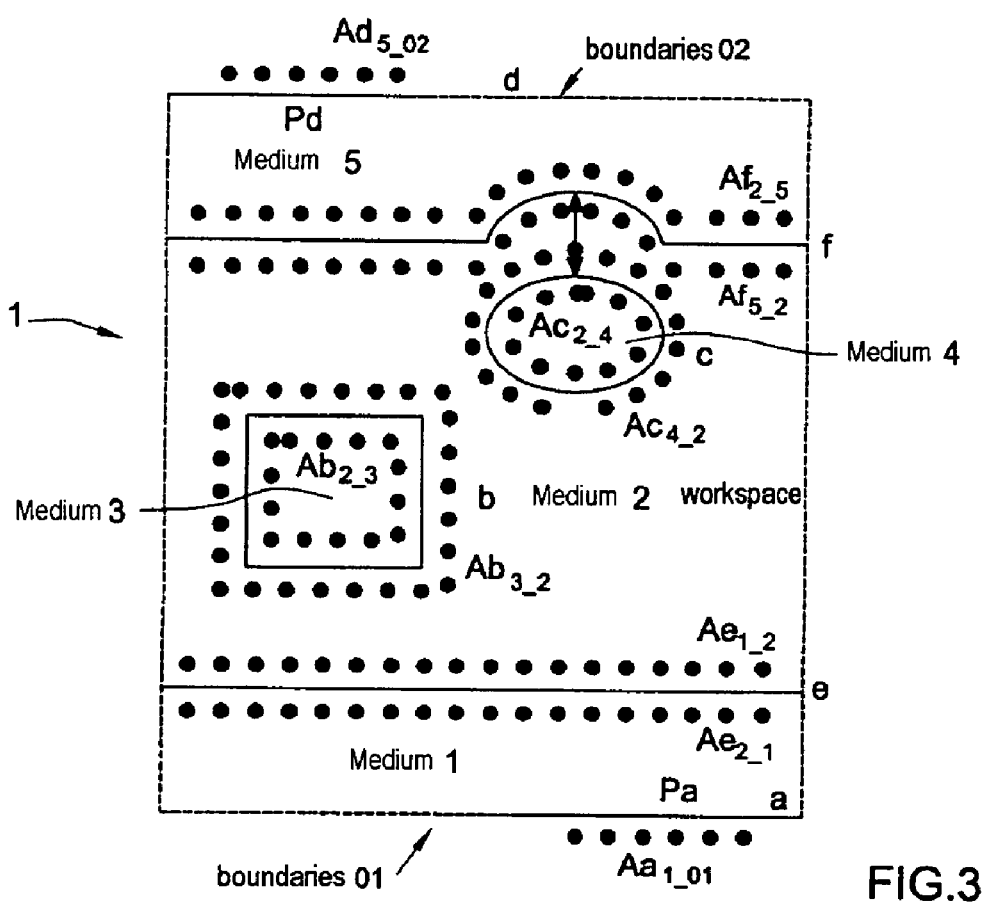

In FIGS. 2 and 3, the case of a planar multilayer system 1 is shown, FIG. 2 being a very simplified perspective view, and FIG. 3 a cross-sectional view along III-III in FIG. 2.

The system 1 shown in FIGS. 2 and 3 has a general shape of a rectangular parallelepiped whose six faces are boundaries of the workspace. It has a multidomainal structure comprising five media respectively referenced Medium 1 to Medium 5 and six objects respectively referenced a to f. For example, the interface between Medium 1 and Medium 2 is referenced e, and that between Medium 2 and Medium 3 is referenced b. Two CVOs a and d, here capacitor electrodes, are in contact with the lower and upper faces of the workspace. Medium 2 comprises a first inclusion b and a second inclusion c, which is in contact with the interface f. It will be noted that Medium 0 defines the outside of the workspace which is unknown and of no interest to the user.

The six different interfaces are referenced in the following manner:
a: between media 0 and 1
b: between media 2 and 3
c: between media 2 and 4
d: between media 5 and 0
e: between media 1 and 2
f: between media 2 and 5

The UBC relating to the electrode a is written Pa (potential imposed by this electrode at the interface a), and the UBC imposed by the electrode d is written Pd (potential imposed by this electrode at the interface d).

The source vectors generated at each of the interfaces a to f are written:
Interface a: $Aa_{1\_01}$ (on the side of the electrode a)
Interface b: $Ab_{3\_2}$ (in the medium 2) and $Ab_{2\_3}$ (in the medium 3)
Interface c: $Ac_{4\_2}$ (in the medium 2) and $Ac_{2\_4}$ (in the medium 4)
Interface d: $Ad_{5\_02}$ (on the side of the electrode d)
Interface e: $Ae_{2\_1}$ (in the medium 1) and $Ae_{1\_2}$ (in the medium 2)
Interface f: $Af_{5\_2}$ (in the medium 2) and $Af_{2\_5}$ (in the medium 5)

According to what has been presented above, a correspondence indicator, relating for example to the interface c, is written: c(4,2). In the examples hereinbelow, the correspondence indicators appear between the two large parentheses and allow the existence of non-zero coupling matrices to be determined:

$$Q_{a\_e}^{1\_2}, \quad \begin{pmatrix} a(01,1) \\ b(3,2) \\ c(4,2) \\ d(02,5) \\ e(1,2) \\ f(5,2) \end{pmatrix} \begin{cases} M_{b\_c}^{2\_4}, Q_{b\_c}^{2\_4}, \\ M_{c\_b}^{2\_3}, Q_{c\_b}^{2\_3} \\ M_{d\_f}^{5\_2}, Q_{d\_f}^{5\_2}, \\ M_{f\_d}^{5\_02}, Q_{f\_d}^{5\_02} \end{cases}$$

The boundary conditions of the object 2 are then:

UBC on $a, Q_{a\_a}^{1-01} \cdot Aa_{1\_01} + Q_{a\_e}^{1-2} \cdot Ae_{1\_2} = Pa$ UBC on $b, M_{b\_b}^{3-2} \cdot Ab_{3\_2} = M_{b\_b}^{2-3} \cdot Ab_{2\_3} + M_{b\_v}^{2-4} \cdot Ac_{2\_4} + M_{b\_e}^{2-1} \cdot Ae_{2\_1} + M_{b\_f}^{2-5} \cdot Af_{2\_5}$ $Q_{b\_b}^{3-2} \cdot Ab_{2\_3} = Q_{b\_b}^{2-3} \cdot Ab_{2\_3} + Q_{b\_c}^{2-4} \cdot Ac_{2\_4} + Q_{b\_e}^{2-1} \cdot Ae_{2\_1} + Q_{b\_f}^{2-5} \cdot Af_{2\_5}$ IBC on $c, M_{c\_c}^{4-2} \cdot Ac_{4\_2} = M_{c\_c}^{2-4} \cdot Ac_{2\_4} + M_{c\_b}^{2-3} \cdot Ab_{2\_3} + M_{c\_e}^{2-1} \cdot Ae_{2\_1} + M_{c\_f}^{2-5} \cdot Af_{2\_5}$ $Q_{c\_c}^{4-2} \cdot Ac_{4\_2} = Q_{c\_c}^{2-4} \cdot Ac_{2\_4} + Q_{c\_b}^{2-3} \cdot Ab_{2\_3} + Q_{c\_e}^{2-1} \cdot Ae_{2\_1} + Q_{f\_c}^{2-5} \cdot Af_{2\_5}$ UBC on $d, Q_{d\_d}^{5-02} \cdot Ad_{5\_02} + Q_{d\_f}^{5-2} \cdot Af_{5\_2} = Pd$ IBC on $e, M_{e\_e}^{1-2} \cdot Ae_{1\_2} + M_{e\_a}^{1-01} \cdot Aa_{1\_01} = M_{e\_e}^{2-1} \cdot Ae_{2\_1} + M_{e\_b}^{2-3} \cdot Ab_{2\_3} + M_{e\_c}^{2-4} \cdot Ac_{2\_4} + M_{e\_f}^{2-5} \cdot Af_{2\_5}$ $Q_{e\_e}^{1-2} \cdot Ae_{1\_2} + Q_{e\_a}^{1-01} \cdot Aa_{1\_01} = Q_{e\_e}^{2-1} \cdot Ae_{2\_1} + Q_{e\_b}^{2-3} \cdot Ab_{2\_3} + Q_{e\_c}^{2-4} \cdot Ac_{2\_4} + Q_{e\_f}^{2-5} \cdot Af_{2\_5}$ IBC on $f, M_{f\_f}^{5-2} \cdot Af_{5\_2} + M_{f\_d}^{5-02} \cdot Ad_{5\_02} = M_{f\_f}^{2-5} \cdot Af_{2\_5} + M_{f\_c}^{2-4} \cdot Ac_{2\_4} + M_{f\_b}^{2-3} \cdot Ab_{2\_3} + M_{f\_e}^{2-1} \cdot Ae_{2\_1}$ $Q_{f\_f}^{5-2} \cdot Af_{5\_2} + Q_{f\_d}^{5-02} \cdot Ad_{5\_02} = Q_{f\_f}^{2-5} \cdot Af_{2\_5} + Q_{f\_c}^{2-4} \cdot Ac_{2\_4} + Q_{f\_b}^{2-3} \cdot Ab_{2\_3} + Q_{f\_e}^{2-1} \cdot Ae_{2\_1}$ (A1)

and the corresponding matrix equation is:

$$\begin{bmatrix} P_a \\ 0 \\ 0 \\ 0 \\ 0 \\ P_d \\ 0 \\ 0 \\ 0 \\ 0 \end{bmatrix} = \begin{bmatrix} Q_{a\_a}^{1\_01} & 0 & 0 & 0 & 0 & 0 & Q_{a\_e}^{1\_2} & 0 & 0 & 0 \\ 0 & -Q_{b\_b}^{3\_2} & Q_{b\_b}^{2\_3} & Q_{b\_c}^{2\_4} & 0 & 0 & 0 & Q_{b\_e}^{2\_1} & 0 & Q_{b\_f}^{2\_5} \\ 0 & -M_{b\_b}^{3\_2} & M_{b\_b}^{2\_3} & M_{b\_c}^{2\_4} & 0 & 0 & 0 & M_{b\_e}^{2\_1} & 0 & M_{b\_f}^{2\_5} \\ 0 & 0 & Q_{c\_b}^{2\_3} & -Q_{c\_c}^{4\_2} & Q_{c\_c}^{2\_4} & 0 & 0 & Q_{c\_e}^{2\_1} & 0 & Q_{c\_f}^{2\_5} \\ 0 & 0 & M_{c\_b}^{2\_3} & -M_{c\_c}^{4\_2} & M_{c\_c}^{2\_4} & 0 & 0 & M_{c\_e}^{2\_1} & 0 & M_{c\_f}^{2\_5} \\ 0 & 0 & 0 & 0 & 0 & Q_{d\_d}^{5\_02} & 0 & 0 & Q_{d\_f}^{5\_02} & 0 \\ -Q_{e\_a}^{1\_01} & 0 & Q_{e\_b}^{2\_3} & Q_{e\_c}^{2\_4} & 0 & 0 & -Q_{e\_e}^{1\_2} & Q_{e\_e}^{2\_1} & 0 & Q_{e\_f}^{2\_5} \\ -M_{e\_a}^{1\_01} & 0 & M_{e\_b}^{2\_3} & M_{e\_c}^{2\_4} & 0 & 0 & -M_{e\_e}^{1\_2} & M_{e\_e}^{2\_1} & 0 & M_{e\_f}^{2\_5} \\ 0 & 0 & Q_{f\_b}^{2\_3} & Q_{f\_c}^{2\_4} & 0 & -Q_{f\_d}^{5\_02} & 0 & Q_{f\_e}^{2\_1} & -Q_{f\_f}^{5\_2} & Q_{f\_f}^{2\_5} \\ 0 & 0 & M_{f\_b}^{2\_3} & M_{f\_c}^{2\_4} & 0 & -M_{f\_d}^{5\_02} & 0 & M_{f\_e}^{2\_1} & -M_{f\_f}^{5\_2} & M_{f\_f}^{2\_5} \end{bmatrix} \cdot \begin{bmatrix} Aa_{1\_01} \\ Ab_{3\_2} \\ Ab_{2\_3} \\ Ac_{2\_4} \\ Ac_{4\_2} \\ Ad_{5\_02} \\ Ae_{1\_2} \\ Ae_{2\_1} \\ Af_{5\_2} \\ Af_{2\_5} \end{bmatrix}$$ (A2)

Figure 4:
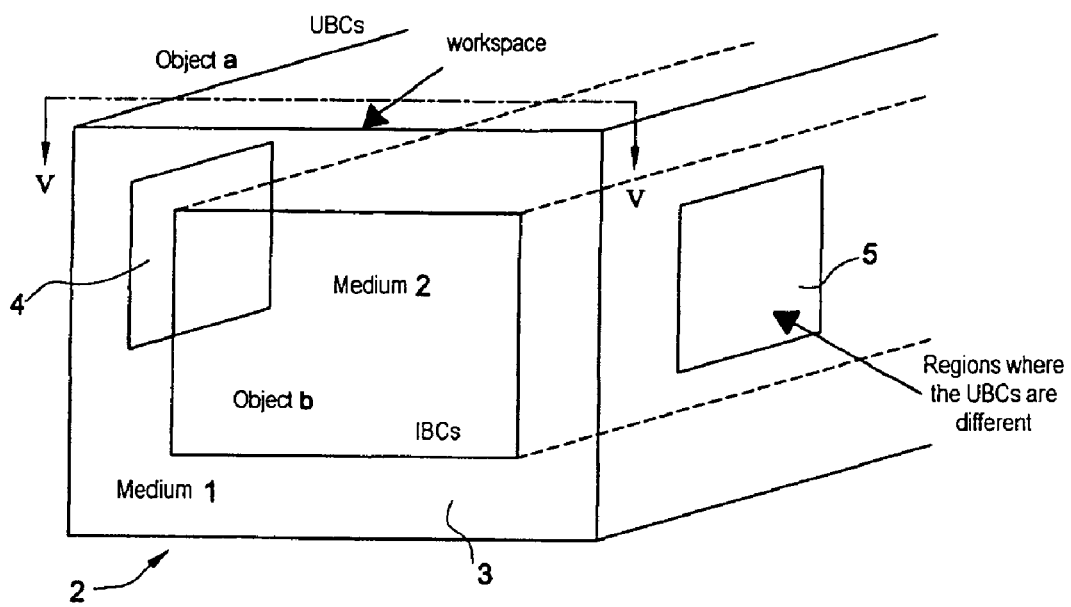
Figure 5:
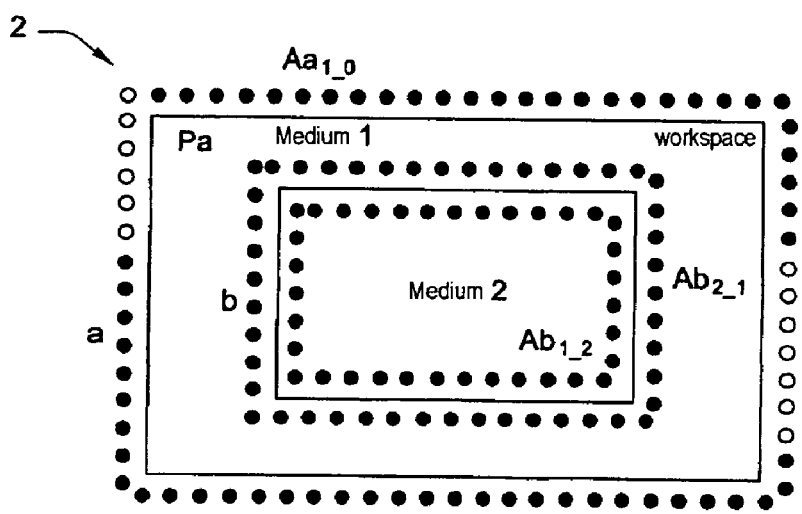

In FIGS. 4 (simplified perspective view) and 5 (cross-sectional view along V-V in FIG. 4) an example of a closed system 2 is shown.

The system 2 comprises a hollow tube 3 of rectangular cross section, that here is denoted object a and which contains the medium 1 and also the medium 2 (bounded by the object b). Electrodes 4 and 5 are applied onto two opposing faces of the object a. On the transverse cross section in FIG. 5, the various layers of point sources are indicated: $Aa_{1\_0}$ on the external face of the object a, $Ab_{2\_1}$ and $Ab_{1\_2}$ on either side of the interface between the media 1 and 2, in the medium 1 and in the medium 2, respectively. It will be noted that at the location of application of the electrodes 4 and 5, the point sources are shown differently from the others, because these are primary sources that indicate the presence of active surfaces. The boundary condition vector Pa therefore contains UBCs and IBCs.

The coupling matrix and the correspondence indicators of the system 2 are written:

$$\begin{pmatrix} a(0,1) \\ b(1,2) \end{pmatrix} \begin{cases} M_{b\_a}^{1\_0}, Q_{b\_a}^{1\_0}, \\ Q_{a\_b}^{1\_2} \end{cases}$$

The boundary conditions are then written:

UBC on $a, Q_{a\_a}^{1-0} \cdot Aa_{1\_0} + Q_{a\_b}^{1-2} \cdot Ab_{1\_2} = P_a$ IBC on $b, M_{b\_b}^{2-1} \cdot Ab_{2\_1} = M_{b\_b}^{1-2} \cdot Ab_{1\_2} + M_{b\_a}^{1-0} \cdot Aa_{1\_0}$ $Q_{b\_b}^{2-1} \cdot Ab_{2\_1} = Q_{b\_b}^{1-2} \cdot Ab_{1\_2} + Q_{b\_a}^{1-0} \cdot Aa_{1\_0}$ or:

$$\begin{bmatrix} P_a \\ 0 \\ 0 \end{bmatrix} = \begin{bmatrix} Q_{a\_a}^{1\_0} & Q_{a\_b}^{1\_2} & 0 \\ Q_{b\_a}^{1\_0} & Q_{b\_b}^{1\_2} & -Q_{b\_b}^{2\_1} \\ M_{b\_a}^{1\_1} & M_{b\_b}^{1\_2} & -M_{b\_b}^{2\_1} \end{bmatrix} \cdot \begin{bmatrix} Aa_{1\_0} \\ Ab_{1\_2} \\ Ab_{2\_1} \end{bmatrix}$$

The last two examples are illustrated in FIGS. 6 to 8. These are two variant embodiments of micro-capacitors with variable or adjustable capacitance, such as are respectively described in: "V-shaped micromechanical tunable capacitor for RF applications", A. Cruau et al, DTIP2004, Montreux, and in "A high-Q tunable micromechanical capacitor with movable dielectric for RF applications", J-B. Yoon et al., Intl. EDM 2000, San Francisco. Only their features relating to the application of the method of the invention will be presented here.

The first variant, shown in FIG. 6, comprises four sets of three electrodes, each disposed in a plane. These four planes are all perpendicular to a common plane (not shown) and their intersections with this plane form two "Vs", one disposed slightly above the other. Each set of electrodes comprises three identical electrodes in the form of a rectangular ribbon, whose long axes are parallel to one another and to said common plane. The electrodes of one of the two sets of the internal "V" are facing those of the other set of this "V", and the same goes for the sets of electrodes of external "V". The planes of the electrodes of the internal "V" are mobile with respect to those of the planes of the external "V", but within each "V", the two sets of electrodes are fixed with respect to one another.

One of the sets of electrodes (the one on the left, as seen in the drawing) is denoted object a, the two sets of electrodes of the internal "V" object b, and the other set of electrodes of the external "V" object c. Of course, the boundary conditions on each of the electrodes are fixed by the respective potentials applied to these electrodes. The potentials respectively applied to the objects a, b and c are denoted $P_a$, $P_b$ and $P_c$.

In the variant shown in FIG. 7, the variable capacitor comprises two sets of electrodes each disposed in a plane and one set of dielectric bars, these three planes being parallel to one another. The set of dielectric bars of the internal plane is mobile with respect to the other two sets, which are fixed with respect to one another. The set of electrodes of one of the external planes (the lower plane, as seen in the drawing) is denoted object a, that of the central plane object b and that of the other external plane object c. All these elements are surrounded by the medium 1, and the dielectric contains the medium 2. As in the case of the variant in FIG. 6, the boundary conditions on the electrodes of the device in FIG. 7 are fixed by the electric potentials that are applied to them. The potentials applied to the objects a and c are also respectively denoted $P_a$ and $P_c$.

The various point sources on the various objects a, b and c are shown in FIG. 8.

The boundary conditions are written, for the first variant (FIG. 6):

$$\text{UBC on } a, Q_{a\_a}^{1-02} \cdot Aa_{1\_02} + Q_{a\_b}^{1-2} \cdot Ab_{1\_2} + Q_{a\_c}^{1-01} \cdot Ac_{1\_01} = P_a$$

$$\text{UBC on } b, Q_{b\_a}^{1-02} \cdot Aa_{1\_02} + Q_{b\_b}^{1-2} \cdot Ab_{1\_2} + Q_{b\_c}^{1-01} \cdot Ac_{1\_01} = P_b$$

$$\text{UBC on } c, Q_{c\_a}^{1-02} \cdot Aa_{1\_02} + Q_{c\_b}^{1-2} \cdot Ab_{1\_2} + Q_{c\_c}^{1-01} \cdot Ac_{1\_01} = P_c$$

which gives the coupling matrix:

$$\begin{bmatrix} P_a \\ P_b \\ P_c \end{bmatrix} = \begin{bmatrix} Q_{a\_a}^{1\_02} & Q_{a\_b}^{1\_2} & Q_{a\_c}^{1\_01} \\ Q_{b\_a}^{1\_02} & Q_{b\_b}^{1\_2} & Q_{b\_c}^{1\_01} \\ Q_{c\_a}^{1\_02} & Q_{c\_b}^{1\_2} & Q_{c\_c}^{1\_01} \end{bmatrix} \cdot \begin{bmatrix} Aa_{1\_02} \\ Ab_{1\_2} \\ Ab_{1\_01} \end{bmatrix}$$

whereas for the second variant (FIG. 7), les correspondence indicators are written:

$$\left. \begin{pmatrix} a(02, 1) \\ b(1, 2) \\ c((01, 1)) \end{pmatrix} \right\} \begin{matrix} M_{c\_a}^{1\_02}, Q_{c\_a}^{1\_02}, \\ M_{a\_c}^{1\_01}, Q_{a\_c}^{1\_01} \end{matrix}$$

The boundary conditions are:

$$\text{UBC on } a, Q_{a\_a}^{1-02} \cdot Aa_{1\_02} + Q_{a\_b}^{1-2} \cdot Ab_{1\_2} + Q_{a\_c}^{1-01} \cdot Ac_{1\_01} = P_a$$

$$\text{UBC on } b, M_{b\_b}^{2-1} \cdot Ab_{2\_1} = M_{b\_b}^{1-2} \cdot Ab_{1\_2} + M_{b\_a}^{1-02} \cdot Aa_{1\_02} + M_{b\_b}^{1-01} \cdot Ac_{1\_01}$$

$$Q_{b\_b}^{2-1} \cdot Ab_{2\_1} = Q_{b\_b}^{1-2} \cdot Ab_{1\_2} + Q_{b\_a}^{1-02} \cdot Aa_{1\_02} + Q_{b\_c}^{1-01} \cdot Ac_{1\_01}$$

$$\text{UBC on } c, Q_{c\_a}^{1-02} \cdot Aa_{1\_02} + Q_{c\_b}^{1-2} \cdot Ab_{1\_2} + Q_{c\_c}^{1-01} \cdot Ac_{1\_01} = P_c$$

It will be noted that for these BCs, 01 and 02 represent the interior of the electrodes and are external to the workspace.

For this second variant, the coupling matrix is:

$$\begin{bmatrix} P_a \\ 0 \\ 0 \\ P_c \end{bmatrix} = \begin{bmatrix} Q_{a\_a}^{1\_02} & Q_{a\_b}^{1\_2} & 0 & Q_{a\_c}^{1\_01} \\ M_{b\_a}^{1\_02} & M_{b\_b}^{1\_2} & -M_{b\_b}^{2\_1} & M_{b\_c}^{1\_01} \\ Q_{b\_a}^{1\_02} & Q_{b\_b}^{1\_2} & -Q_{b\_b}^{2\_1} & Q_{b\_c}^{1\_01} \\ Q_{c\_a}^{1\_02} & Q_{c\_b}^{1\_2} & 0 & Q_{c\_c}^{1\_01} \end{bmatrix} \cdot \begin{bmatrix} Aa_{1\_02} \\ Ab_{1\_2} \\ Ab_{2\_1} \\ Ac_{1\_01} \end{bmatrix}$$

It will be noted that, in the first case, the matrix Qac, and in this last case, the matrices Mac (Qac) and Mca (Qca), are partially masked because the object b acts as a partial screen between the objects a and c.

According to the invention, for a system comprising several objects, the global matrix for this system can be established, and all the components of the source vector $\vec{J}$ can thus be found. The physical quantities representative of the interactions within the system can be calculated at every point of observation of the system. It will be noted that, for this application to electromagnetism, the number of unknown parameters of the sources per mesh element is equal to the number of equations available (here, six).

For example, in the case of FIG. 2, the system described could be a conducting object composed of the stratified media 1, 2 and 5, placed in front of a exciting field created by the object d, the objects b or c being able to represent a fissure or an inclusion.

Note on gauges: since Maxwell's equations are integro-differential equations, the fields $\vec{B}$ and $\vec{E}$ are determined from $\vec{A}$ to within a constant known as gauge. Since the divergence of a curl is always zero, this leads to $\vec{B} = \text{rot} \, \vec{A}$. And as the curl of a gradient of a function $\Theta$ is always zero, a gradient term may be added to $\vec{A}$. The field $\vec{E}$ then becomes:

$$\vec{E} = -\frac{\partial \vec{A}}{\partial t} - \overrightarrow{\text{grad}} \Theta$$

It is shown that the divergence of $\vec{A}$ can be chosen arbitrarily. A condition known as gauge then allows $\vec{A}$ to be completely determined. Gauges known as Coulomb gauges, or alternatively Lorentz gauges, are widely used. Other conditions on the potential coexist.

In the case of the DPSM method, if the user wishes to verify a particular gauge condition, then the addition of an additional point source allows the system to be completely characterized, and any uncertainty in the potential to be removed.

The basic principles of the method for modeling non-homogeneous media according to the invention are described hereinbelow with reference to FIGS. 9 to 19.

Figure 9:
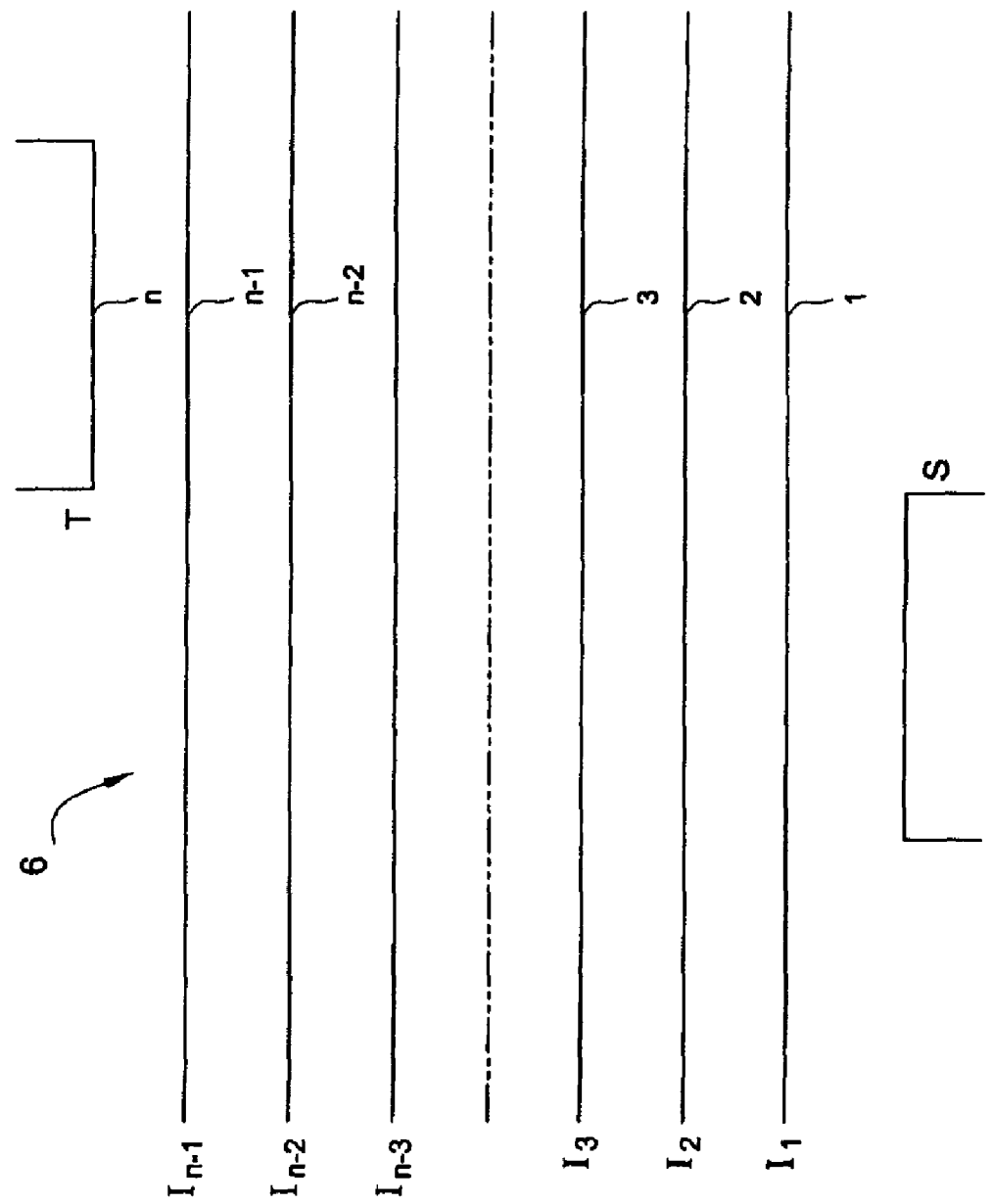
FIGS. 9 to 19 are very simplified schematic diagrams of non-homogeneous media on which the method of the invention is implemented.

A system comprising two transducers T and S disposed on either side of a non-homogeneous assembly, in other words comprising several objects and different media, is shown in FIG. 9. It will firstly be assumed that these media are plane layers with different properties and/or materials (different between adjacent layers, each layer being assumed to be homogeneous in its composition and its properties), the system 6 then being classed as a multilayer system. As stated hereinabove, these transducers are, in the present case, ultrasound probes. It is assumed that this system 6 is composed of n plane layers of different media, referenced $C_1$ to $C_n$ and separated by (n−1) interfaces referenced $I_1$ to $I_{n-1}$. In order to simplify the explanations, transducers are shown whose active faces (opposite the system 6) are plane and parallel to the interfaces, but it will be clearly understood that the invention may also be implemented when these active faces are not parallel to the interfaces. A source layer, referred to as primary source, models a transducer, and an interface is modeled by two layers of sources, referred to as secondary sources.

Figure 10:
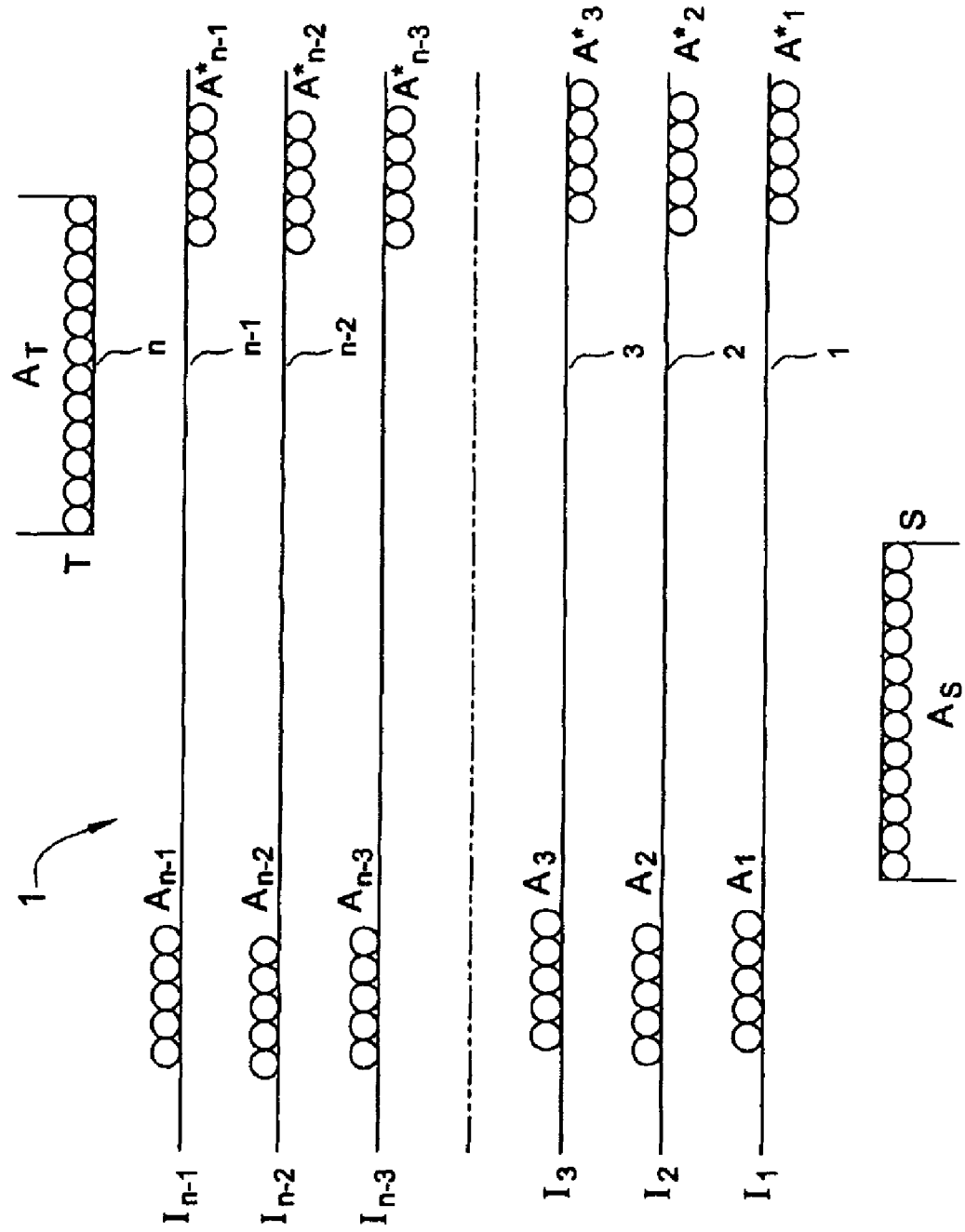

Starting from the configuration in FIG. 9, and implementing the extension of the DPSM to multilayer systems according to the present invention, two layers of primary sources $A_S$ and $A_T$, which model the two transducers S and T, are shown in FIG. 10 together with 2(n−1) layers of secondary sources relating to the (n−1) interfaces. These sources have been represented in the form of small circles tangent to the corresponding interfaces. On either side of each interface, a layer of secondary sources is distributed over the entire face of this interface. Thus, for example for the first interface $I_1$, sources $A^*_1$ are distributed over the face of the interface facing the transducer S and sources $A_1$ over the other face, and so on up to the interface of rank n, comprising sources $A^*_{n-1}$ on its face opposite the interface of rank (n−1) and sources $A_{n-1}$ on its face opposite the transducer T. For clarity of the drawing, only a part of these primary and secondary sources have been shown. $A_S$ and $A_T$ denote the vectors containing the values of the point sources which will be henceforth referred to as source vectors. On each face of each interface of rank 1 to n are shown an assembly of secondary source vectors $A_m$ (for the upper face of each interface, as seen in the drawing) and $A^*_m$ (for the lower face of each interface).

The total ultrasonic field in each plane medium of the system 6 is obtained by superimposition of the vectors generated by the two assembly of sources situated just above and just below the medium in question. Thus, this total vector is calculated for the various media in the following manner:

Medium $C_1$: Summation of the fields generated by $A_S$ and $A_1$

Medium $C_2$: Summation of the fields generated by $A^*_1$ and $A^*_2$

Medium $C_3$: Summation of the fields generated by $A^*_2$ and $A_3$

...

Medium $C_{(n-1)}$: Summation of the fields generated by $A^*_{n-2}$ and $A_{n-1}$ Medium $C_n$: Summation of the fields generated by $A^*_{n-1}$ and $A_T$ The limiting boundary conditions and at the interfaces that must be satisfied in order to determine the values of the source vector will now be examined. On the active faces of the transducers S and T, the user imposes at each point velocity values respectively grouped into the velocity vectors called $V_{SO}$ and $V_{TO}$, respectively (and which are UBCs). When crossing the (n−1) interfaces, the pressure P and the component of velocity V in the direction locally perpendicular to the planes of the interfaces, and which will henceforth simply be referred to as velocity V, must be continuous for reasons stemming from ultrasound physics (IBCs). The same would be true for the continuity conditions for quantities in other fields of physics, for which the quantities P and V would represent other parameters which might not be a pressure and a velocity.

The terms V and P are linked to the elementary source vector A via the relationships V=M.A and P=Q.A, in which M and Q are coupling matrices for the objects interacting within the same medium. The matrix Q characterizes a scalar quantity (an acoustic pressure in the case of ultrasonic waves, an electric scalar potential in electrostatics, or else a magnetic scalar potential in magnetostatics), whereas the matrix M characterizes a vector quantity (propagation velocity of the ultrasonic waves in the present example, electric field in electrostatics, or magnetic field in magnetostatics). The boundary and continuity conditions lead to the following equations:

$$M_{SS}A_S + M_{S1}A_1 = V_{S0} \quad (1)$$

$$M_{TT}A_T + M^*_{T(n-1)}A^*_{n-1} = V_{T0}$$

$$M_{1S}A_S + M_{11}A_1 = M_{12}A_2 + M^*_{11}A^*_1$$

$$Q_{1S}A_S + Q_{11}A_1 = Q_{12}A_2 + Q^*_{11}A^*_1$$

$$M^*_{21}A^*_1 + M_{22}A_2 = M^*_{22}A^*_2 + M_{23}A_3$$

$$Q^*_{21}A^*_1 Q_{22}A_2 = Q^*_{22}A^*_2 + Q_{23}A_3$$

$$\vdots$$

$$M^*_{(n-2)(n-3)}A^*_{(n-3)} + M_{(n-2)(n-2)}A_{(n-2)} = M^*_{(n-2)(n-2)}A^*_{(n-2)} + M_{(n-2)(n-1)}A_{n-1}$$

$$Q^*_{(n-2)(n-3)}A^*_{(n-3)} + Q_{(n-2)(n-2)}A_{(n-2)} = Q^*_{(n-2)(n-2)}A^*_{(n-2)} + Q_{(n-2)(n-1)}A_{(n-1)}$$

$$M^*_{(n-1)(n-2)}A^*_{(n-2)} + M_{(n-1)(n-1)}A_{(n-1)} = M^*_{(n-1)(n-1)}A^*_{(n-1)} + M_{(n-1)T}A_T$$

$$Q^*_{(n-1)(n-2)}A^*_{(n-2)} + Q_{(n-1)(n-1)}A_{(n-1)} = Q^*_{(n-1)(n-1)}A^*_{(n-1)} + Q_{(n-1)T}A_T$$

These equations may be represented in matrix form by writing values in the indices (n–j) in the form nj,j=1, 2, 3 . . . , as follows:

$$\begin{bmatrix} M_{SS} & M_{S1} & 0 & 0 & 0 & 0 & 0 & 0 & \ldots & 0 & 0 & 0 & 0 & 0 & 0 \\ M_{1S} & M_{11} & -M_{11}^* & -M_{12} & 0 & 0 & 0 & 0 & \ldots & 0 & 0 & 0 & 0 & 0 & 0 \\ Q_{1S} & Q_{11} & -Q_{11}^* & -Q_{12} & 0 & 0 & 0 & 0 & \ldots & 0 & 0 & 0 & 0 & 0 & 0 \\ 0 & 0 & M_{21}^* & M_{22} & -M_{22}^* & -M_{23} & 0 & 0 & \ldots & 0 & 0 & 0 & 0 & 0 & 0 \\ 0 & 0 & Q_{21}^* & Q_{22} & -Q_{22}^* & -Q_{23} & 0 & 0 & \ldots & 0 & 0 & 0 & 0 & 0 & 0 \\ 0 & 0 & 0 & 0 & M_{32}^* & M_{33} & -M_{33}^* & -M_{34} & \ldots & 0 & 0 & 0 & 0 & 0 & 0 \\ 0 & 0 & 0 & 0 & Q_{32}^* & Q_{33} & -Q_{33}^* & -Q_{34} & \ldots & \ldots & \ldots & \ldots & \ldots & \ldots & \ldots \\ \ldots & \ldots & \ldots & \ldots & \ldots & \ldots & \ldots & \ldots & \ldots & \ldots & \ldots & \ldots & \ldots & \ldots & \ldots \\ \ldots & \ldots & \ldots & \ldots & \ldots & \ldots & \ldots & \ldots & \ldots & \ldots & \ldots & \ldots & \ldots & \ldots & \ldots \\ \ldots & \ldots & \ldots & \ldots & \ldots & \ldots & \ldots & \ldots & \ldots & \ldots & \ldots & \ldots & \ldots & \ldots & \ldots \\ 0 & 0 & 0 & 0 & 0 & 0 & 0 & 0 & \ldots & M_{n2n3}^* & M_{n2n2} & -M_{n2n2}^* & M_{n2n1} & 0 & 0 \\ 0 & 0 & 0 & 0 & 0 & 0 & 0 & 0 & \ldots & Q_{n2n3}^* & Q_{n2n2} & -Q_{n2n2}^* & Q_{n2n1} & 0 & 0 \\ 0 & 0 & 0 & 0 & 0 & 0 & 0 & 0 & \ldots & 0 & 0 & M_{n1n2}^* & M_{n1n1} & -M_{n1n1}^* & M_{n1T} \\ 0 & 0 & 0 & 0 & 0 & 0 & 0 & 0 & \ldots & 0 & 0 & Q_{n1n2}^* & Q_{n1n1} & -Q_{n1n1}^* & Q_{n1T} \\ 0 & 0 & 0 & 0 & 0 & 0 & 0 & 0 & \ldots & 0 & 0 & 0 & 0 & M_{Tn1}^* & M_{TT} \end{bmatrix} \times \quad (2)$$

$$\begin{Bmatrix} A_S \\ A_1 \\ A_1^* \\ A_2 \\ A_2^* \\ A_3 \\ A_3^* \\ \ldots \\ \ldots \\ \ldots \\ A_{n2} \\ A_{n2}^* \\ A_{n1} \\ A_{n1}^* \\ A_T^* \end{Bmatrix} = \begin{Bmatrix} V_{S0} \\ 0 \\ 0 \\ 0 \\ 0 \\ 0 \\ 0 \\ \ldots \\ \ldots \\ \ldots \\ 0 \\ 0 \\ 0 \\ 0 \\ V_{T0} \end{Bmatrix}$$

This matrix may be written in the symbolic form:

$$[M]\{A\} = \{V_0\} \Rightarrow \{A\} = [M]^{-1}\{V_0\} \quad (3)$$

Thus, the vector $\{A\}$, which groups all of the primary and secondary sources and which is called global source vector, can be obtained.

Figure 11:
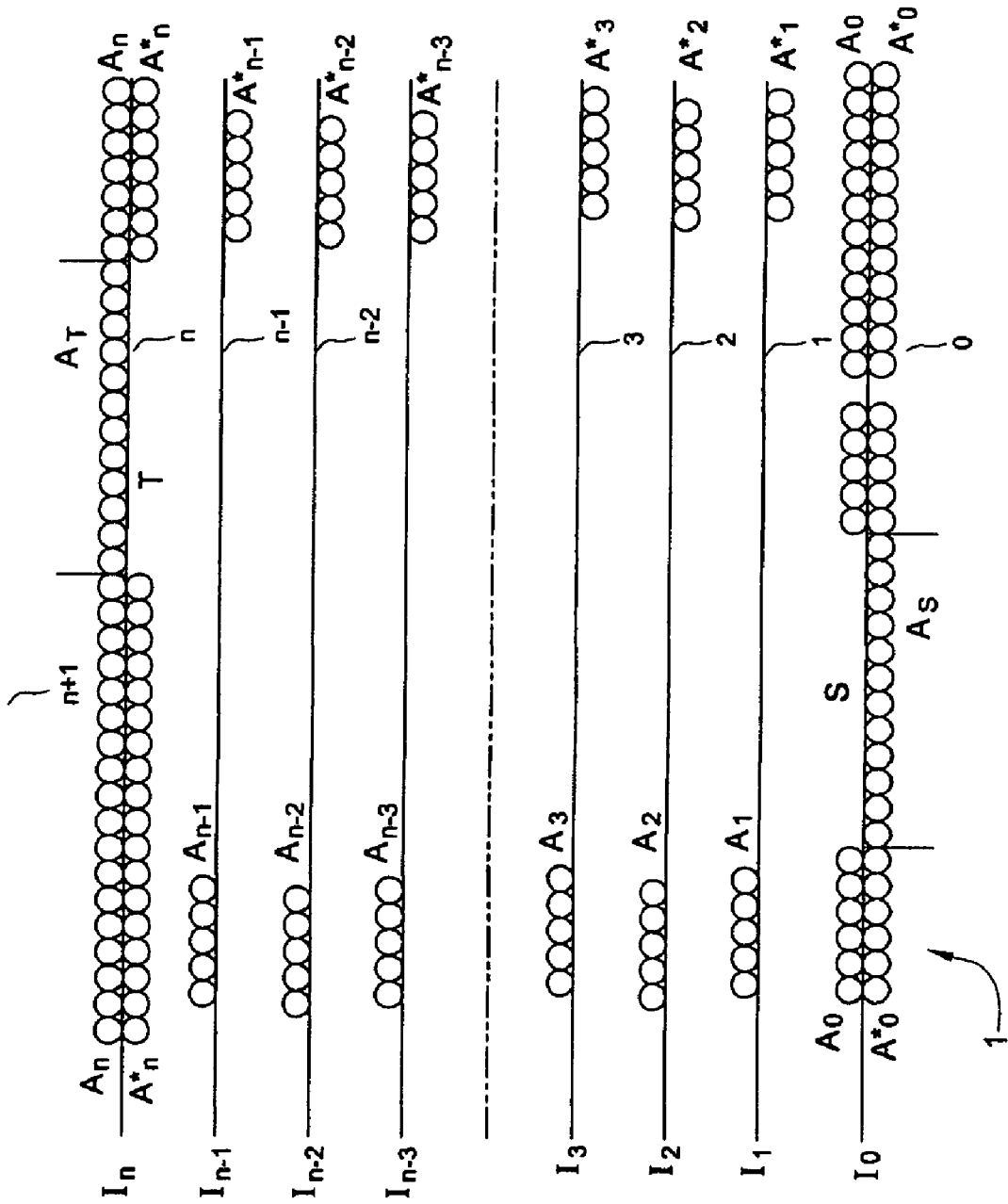

The case where the active faces of the transducers are applied onto the end interfaces of the object facing them will now be examined. (n+1) interfaces $(I_0, I_1, \ldots I_n)$ separating (n+2) layers of different media is considered, these layers having ranks numbered (0, 1, 2, . . . , n+1). The active faces of the transducers S and T are respectively applied onto the lower $(I_0)$ and upper $(I_n)$ interfaces of the object 1, as shown in FIG. 11. These two interfaces respectively bound a lower half-space and an upper half-space. The medium of rank 0 is in contact with the interface $I_0$, while the medium of rank n+1 is in contact with the interface $I_n$. As explained hereinabove regarding the method of the invention, the layers of sources are distributed on either side of the n+1 interfaces $I_0, I_1, \ldots I_n$. These two layers of source vectors are denoted $A_m$ (for the sources above the interfaces) and $A^*_m$ (for the sources situated below the interfaces), with $0<m<n$. However, the first $(I_0)$ and last $(I_n)$ interfaces are adjacent to three different layers of sources. Indeed, the two assemblies of additional sources $A_S$ and $A_T$ are due to the fact that the active faces of the transducers are assumed to be applied against these first and last interfaces. Although the interface $I_0$ coincides with the active face of the transducer S, for the presentation of the method of the invention, $I_0$ and S will be considered here as two different interfaces. $I_0$ represents the passive region (with no source of energy) and S the active region (one source of energy is present there). In the same way, $I_n$ and T will be considered as two different interfaces. Thus, in the case presented here, there are n+1 passive interfaces $I_0, I_1, \ldots I_n$ on either side of which one assembly of sources is disposed, and only two active surfaces S and T which respectively correspond to the two assemblies of additional sources $A_S$ and $A_T$.

The ultrasonic fields in all the media, except for the two end media, are obtained by assuming the fields are produced by two assemblies of sources, as noted hereinbelow:

Medium 2: Summation of the fields produced by $A^*_1$ and $A_2$.

Medium 3: Summation of the fields produced by $A^*_2$ and $A_3$.

. . .

. . .

Medium n−1: Summation of the fields produced by $A^*_{n-2}$ and $A_{n-1}$.

However, within each half-space above the interface $I_n$ and below the interface $I_0$, the ultrasonic field is only produced by a single layer of sources:

Medium 0: the field is produced by the sources $A_0$.

Medium n+1: the field is produced by the sources $A^*_n$.

In the upper and lower media (media of ranks 1 and n) the field is produced by three source layers:

Medium 1: Summation of the fields produced by $A^*_0$, $A_1$ and $A_S$.

Medium n: Summation of the fields produced by $A^*_{n-1}$ and $A_n$ and $A_T$.

In order to determine the value of the sources starting from the limiting boundary conditions and at the interfaces, the conditions at the following interfaces must firstly be satisfied. When crossing the n−1 intermediate passive interfaces ($I_1$, $I_2$, ... $I_n$), the ultrasonic pressure P and the velocity V in the direction locally normal to the planes of the interfaces must be continuous.

If the active surfaces S and T are excluded, the interfaces $I_0$ and $I_n$ are only adjacent to passive regions. When crossing these passive interfaces, the pressure P and the velocity V must be continuous, just as when crossing the other n−1 passive interfaces.

On the faces S and T of the transducers, the velocity vectors V are respectively denoted $V_{S0}$ and $V_{T0}$. Given that, as stated hereinabove, V=M.A and P=Q.A, the continuity conditions and the boundary conditions (UBCs and IBCs) yield the following equations:

$$M_{0S}A_S + M^*_{00}A^*_0 + M_{01}A_1 = V_{S0} \quad \text{on } S \quad (4)$$

$$M_{0S}A_S + M^*_{00}A^*_0 + M_{01}A_1 = M_{00}A_0 \quad \text{on } I_0$$

$$Q_{0S}A_S + Q^*_{00}A^*_0 + Q_{01}A_1 = Q_{00}A_0 \quad \text{on } I_0$$

$$M_{1S}A_S + M^*_{10}A^*_0 + M_{11}A_1 = M^*_{11}A^*_1 + M_{12}A_2 \quad \text{on } I_1$$

$$Q_{1S}A_S + Q^*_{10}A^*_0 + Q_{11}A_1 = Q^*_{11}A^*_1 + Q_{12}A_2 \quad \text{on } I_1$$

$$M^*_{21}A^*_1 + M_{22}A_2 = M^*_{22}A^*_2 + M_{23}A_3 \quad \text{on } I_2$$

$$Q^*_{21}A^*_1 + Q_{22}A_2 = Q^*_{22}A^*_2 + Q_{23}A_3 \quad \text{on } I_2$$

$$\vdots$$

$$M^*_{(n-1)(n-2)}A^*_{(n-2)} + M_{(n-1)(n-1)}A_{(n-1)} = M^*_{(n-1)(n-1)}A^*_{(n-1)} + M_{(n-1)n}A_n + M_{(n-1)T}A_T \quad \text{on } I_{n-1}$$

$$Q^*_{(n-1)(n-2)}A^*_{(n-2)} + Q_{(n-1)(n-1)}A_{(n-1)} = Q^*_{(n-1)(n-1)}A^*_{(n-1)} + Q_{(n-1)n}A_n + Q_{(n-1)T}A_T \quad \text{on } I_{n-1}$$

$$M^*_{n(n-1)}A^*_{(n-1)} + M_{nn}A_n + M_{nT}A_T = M^*_{nn}A^*_n \quad \text{on } I_n$$

$$Q^*_{n(n-1)}A^*_{(n-1)} + Q_{nn}A_n + Q_{nT}A_T = Q^*_{nn}A^*_n \quad \text{on } I_n$$

$$M^*_{n(n-1)}A^*_{(n-1)} + M_{nn}A_n + M_{nT}A_T = V_{T0} \quad \text{on } T$$

These equations may be rearranged in the following way:

$$M^*_{00}A^*_0 + M_{0S}A_S + M_{01}A_1 = M_{00}A_0 \quad \text{on } I_0 \quad (5)$$

$$Q^*_{00}A^*_0 + Q_{0S}A_S + Q_{01}A_1 = Q_{00}A_0 \quad \text{on } I_0$$

$$M^*_{00}A^*_0 + M_{0S}A_S + M_{01}A_1 = V_{S0} \quad \text{on } S$$

$$M^*_{10}A^*_0 + M_{1S}A_S + M_{11}A_1 = M^*_{11}A^*_1 + M_{12}A_2 \quad \text{on } I_1$$

$$Q^*_{10}A^*_0 + Q_{1S}A_S + Q_{11}A_1 = Q^*_{11}A^*_{11} + Q_{12}A_2 \quad \text{on } I_1$$

$$M^*_{21}A^*_1 + M_{22}A_2 = M^*_{22}A^*_2 + M_{23}A_3 \quad \text{on } I_2$$

$$Q^*_{21}A^*_1 + Q_{22}A_2 = Q^*_{22}A^*_2 + Q_{23}A_3 \quad \text{on } I_2$$

$$\vdots$$

$$M^*_{(n-1)(n-2)}A^*_{(n-2)} + M_{(n-1)(n-1)}A_{(n-1)} = M^*_{(n-1)(n-1)}A^*_{(n-1)} + M_{(n-1)n}A_n + M_{(n-1)T}A_T \quad \text{on } I_{n-1}$$

$$Q^*_{(n-1)(n-2)}A^*_{(n-2)} + Q_{(n-1)(n-1)}A_{(n-1)} = Q^*_{(n-1)(n-1)}A^*_{(n-1)} + Q_{(n-1)n}A_n + Q_{(n-1)T}A_T \quad \text{on } I_{n-1}$$

$$M^*_{n(n-1)}A^*_{(n-1)} + M_{nn}A_n + M_{nT}A_T = V_{T0} \quad \text{on } T$$

$$M^*_{n(n-1)}A^*_{(n-1)} + M_{nn}A_n + M_{nT}A_T = M^*_{nn}A^*_n \quad \text{on } I_n$$

$$Q^*_{n(n-1)}A^*_{(n-1)} + Q_{nn}A_n + Q_{nT}A_T = Q^*_{nn}A^*_n \quad \text{on } I_n$$

In matrix representation, by posing (n–j) in the form nj, j=1, 2, 3 . . . , these equations become:

$$\begin{bmatrix} -M_{00} & M_{00}^* & M_{0S} & M_{01} & 0 & 0 & 0 & 0 & \ldots & 0 & 0 & 0 & 0 & 0 & 0 \\ -Q_{00} & Q_{00}^* & Q_{0S} & M_{01} & 0 & 0 & 0 & 0 & \ldots & 0 & 0 & 0 & 0 & 0 & 0 \\ 0 & M_{00}^* & M_{0S} & M_{01} & 0 & 0 & 0 & 0 & \ldots & 0 & 0 & 0 & 0 & 0 & 0 \\ 0 & M_{10}^* & M_{1S} & M_{11} & -M_{11}^* & -M_{12} & 0 & 0 & \ldots & 0 & 0 & 0 & 0 & 0 & 0 \\ 0 & Q_{10}^* & Q_{1S} & Q_{11} & -Q_{11}^* & -Q_{12} & -M_{22}^* & -M_{23} & \ldots & 0 & 0 & 0 & 0 & 0 & 0 \\ 0 & 0 & 0 & 0 & M_{21}^* & M_{22} & -Q_{22}^* & -Q_{23} & \ldots & 0 & 0 & 0 & 0 & 0 & 0 \\ 0 & 0 & 0 & 0 & Q_{21}^* & Q_{22} & 0 & 0 & \ldots & 0 & 0 & 0 & 0 & 0 & 0 \\ \ldots & \ldots & \ldots & \ldots & \ldots & \ldots & \ldots & \ldots & \ldots & \ldots & \ldots & \ldots & \ldots & \ldots & \ldots \\ \ldots & \ldots & \ldots & \ldots & \ldots & \ldots & \ldots & \ldots & \ldots & \ldots & \ldots & \ldots & \ldots & \ldots \\ \ldots & \ldots & \ldots & \ldots & \ldots & \ldots & \ldots & \ldots & \ldots & \ldots & \ldots & \ldots & \ldots & \ldots \\ 0 & 0 & 0 & 0 & 0 & 0 & 0 & 0 & \ldots & M_{n1n2}^* & M_{n1n1} & -M_{n1n1}^* & M_{n1T} & -M_{n1n} & 0 \\ 0 & 0 & 0 & 0 & 0 & 0 & 0 & 0 & \ldots & Q_{n1n2}^* & Q_{n1n1} & -Q_{n1n1}^* & Q_{n1T} & -Q_{n1n} & 0 \\ 0 & 0 & 0 & 0 & 0 & 0 & 0 & 0 & \ldots & 0 & 0 & M_{nn1}^* & M_{nT} & M_{nn} & 0 \\ 0 & 0 & 0 & 0 & 0 & 0 & 0 & 0 & \ldots & 0 & 0 & M_{nn1}^* & M_{nT} & M_{nn} & -M_{nn}^* \\ 0 & 0 & 0 & 0 & 0 & 0 & 0 & 0 & \ldots & 0 & 0 & Q_{nn1}^* & Q_{nT} & Q_{nn} & -Q_{nn}^* \end{bmatrix} \times \quad (6)$$

$$\begin{Bmatrix} A_0 \\ A_0^* \\ A_S \\ A_1 \\ A_1^* \\ A_2 \\ A_2^* \\ A_3 \\ \ldots \\ \ldots \\ \ldots \\ A_{n1} \\ A_{n1}^* \\ A_T \\ A_n \\ A_n^* \end{Bmatrix} = \begin{Bmatrix} 0 \\ 0 \\ V_{S0} \\ 0 \\ 0 \\ 0 \\ 0 \\ \ldots \\ \ldots \\ \ldots \\ 0 \\ 0 \\ V_{T0} \\ 0 \\ 0 \end{Bmatrix}$$

The number of equations and the number of unknowns are counted in the following manner. It is assumed that, for each interface $I_1, I_2, \ldots I_{n-1}$ there are N sources above the interface and N sources below the interface, that at the lower $I_0$ and upper $I_{n+1}$ interfaces there are respectively M1 and M2 sources on the two active faces of the transducers S and T and that on the passive regions of these two interfaces there are respectively $2(N-M_1)$ and $2(N-M_2)$ sources. Thus, the total number of sources for the n+1 interfaces (including the active surfaces of the transducers) is equal to $2(n+1)N-M_1-M_2$. The total number of equations is also equal to $2(n+1)N-M_1-M_2$. Consequently, this system of equations has a unique solution.

The matrix equation (6) may be written in the symbolic form:

$$[M]\{A\} = \{V_0\} \Rightarrow \{A\} = [M]^{-1}\{V_0\} \quad (7)$$

It will be noted that the dimension of the matrix M is equal to:
$\{2(n+1)N-M_1-M_2, *2(n+1)N-M_1-M_2.\}$.

The number of unknown source vectors is also equal to $2(n+1)N-M_1-M_2$. Thus, the global source vector $\{A\}$ can be calculated.

Figure 12:
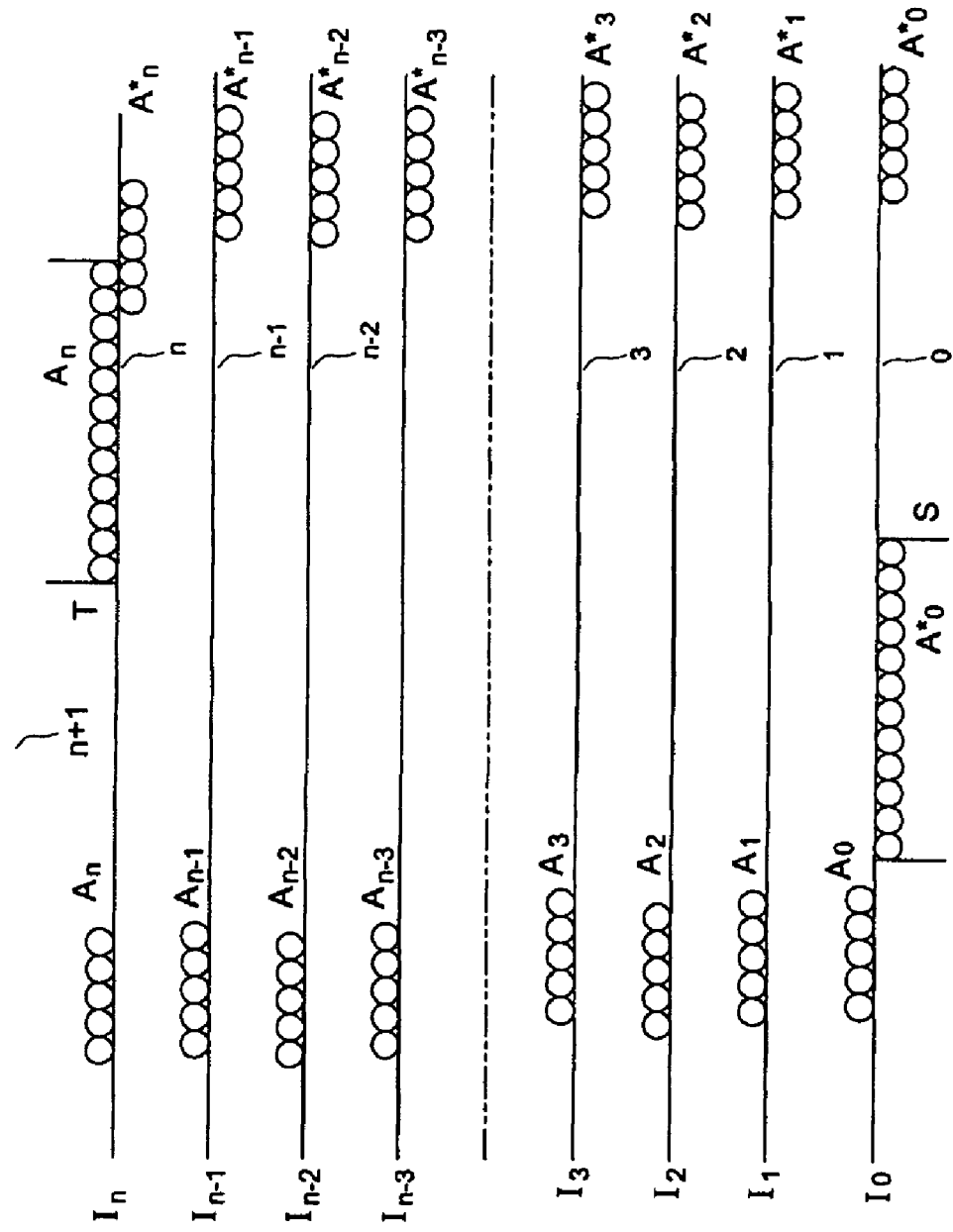

The case where the active faces of the transducers form part of the interfaces will now be examined. The modeling of the interactions is now carried out in a slightly different manner from that which has just been described. In contrast to the preceding case, the primary sources of the transducers are substituted for some of the interface secondary sources, as shown in FIG. 12. A layer of sources is disposed on either side of the n+1 interfaces $I_0, I_1, \ldots I_n$. The source vectors on one face of an interface $I_m$ are denoted $A_m$ above the interface and $A^*_m$ below the interface. In FIG. 12, the transducers S and T are shown in contact with the interfaces $I_0$ and $I_n$ of an object 1 comprising n different media. These two interfaces bound half-spaces located by the media 0 and n+1. The difference between FIGS. 11 and 12 resides in the distribution of the point sources in the neighborhood of the interfaces $I_0$ and $I_n$.

The total ultrasonic field total within each medium is obtained by superimposition of the fields produced by two assemblies of sources in the following manner:

Medium 1: Summation of the fields generated by $A^*_0$ and $A_1$.

Medium 2: Summation of the fields generated by $A^*_1$ and $A_2$.

Medium 3: Summation of the fields generated by $A^*_2$ and $A_3$.

.

Medium n: Summation of the fields generated by $A^*_{n-1}$ and $A_n$.

However, in each aforementioned half-space, the field is generated by a single layer of sources.

Medium 0: the field is generated by the sources $A_0$.
Medium n+1: the field is generated by the sources $A^*_n$.

In order to determine the values of the source vector starting from the boundary conditions, the following conditions on the interfaces must be satisfied. When crossing the n−1 passive interfaces ($I_1, I_2, \ldots I_{n-1}$) the pressure P and the velocity V in the direction locally normal to the interface in question must not exhibit any discontinuity. The interfaces $I_0$ and $I_n$ are adjacent to both active regions and passive regions. The active faces of the transducers S and T are disposed in the active regions. These regions are respectively denoted $I_0^S$ and $I_n^T$. The passive regions not comprising the active faces of the transducers are denotes $I_0$ and $I_n$ (with no exponent).

On the active faces $I_0^S$ and $I_n^T$ of the transducers, the velocity vectors are respectively denoted $V_{S0}$ and $V_{T0}$, and when crossing the passive interfaces $I_0$ and $I_n$ the pressure P and the velocity V in the direction locally normal to the interface in question must not exhibit any discontinuity, just like the other n−1 passive interfaces.

Given that V=M.A and P=Q.A, the limiting boundary conditions and at the interfaces lead to the following equations:

$$\begin{aligned}
M_{00}^* A_0^* + M_{01} A_1 &= V_{S0} & &\text{on } I_0^S \\
M_{00}^* A_0^* + M_{01} A_1 &= M_{00} A_0 & &\text{on } I_0 \\
Q_{00}^* A_0^* + Q_{01} A_1 &= Q_{00} A_0 & &\text{on } I_0 \\
M_{10}^* A_0^* + M_{11} A_1 &= M_{11}^* A_1^* + M_{12} A_2 & &\text{on } I_1 \\
Q_{10}^* A_0^* + A_{11} A_1 &= Q_{11}^* A_1^* + Q_{12} A_2 & &\text{on } I_1 \\
M_{21}^* A_1^* + M_{22} A_2 &= M_{22}^* A_2^* + M_{23} A_3 & &\text{on } I_2 \\
Q_{21}^* A_1^* + M_{22} A_2 &= Q_{22}^* A_2^* + Q_{23} A_3 & &\text{on } I_2 \\
&\vdots \\
M_{(n-1)(n-2)}^* A_{(n-2)}^* + M_{(n-1)(n-1)} A_{(n-1)} &= M_{(n-1)(n-1)}^* A_{(n-1)}^* + M_{(n-1)n} A_n & &\text{on } I_{n-1} \\
Q_{(n-1)(n-2)}^* A_{(n-2)}^* + Q_{(n-1)(n-1)} A_{(n-1)} &= Q_{(n-1)(n-1)}^* A_{(n-1)}^* + Q_{(n-1)n} A_n & &\text{on } I_{n-1} \\
M_{n(n-1)}^* A_{(n-1)}^* + M_{nn} A_n &= M_{nn}^* A_n^* & &\text{on } I_n \\
Q_{n(n-1)}^* A_{(n-1)}^* + Q_{nn} A_n &= Q_{nn}^* A_n^* & &\text{on } I_n \\
M_{n(n-1)}^* A_{n-1}^* + M_{nn} A_n &= V_{T0} & &\text{on } I_n^T
\end{aligned} \quad (8)$$

These equations may be written in matrix form, by posing (n−j) in the form nj, j=1, 2, 3 . . .

$$\begin{bmatrix}
\{-M_{00}\} & M_{00}^* & M_{01} & 0 & 0 & 0 & 0 & 0 & \ldots & 0 & 0 & 0 & 0 & 0 & 0 \\
\{-Q_{00}\} & \{Q_{00}^*\} & \{Q_{01}\} & 0 & 0 & 0 & 0 & 0 & \ldots & 0 & 0 & 0 & 0 & 0 & 0 \\
0 & M_{10}^* & M_{11} & -M_{11}^* & -M_{12} & 0 & 0 & 0 & \ldots & 0 & 0 & 0 & 0 & 0 & 0 \\
0 & Q_{10}^* & Q_{11} & -Q_{11}^* & -Q_{12} & 0 & 0 & 0 & \ldots & 0 & 0 & 0 & 0 & 0 & 0 \\
0 & 0 & 0 & M_{21}^* & M_{22} & -M_{22}^* & -M_{23} & 0 & \ldots & 0 & 0 & 0 & 0 & 0 & 0 \\
0 & 0 & 0 & Q_{21}^* & Q_{22} & -Q_{22}^* & -Q_{23} & 0 & \ldots & 0 & 0 & 0 & 0 & 0 & 0 \\
\ldots & \ldots & \ldots & \ldots & \ldots & \ldots & \ldots & \ldots \ldots \ldots & & \ldots & \ldots & \ldots & \ldots & \ldots & \ldots \\
\ldots & \ldots & \ldots & \ldots & \ldots & \ldots & \ldots & \ldots & & \ldots & \ldots & \ldots & \ldots & \ldots & \ldots \\
\ldots & \ldots & \ldots & \ldots & \ldots & \ldots & \ldots & \ldots & & \ldots & \ldots & \ldots & \ldots & \ldots & \ldots \\
\ldots & \ldots & \ldots & \ldots & \ldots & \ldots & \ldots & \ldots & & \ldots & \ldots & \ldots & \ldots & \ldots & \ldots \\
0 & 0 & 0 & 0 & 0 & 0 & 0 & 0 & \ldots & 0 & M_{n1n2}^* & M_{n1n1} & -M_{n1n1}^* & -M_{n1n} & 0 \\
0 & 0 & 0 & 0 & 0 & 0 & 0 & 0 & \ldots & 0 & Q_{n1n2}^* & Q_{n1n1} & -Q_{n1n1}^* & -Q_{n1n} & 0 \\
0 & 0 & 0 & 0 & 0 & 0 & 0 & 0 & \ldots & 0 & 0 & 0 & M_{nn1}^* & M_{nn} & \{-M_{nn}^*\} \\
0 & 0 & 0 & 0 & 0 & 0 & 0 & 0 & \ldots & 0 & 0 & 0 & \{Q_{nn1}^*\} & \{Q_{nn}\} & \{-Q_{nn}^*\}
\end{bmatrix} \times \begin{Bmatrix} A_0 \\ A_0^* \\ A_1 \\ A_1^* \\ A_2 \\ A_2^* \\ A_3 \\ \ldots \\ \ldots \\ \ldots \\ \ldots \\ A_{n1} \\ A_{n1}^* \\ A_n \\ A_n^* \end{Bmatrix} = \begin{Bmatrix} \langle V_{S0} \rangle \\ 0 \\ 0 \\ 0 \\ 0 \\ 0 \\ 0 \\ \ldots \\ \ldots \\ \ldots \\ 0 \\ 0 \\ 0 \\ \langle V_{T0} \rangle \\ 0 \end{Bmatrix} \quad (9)$$

The terms appearing between braces ({ }) are replaced by zeros for interfaces of ranks 0 and n, whereas the terms between pointed brackets (⟨ ⟩) are replaced by zeros for active regions ($I_0^S$ and $I_n^T$) and interfaces of ranks 0 and n.

The matrix (9) hereinabove may be written in the symbolic form:

$$[M]\{A\} = \{V_0\} \Rightarrow \{A\} = [M]^{-1}\{V_0\} \tag{10}$$

Thus, the global source vector $\{A\}$ may be obtained.

Figure 13:
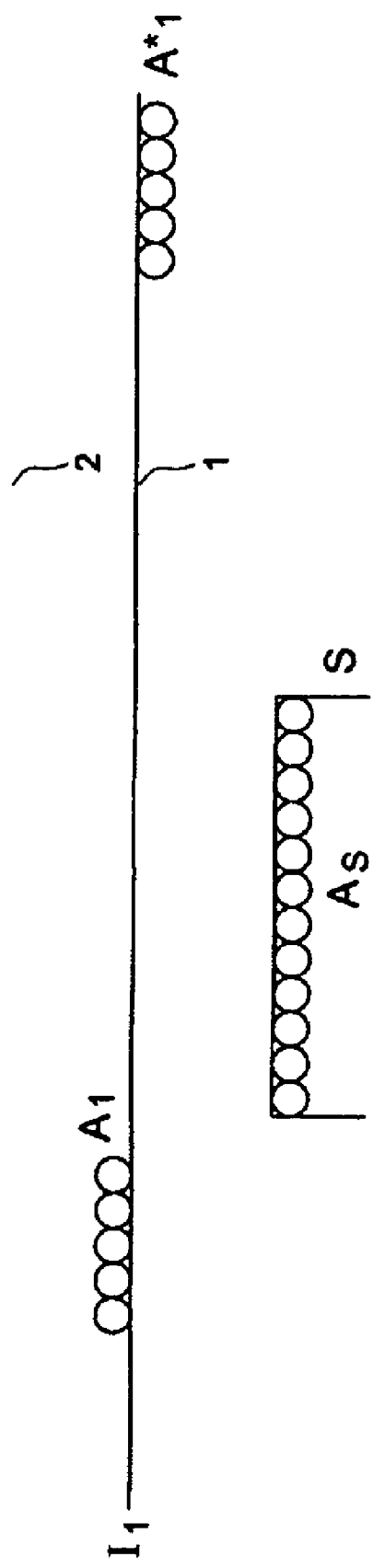

The particular case of a single interface and a single transducer will be examined, with reference to FIG. 13. This case may be considered as a particular case of the case illustrated in FIG. 10, if the transducer $A_T$ and all the interfaces, except $I_1$, are removed from the latter. This case allows the coefficient of reflection R to be calculated in terms of values of M and Q, and hence to have an idea of the physical significance of the matrices M and Q. In this case, the equation (2) reduces to:

$$M_{SS}A_S + M_{S1}A_1 = V_{S0}$$

$$M_{1S}A_S + M_{11}A_1 = M^*_{11}A^*_1$$

$$Q_{1S}A_S + Q_{11}A_1 = Q^*_{11}A^*_1 \tag{11}$$

The second and third equations of (11) give:

$$A^*_1 = [M^*_{11}]^{-1}\{M_{1S}A_S + M_{11}A_1\}$$

$$A^*_1 = [Q^*_{11}]^{-1}\{Q_{1S}A_S + Q_{11}A_1\} \tag{12}$$

By subtracting the two equations of (12), the following is obtained:

$$0 = [M^*_{11}]^{-1}\{M_{1S}A_S + M_{11}A_1\} - [Q^*_{11}]^{-1}\{Q_{1S}A_S + Q_{11}A_1\} \tag{13}$$

$$\Rightarrow \{[M^*_{11}]^{-1}M_{1S} - [Q^*_{11}]^{-1}Q_{1S}\}A_S + \{[M^*_{11}]^{-1}M_{11} - [Q^*_{11}]^{-1}Q_{11}\}A_1 = 0$$

$$\Rightarrow \alpha A_S + \beta A_1 = 0$$

$$\Rightarrow A_1 = -\beta^{-1}\alpha A_S$$

with:

$$\alpha = \{[M^*_{11}]^{-1}M_{1S} - [Q^*_{11}]^{-1}Q_{1S}\}$$

$$\beta = \{[M^*_{11}]^{-1}M_{11} - [Q^*_{11}]^{-1}Q_{11}\} \tag{14}$$

Given that, according to (11):

$$M_{SS}A_S + M_{S1}A_1 = V_{S0}$$

the following may be written:

$$M_{SS}A_S - M_{S1}\beta^{-1}\alpha A_S = V_{S0} \tag{15}$$

$$\Rightarrow [M_{SS} - M_{S1}\beta^{-1}\alpha]A_S = V_{S0}$$

The velocity vector at the interface in the medium 2 may be expressed in the form of a matrix of transmission coefficients T such that:

$$TM_{1S}A_S$$

and in the medium 1 in the form of a matrix of reflection coefficients R such that:

$$M_{1S}A_S + RM_{1S}A_S$$

which yields:

$$TM_{1S}A_S = M^*_{11}A^*_1 \tag{16}$$

and $$M_{1S}A_S + RM_{1S}A_S = M_{1S}A_S + M_{11}A_1$$

$$\Rightarrow RM_{1S}A_S = M_{11}A_1$$

The following is then obtained:

$$A^*_1 = [M^*_{11}]^{-1}TM_{1S}A_S$$

and $$A_1 = [M_{11}]^{-1}RM_{1S}A_S \tag{17}$$

It will be noted that the pressure continuity condition is not necessarily separately satisfied when the problem is formulated in terms of reflection and transmission coefficient matrices because the continuity of the velocity also guarantees the continuity of the pressure when said matrices are considered.

Starting from equations (13) and (17), the following may be written:

$$A_1 = [M_{11}]^{-1}RM_{1S}A_S = -\beta^{-1}\alpha A_S \tag{18}$$

$$\Rightarrow [M^*_{11}]^{-1}RM_{1S} = -\beta^{-1}\alpha =$$

$$-\{[M^*_{11}]^{-1}M_{11} - [Q^*_{11}]^{-1}Q_{11}\}^{-1}\{[M^*_{11}]^{-1}M_{1S} - [Q^*_{11}]^{-1}Q_{1S}\}$$

$$\Rightarrow R = -\beta^{-1}\alpha = -M_{11}\{[M^*_{11}]^{-1}M_{11} - [Q^*_{11}]^{-1}Q_{11}\}^{-1}$$

$$\{[M^*_{11}]^{-1}M_{1S} - [Q^*_{11}]^{-1}Q_{1S}\}[M_{1S}]^{-1}$$

Starting from the teachings of the DPSM, the value of the N point sources is calculated that are distributed at the surface of a transducer for example in the following manner. Here, it is assumed that the transducer is in contact with a fluid, but it will be clearly understood that the description could easily be transposed into the case where this transducer would be in contact with a solid body. Let $A_m$ be the value of the m-th point source. The pressure $p_m$ at a distance $r_m$ from this point source is given by:

$$p_m(r) = A_m \frac{\exp(ik_f r_m)}{r_m} \tag{18-A}$$

in which expression $i^2 = -1$, $k_f = \omega/c_f$, $\omega$ being the pulse frequency of the ultrasonic wave and $c_f$ the velocity of propagation of this wave. The ultrasonic pressure $p(x)$ at a point x, situated at a distance $r_m$ from the m-th point source is given by:

$$p(x) = \sum_{m=1}^{N} p_m(r_m) = \sum_{m=1}^{N} A_m \frac{\exp(ik_f r_m)}{r_m} \tag{18-B}$$

Given that, starting from the existing relationship between the ultrasonic pressure and the propagation velocity of the wave, the velocity of this wave may be calculated at the point x:

$$-\frac{\partial p}{\partial n} = \rho \frac{\partial v_n}{\partial t} = \pm i\omega\rho v_n \qquad (18\text{-C})$$

and for a velocity expressed as a function of time in the form $e^{-i\omega t}$, its derivative is obtained by simply multiplying $v_n$ by a positive or negative term. In the case where this term is negative, this gives:

$$v_n = \frac{1}{i\omega\rho} \frac{\partial p}{\partial n} \qquad (18\text{-D})$$

Thus, the value of the radial velocity $v_n$ of the ultrasonic wave is obtained at a distance r from the m-th point source:

$$v_m(r) = \frac{A_m}{i\omega\rho} \frac{\partial}{\partial r}\left(\frac{\exp(ik_f r)}{r}\right) \qquad (18\text{-E})$$
$$= \frac{A_m}{i\omega\rho}\left(\frac{ik_f \exp(ik_f r)}{r} - \frac{\exp(ik_f r)}{r^2}\right)$$
$$= \frac{A_m}{i\omega\rho} \frac{\exp(ik_f r)}{r}\left(ik_f - \frac{1}{r}\right)$$

The component of the velocity in a direction $x_3$ is:

$$v_{3m}(r) = \frac{A_m}{i\omega\rho} \frac{\partial}{\partial x_3}\left(\frac{\exp(ik_f r)}{r}\right) \qquad (18\text{-F})$$
$$= \frac{A_m}{i\omega\rho} \frac{x_3 \exp(ik_f r)}{r^2}\left(ik_f - \frac{1}{r}\right)$$

When the contributions of the N point sources are added, the total value of the velocity in a direction $x_3$ is:

$$v_3(x) = \sum_{m=1}^{N} v_{3m}(r_m) \qquad (18\text{-G})$$
$$= \sum_{m=1}^{N} \frac{A_m}{i\omega\rho} \frac{x_{3m}\exp(ik_f r_m)}{r_m^2}\left(ik_f - \frac{1}{r_m}\right)$$

If $v_0$ is the velocity of the waves on the active face of the transducer in a direction $x_3$, for all the values of x on this active face, the velocity in the direction $x_3$ is equal to $v_0$, and then:

$$v_3(x) = \sum_{m=1}^{N} \frac{A_m}{i\omega\rho} \frac{x_{3m}\exp(ik_f r_m)}{r_m^2}\left(ik_f - \frac{1}{r_m}\right) = v_0 \qquad (18\text{-H})$$

By taking N points on the active face of the transducer, a system of N linear equations with N unknowns ($A_1$, $A_2$, $A_3$, ... $A_N$) can be obtained. However, a problem is posed when the point source coincides with the point of interest x, owing to the fact that $r_m$ becomes zero and $v_{3m}$, in the equation (18-H), is unlimited. Of course, when a point source and a point of interest x are situated on the active face of a transducer, only these two points can coincide and $r_m$ can be zero. In order to remove this difficulty, the point sources are placed slightly behind the active face of the transducer. In such a case, the smallest value of $r_m$ is denoted $r_s$.

When the point x is situated on the active face of the transducer, its velocity component x3 is correlated with the velocity $v_0$ of the wave on this active face. If it is then desired to cancel the two other velocity components v1 and v2, three equations must be simultaneously satisfied, namely the equation (18-H) hereinabove and the two equations (18-I) hereinbelow:

$$v_1(x) = \sum_{m=1}^{N} \frac{A_m}{i\omega\rho} \frac{x_{1m}\exp(ik_f r_m)}{r_m^2}\left(ik_f - \frac{1}{r_m}\right) = 0 \qquad (18\text{-I})$$
$$v_2(x) = \sum_{m=1}^{N} \frac{A_m}{i\omega\rho} \frac{x_{2m}\exp(ik_f r_m)}{r_m^2}\left(ik_f - \frac{1}{r_m}\right) = 0$$

Thus, 3.N equations are obtained for the N test points of the surfaces of the spheres such as is shown in said French DPSM patent. However, more equations than unknowns are obtained. In order to solve this problem, this French patent recommends that the number of unknowns be increased so as to obtain 3.N of them, by replacing each point source by a triplet of point sources. These three sources have different values and are disposed in the same plane parallel to the active face of the transducer, at a distance x3=−rs from this face. The three point sources are disposed at the corners of a randomly-oriented equilateral triangle in order to preserve the isotropic properties of the material through which the waves propagate and to avoid any preferential orientation of the emission. Thus, by solving a system of 3N linear equations (in the case of triplets) or of N linear equations (for a single point source), the values of $A_m$ associated with all the point sources are obtained. Once the values of $A_m$ have been obtained, the pressure p(x) is calculated at every point using the equation (18-B), whether this be on the active face of the transducer or beyond. It will be noted that in the case of a non-viscous perfect fluid only the component of velocity normal ($v_3$) to the fluid-solid interface (on the active face of the transducer) has to be continuous. The velocity components parallel to this active face are not necessarily continuous since slippages can occur between the active face and the fluid. However, such slippages cannot occur in the case of viscous fluids, and the three components of the velocity must be continuous at said interface.

The calculation of the parameters of the sources using matrix calculus will be presented hereinbelow, with reference to the propagation of ultrasonic waves in a fluid, but it will be clearly understood that this calculation may be readily transposed into other fields of application, such as those mentioned in the present description. This calculation is presented for triplet sources when the three Cartesian components of velocity on the active face of the transducer correspond to those in the fluid, at the interface with the transducer, as is the case with viscous fluids. In the opposite case, single point sources will be used in place of triplets, by eliminating the velocity components v1 and v2 in the calculations. The dimension of the matrices and the dimensions of the vectors will then be reduce from 3N to N.

Combining the equations (18-H) and (18-I) leads to:

$$V_S = M_{SS} A_S \qquad (18\text{-J})$$

In this equation, $V_s$ is the vector of dimension (3N×1) of the velocity components at N points x, and $A_s$ is the vector of dimension (3N×1) comprising the physical quantities relating to the 3N point sources. $M_{ss}$ is the matrix of dimensions (3N×3N) linking the two vectors $V_s$ and $A_s$. From the equations (18-H) and (18-I), the following is also obtained:

$$\{V_S\}^T = [v_1^1 \ v_2^1 \ v_3^1 \ v_1^2 \ v_2^2 \ v_3^2 \ldots v_1^N \ v_2^N \ v_3^N] \quad (18\text{-K})$$

It will be noted that the transpose of the column vector $V_s$ is a row vector of dimension (1×3N). The elements of this vector are denoted $v_j^n$, where the index j can take the values 1, 2 or 3 and indicates the direction of the Cartesian component of the propagation velocity of the waves. The exponent n can take any value between 1 and N and it corresponds to the point on the active face of the transducer for which the component of velocity is defined.

For the majority of the ultrasonic transducers, $v_j^n$ is zero for j=1 or 2 (in other words for the components of velocity parallel to the interface) and $v_j^n = v_0$ for j=3 (normal component of the velocity). In this case, the equation (18-K) becomes:

$$\{V_S\}^T = [0 \ 0 \ v_0 \ 0 \ 0 \ v_0 \ldots 0 \ 0 \ v_0] \quad (18\text{-L})$$

and the vector $A_s$ is given by:

$$\{A_S\}^T = [A_1 \ A_2 \ A_3 \ A_4 \ A_5 \ A_6 \ A_{3N-2} \ A_{3N-1} \ A_{3N}] \quad (18\text{-M})$$

The square matrix $M_{SS}$ is obtained starting from the equations (18-H) and (18-I):

$$M_{SS} = \begin{bmatrix} f(x_{11}^1, r_1^1) & f(x_{12}^1, r_2^1) & f(x_{13}^1, r_3^1) & f(x_{14}^1, r_4^1) & \ldots & \ldots & f(x_{1(3N-1)}^1, r_{3N-1}^1) & f(x_{1(3N)}^1, r_{3N}^1) \\ f(x_{21}^1, r_1^1) & f(x_{22}^1, r_2^1) & f(x_{23}^1, r_3^1) & f(x_{24}^1, r_4^1) & \ldots & \ldots & f(x_{2(3N-1)}^1, r_{3N-1}^1) & f(x_{2(3N)}^1, r_{3N}^1) \\ f(x_{31}^1, r_1^1) & f(x_{32}^1, r_2^1) & f(x_{33}^1, r_3^1) & f(x_{34}^1, r_4^1) & \ldots & \ldots & f(x_{3(3N-1)}^1, r_{3N-1}^1) & f(x_{3(3N)}^1, r_{3N}^1) \\ f(x_{11}^2, r_1^2) & f(x_{12}^2, r_2^2) & f(x_{13}^2, r_3^2) & f(x_{14}^2, r_4^2) & \ldots & \ldots & f(x_{1(3N-1)}^2, r_{3N-1}^2) & f(x_{1(3N)}^2, r_{3N}^2) \\ f(x_{21}^2, r_1^2) & f(x_{22}^2, r_2^2) & f(x_{23}^2, r_3^2) & f(x_{24}^2, r_4^2) & \ldots & \ldots & f(x_{2(3N-1)}^2, r_{3N-1}^2) & f(x_{2(3N)}^2, r_{3N}^2) \\ f(x_{31}^2, r_1^2) & f(x_{32}^2, r_2^2) & f(x_{33}^2, r_3^2) & f(x_{34}^2, r_4^2) & \ldots & \ldots & f(x_{3(3N-1)}^2, r_{3N-1}^2) & f(x_{3(3N)}^2, r_{3N}^2) \\ \ldots & \ldots & \ldots & \ldots & \ldots & \ldots & \ldots & \ldots \\ f(x_{31}^N, r_1^N) & f(x_{32}^N, r_2^N) & f(x_{33}^N, r_3^N) & f(x_{34}^N, r_4^N) & \ldots & \ldots & f(x_{3(3N-1)}^N, r_{3N-1}^N) & f(x_{3(3N)}^N, r_{3N}^N) \end{bmatrix}_{3N \times 3N} \quad (18\text{-N})$$

with:

$$f(x_{jm}^n, r_m^n) = \frac{x_{jm}^n \exp(ik_f r_m^n)}{i\omega\rho(r_m^n)^2}\left(ik_f - \frac{1}{r_m^n}\right) \quad (18\text{-O})$$

In the equation (18-O), the first index j of x can take the values 1, 2 or 3 and indicates to which direction ($x_1$, $x_2$ or $x_3$) X relates. The index m of x and of r can take the values from 1 to 3N, depending on the point source being considered, whereas the index n can take any value between 1 and N depending on the point being considered of the active face of the transducer for which the velocity component is being calculated.

point source to this point is denoted $r_m^n$ and its three components in the directions $x_1$, $x_2$, and $x_3$ take the values $x_{jm}^n$, j=1, 2, 3 in the equations (18-N) and (18-O).

Using the equation (18-J), the quantities relating to the point sources are obtained by inverting the matrix $M_{SS}$:

$$A_S = [M_{SS}]^{-1} V_S = N_{SS} V_S \quad (18\text{-P})$$

Once the source vector $A_S$ has thus been calculated, the pressure p(x) is obtained from the equation (18-B) or else the velocity vector V(x) at every point (on the active face of the transducer or beyond) from the equations (18-H) and (18-I). In the following, any point of the fluid (or, more generally, any point of a medium in which an interaction between a wave and the material of this medium occurs) for which the velocity and pressure vectors are calculated is referred to as "point of observation". The components of pressure and velocity are obtained from the following relationships:

$$P_T = Q_{TS} A_S$$

$$V_T = M_{TS} A_S \quad (18Q)$$

In this expression, $P_T$ is a vector of dimension (M×1) and comprises the values of pressure at M points of observation, and $V_T$ is a vector of dimension (3M×1) comprising the three components at any point of observation. The expression for $V_T$ is similar to that for $V_S$ taken from the expression (18-K). The only difference resides in the fact that its dimension is (3M×1) rather than (3N×1). The matrix $M_{TS}$ is the same as that of $M_{SS}$ in the equation (18-N) if the points of observation are identical to the points on the active face of the transducer for which the velocity components are chosen so as to obtain the source vector $A_S$ in the equation (18-P). However, in order to calculate the velocity vector at various points, the expression giving $M_{TS}$ is slightly different from that of $M_{SS}$ taken from the equation (18-N). Consequently, its dimension is (3M×3N) as indicated in the equation (18-R) hereinbelow:

$$M_{TS} = \begin{bmatrix} f(x_{11}^1, r_1^1) & f(x_{12}^1, r_2^1) & f(x_{13}^1, r_3^1) & f(x_{14}^1, r_4^1) & \ldots & \ldots & f(x_{1(3N-1)}^1, r_{3N-1}^1) & f(x_{1(3N)}^1, r_{3N}^1) \\ f(x_{21}^1, r_1^1) & f(x_{22}^1, r_2^1) & f(x_{23}^1, r_3^1) & f(x_{24}^1, r_4^1) & \ldots & \ldots & f(x_{2(3N-1)}^1, r_{3N-1}^1) & f(x_{2(3N)}^1, r_{3N}^1) \\ f(x_{31}^1, r_1^1) & f(x_{32}^1, r_2^1) & f(x_{33}^1, r_3^1) & f(x_{34}^1, r_4^1) & \ldots & \ldots & f(x_{3(3N-1)}^1, r_{3N-1}^1) & f(x_{3(3N)}^1, r_{3N}^1) \\ f(x_{11}^2, r_1^2) & f(x_{12}^2, r_2^2) & f(x_{13}^2, r_3^2) & f(x_{14}^2, r_4^2) & \ldots & \ldots & f(x_{1(3N-1)}^2, r_{3N-1}^2) & f(x_{1(3N)}^2, r_{3N}^2) \\ f(x_{21}^2, r_1^2) & f(x_{22}^2, r_2^2) & f(x_{23}^2, r_3^2) & f(x_{24}^2, r_4^2) & \ldots & \ldots & f(x_{2(3N-1)}^2, r_{3N-1}^2) & f(x_{2(3N)}^2, r_{3N}^2) \\ f(x_{31}^2, r_1^2) & f(x_{32}^2, r_2^2) & f(x_{33}^2, r_3^2) & f(x_{34}^2, r_4^2) & \ldots & \ldots & f(x_{3(3N-1)}^2, r_{3N-1}^2) & f(x_{3(3N)}^2, r_{3N}^2) \\ \ldots & \ldots & \ldots & \ldots & \ldots & \ldots & \ldots & \ldots \\ f(x_{31}^M, r_1^M) & f(x_{32}^M, r_2^M) & f(x_{33}^M, r_3^M) & f(x_{34}^M, r_4^M) & \ldots & \ldots & f(x_{3(3N-1)}^M, r_{3N-1}^M) & f(x_{3(3N)}^M, r_{3N}^M) \end{bmatrix}_{3M \times 3N} \quad (18\text{-R})$$

Let $x_n$ be one of the points x (situated at the rear of the active face of the transducer). The vector connecting the m-th In this expression, the term $f(x_{jm}^n, r_m^n)$ is identical to that appearing in the equation (18-O). The definitions of the indices j and m are the same as those in the equation (18-O). The exponents n of the variables x and r can take any value between 1 and M, depending on the point in question. It should be noted that $M_{TS}$ is not a square matrix when M is different from N.

The matrix $Q_{TS}$ is obtained from the equation (18-B) when there are 3N point sources and M points being considered:

$$Q_{TS} = \begin{bmatrix} \frac{\exp(ik_f r_1^1)}{r_1^1} & \frac{\exp(ik_f r_2^1)}{r_2^1} & \frac{\exp(ik_f r_3^1)}{r_3^1} & \cdots & \cdots & \frac{\exp(ik_f r_{3N}^1)}{r_{3N}^1} \\ \frac{\exp(ik_f r_1^2)}{r_1^2} & \frac{\exp(ik_f r_2^2)}{r_2^2} & \frac{\exp(ik_f r_3^2)}{r_3^2} & \cdots & \cdots & \frac{\exp(ik_f r_{3N}^2)}{r_{3N}^2} \\ \frac{\exp(ik_f r_1^3)}{r_1^3} & \frac{\exp(ik_f r_2^3)}{r_2^3} & \frac{\exp(ik_f r_3^3)}{r_3^3} & \cdots & \cdots & \frac{\exp(ik_f r_{3N}^3)}{r_{3N}^3} \\ \cdots & \cdots & \cdots & \cdots & \cdots & \\ \cdots & \cdots & \cdots & \cdots & \cdots & \\ \frac{\exp(ik_f r_1^M)}{r_1^M} & \frac{\exp(ik_f r_2^M)}{r_2^M} & \frac{\exp(ik_f r_3^M)}{r_3^M} & \cdots & \cdots & \frac{\exp(ik_f r_{3N}^M)}{r_{3N}^M} \end{bmatrix}_{M \times 3N} \quad (18\text{-S})$$

In this equation, the definition of $r_m^n$ is the same as in the equations (18-R) and (18-Q), and it is the distance between the m-th point source and the n-th point in question.

Returning to the equation (18), starting from the equations (18-O) and (18-S), the elements of the matrix Q of this equation (matrix establishing the relationship between the acoustic pressure and the source vector) together with the elements of its matrix M (which establishes the relationship between the normal component of velocity and the source vector) are obtained, which gives:

$$Q = \frac{e^{ikr}}{r} \quad (19)$$

$$M = \frac{1}{i\omega\rho} \frac{x_3}{r^3}(ikr-1)e^{ikr}$$

$$avec: k = \frac{\omega}{c}, \lambda = \frac{c}{f} = \frac{2\pi c}{\omega}$$

Two matrices $\tilde{Q}$ and $\tilde{M}$ are now defined similar to the matrices $Q^*$ and $M^*$ in the equation (18), the only difference being that the matrices $Q^*$ and $M^*$ relate to the properties of the medium 2 since they give the pressure and the velocity in the medium 2 as source distribution values $A_1^*$, whereas the matrices $\tilde{Q}$ and $\tilde{M}$ use the properties of the medium 1. As a result, the matrices $\tilde{Q}$ and $\tilde{M}$ give the values of pressure and of velocity for equivalent sources distributed according to a position $A_1^*$ when the medium 2 is replaced by the medium 1. The equation 19 may then be written as follows:

$$\frac{\tilde{Q}}{e^{ik_1 r}} = \frac{Q^*}{e^{ik_2 r}} \Rightarrow Q^* = \tilde{Q}\frac{e^{ik_2 r}}{e^{ik_2 r}} = \tilde{Q}\frac{\alpha_2}{\alpha_1} \quad (20)$$

In the same way, the following is obtained:

$$\frac{\tilde{M}\rho_1}{(ik_1 r - 1)e^{ik_1 r}} = \quad (21)$$

-continued $$\frac{M^* \rho_2}{(ik_2 r - 1)e^{ik_2 r}} \Rightarrow M^* = \tilde{M}\frac{\rho_1(ik_2 r - 1)e^{ik_2 r}}{\rho_2(ik_1 r - 1)e^{ik_1 r}} = \tilde{M}\frac{\beta_2}{\beta_1}$$

It will be noted here that the matrices $\tilde{Q}_{11}$ et $\tilde{M}_{11}$ are similar to the matrices $Q_{11}$ and $M_{11}$ of the equation (18), the only difference being that the matrices $\tilde{Q}_1$ and $\tilde{M}_{11}$ give the values of pressure and of velocity for the points at the interfaces in the source distribution configuration $A_1^*$, whereas the matrices $Q_{11}$ and $M_{11}$ give the values of pressure and of velocity for the points at the interfaces in the source distribution configuration $A_1$. It should be noted that these two matrices use the material properties of the medium 1. Given that the distribution configuration $A_1$ is situated just above the interface, whereas the distribution configuration $A_1^*$ is situated just below the interface, the normal velocity vectors relating to the points situated on either side of the interface are of the same amplitude but opposite orientations. The pressures generated by these two layers of point sources are of the same amplitude. This then gives:

$$\tilde{Q}_{11} = Q_{11} = Q_{11}^* \frac{\alpha_1}{\alpha_2} \quad (22)$$

$$\tilde{M}_{11} = -M_{11} = M_{11}^* \frac{\beta_1}{\beta_2}$$

Substituting the equation (22) into the equation (18) leads to:

$$R = -M_{11}\{[-M_{11}^*]^{-1}M_{11} - [Q_{11}^*]^{-1}Q_{11}\}^{-1} \quad (23)$$

$$\{[M_{11}^*]^{-1}M_{1S} - [Q_{11}^*]^{-1}Q_{1S}\}[M_{1S}]^{-1}$$

$$= -M_{11}\left\{\left[-\tilde{M}_{11}\frac{\beta_2}{\beta_1}\right]^{-1}M_{11} - \left[\tilde{Q}_{11}\frac{\alpha_2}{\alpha_1}\right]^{-1}Q_{11}\right\}^{-1}$$

$$\left\{\left[\tilde{M}_{11}\frac{\beta_2}{\beta_1}\right]^{-1}M_{1S} - \left[\tilde{Q}_{11}\frac{\alpha_2}{\alpha_1}\right]^{-1}Q_{1S}\right\}[M_{1S}]^{-1}$$

$$= M_{11}\left\{\frac{\beta_1}{\beta_2}[\tilde{M}_{11}]^{-1}M_{11} + \frac{\alpha_1}{\alpha_2}[\tilde{Q}_{11}]^{-1}Q_{11}\right\}^{-1}$$

$$\left\{\frac{\beta_1}{\beta_2}[\tilde{M}_{11}]^{-1}M_{1S} - \frac{\alpha_1}{\alpha_2}[\tilde{Q}_{11}]^{-1}Q_{1S}\right\}[M_{1S}]^{-1}$$

$$= -\tilde{M}_{11}\left\{\frac{\beta_1}{\beta_2} + \frac{\alpha_1}{\alpha_2}\right\}^{-1}$$

$$\left\{\frac{\beta_1}{\beta_2}[\tilde{M}_{11}]^{-1}M_{1S} - \frac{\alpha_1}{\alpha_2}[\tilde{Q}_{11}]^{-1}Q_{1S}\right\}[M_{1S}]^{-1}$$

If the source distribution configuration $\tilde{A}$ at the location $A_1^*$ of the interface is equivalent to that of the sources $A_S$ at the location in question, by making the expressions for velocity of the two assemblies of sources equal, then this gives:

$$\tilde{M}_{11}\tilde{A} = M_{1S}A_S \Rightarrow \tilde{A} \quad (24)$$

$$= [\tilde{M}_{11}]^{-1} M_{1S} A_S$$

In the same way, for the pressures this leads to:

$$\tilde{Q}_{11}\tilde{A} = Q_{1S}A_S \Rightarrow \tilde{A} \quad (25)$$

$$= [\tilde{Q}_{11}]^{-1} Q_{1S} A_S$$

It will be noted that $\tilde{A}$ and $A_1^*$ are different although they are situated at the same location. $\tilde{A}$ represents the equivalent distribution of point sources when the two media 1 and 2 are identical. In other words, if the medium 2 is replaced by the medium 1, there is no real interface for $\tilde{A}$. However, for $A_1^*$ there is a real interface between the media 1 and 2.

Comparing the equations (24) and (25) leads to:

$$\tilde{A} = [\tilde{M}_{11}]^{-1} M_{1S} A_S \quad (26)$$

$$= [\tilde{Q}_{11}]^{-1} Q_{1S} A_S \Rightarrow [\tilde{M}_{11}]^{-1} M_{1S} A_S [A_S]^{-1}$$

$$= [\tilde{Q}_{11}]^{-1} Q_{1S} A_S [A_S]^{-1} \Rightarrow [\tilde{M}_{11}]^{-1}$$

$$= M_{1S} = [\tilde{Q}_{11}]^{-1} Q_{1S}$$

Substituting the equation (26) in the equation (23) leads to:

$$R = -\tilde{M}_{11}\left\{\frac{\beta_1}{\beta_2} + \frac{\alpha_1}{\alpha_2}\right\}^{-1} \left\{\frac{\beta_1}{\beta_2}[\tilde{M}_{11}]^{-1} M_{1S} - \frac{\alpha_1}{\alpha_2}[\tilde{Q}_{11}]^{-1} Q_{1S}\right\}[M_{1S}]^{-1} \quad (27)$$

$$= -\tilde{M}_{11}\left\{\frac{\beta_1}{\beta_2} + \frac{\alpha_1}{\alpha_2}\right\}^{-1} \left\{\frac{\beta_1}{\beta_2}[\tilde{M}_{11}]^{-1} M_{1S} - \frac{\alpha_1}{\alpha_2}[\tilde{M}_{11}]^{-1} M_{1S}\right\}[M_{1S}]^{-1}$$

$$= -\tilde{M}_{11}\left\{\frac{\beta_1}{\beta_2} + \frac{\alpha_1}{\alpha_2}\right\}^{-1} \left\{\frac{\beta_1}{\beta_2} - \frac{\alpha_1}{\alpha_2}\right\}[\tilde{M}_{11}]^{-1} M_{1S}[M_{1S}]^{-1}$$

$$= -\left\{\frac{\beta_1}{\beta_2} + \frac{\alpha_1}{\alpha_2}\right\}^{-1} \left\{\frac{\beta_1}{\beta_2} - \frac{\alpha_1}{\alpha_2}\right\}\tilde{M}_{11}[\tilde{M}_{11}]^{-1} M_{1S}[M_{1S}]^{-1}$$

$$= -\left\{\frac{\beta_1}{\beta_2} + \frac{\alpha_1}{\alpha_2}\right\}^{-1} \left\{\frac{\beta_1}{\beta_2} - \frac{\alpha_1}{\alpha_2}\right\}$$

$$= \frac{\alpha_1\beta_2 - \alpha_2\beta_1}{\alpha_1\beta_2 + \alpha_2\beta_1}$$

Substituting the values of $\alpha_1$, $\alpha_2$, $\beta_1$ and $\beta_2$ in the equation (27) for those given in the equations (20) and (21) leads to:

$$R = \frac{\alpha_1\beta_2 - \alpha_2\beta_1}{\alpha_1\beta_2 + \alpha_2\beta_1} \quad (28)$$

$$= \frac{e^{ik_1 r}\rho_1(ik_2 r - 1)e^{ik_2 r} - e^{ik_2 r}\rho_2(ik_1 r - 1)e^{ik_1 r}}{e^{ik_1 r}\rho_1(ik_2 r - 1)e^{ik_2 r} + e^{ik_2 r}\rho_2(ik_1 r - 1)e^{ik_1 r}}$$

$$= \frac{\rho_1(ik_2 r - 1) - \rho_2(ik_1 r - 1)}{\rho_1(ik_2 r - 1) + \rho_2(ik_1 r - 1)}$$

If the waves are considered as high frequency waves ($k_m r \gg 1$), $$R = \frac{\rho_1(ik_2 r - 1) - \rho_2(ik_1 r - 1)}{\rho_1(ik_2 r - 1) + \rho_2(ik_1 r - 1)} \quad (29)$$

$$\approx \frac{\rho_1(ik_2 r) - \rho_2(ik_1 r)}{\rho_1(ik_2 r) + \rho_2(ik_1 r)}$$

$$= \frac{\rho_1 k_2 - \rho_2 k_1}{\rho_1 k_2 + \rho_2 k_1}$$

$$= \frac{\rho_1 \frac{\omega}{c_2} - \rho_2 \frac{\omega}{c_1}}{\rho_1 \frac{\omega}{c_2} + \rho_2 \frac{\omega}{c_1}}$$

$$= \frac{\rho_1 c_1 - \rho_2 c_2}{\rho_1 c_1 - \rho_2 c_2}$$

In contrast, for low frequencies ($k_m r \ll 1$), then:

$$R = \frac{\rho_1(ik_2 r - 1) - \rho_2(ik_1 r - 1)}{\rho_1(ik_2 r - 1) + \rho_2(ik_1 r - 1)} \quad (30)$$

$$\approx \frac{\rho_1(-1) - \rho_2(-1)}{\rho_1(-1) + \rho_2(-1)}$$

$$= \frac{\rho_1 - \rho_2}{\rho_1 + \rho_2}$$

It will be noted that the reflection coefficient at high frequencies is similar to the reflection coefficient for plane waves at normal incidence. On the other hand, it is slightly different at low frequencies. The reason for this is that the example presented here relates to spherical waves with a point source. The plane waves are modeled by superimposing a large number of point sources.

Features of the method of the invention will now be presented with reference to a multilayer system and to the interactions on the active face of the transducer. The geometrical problem considered here is identical to that relating to that in FIG. 10. The difference in the boundary conditions between the present case and that presented at the beginning of the description, for which the velocity of the waves at the boundaries S and T is specified and respectively denoted $V_{S0}$ and $V_{T0}$, is that, in the case presented here, it is not specified. In the absence of all the other interfaces and of the transducers, this velocity on the faces S and T would respectively be $V_{S0}$ and $V_{T0}$. As soon as other interfaces and a second transducer are introduced, the velocity of the waves on the face S is no longer $V_{S0}$ and that on the face T is no longer $V_{T0}$. The change in velocity on the face of the transducer due to the interaction transducer-interface will now be considered.

This problem is solved in two stages. Firstly, the values of the source vectors $A_S$ and $A_T$ of active transducers are obtained starting from the surface velocity conditions:

$$M_{SS}A_S = V_{S0} \Rightarrow A_S = [M_{SS}]^{-1} V_{S0} \quad (31)$$

and similarly, $$A_T = [M_{TT}]^{-1} V_{T0}$$

Figure 14:
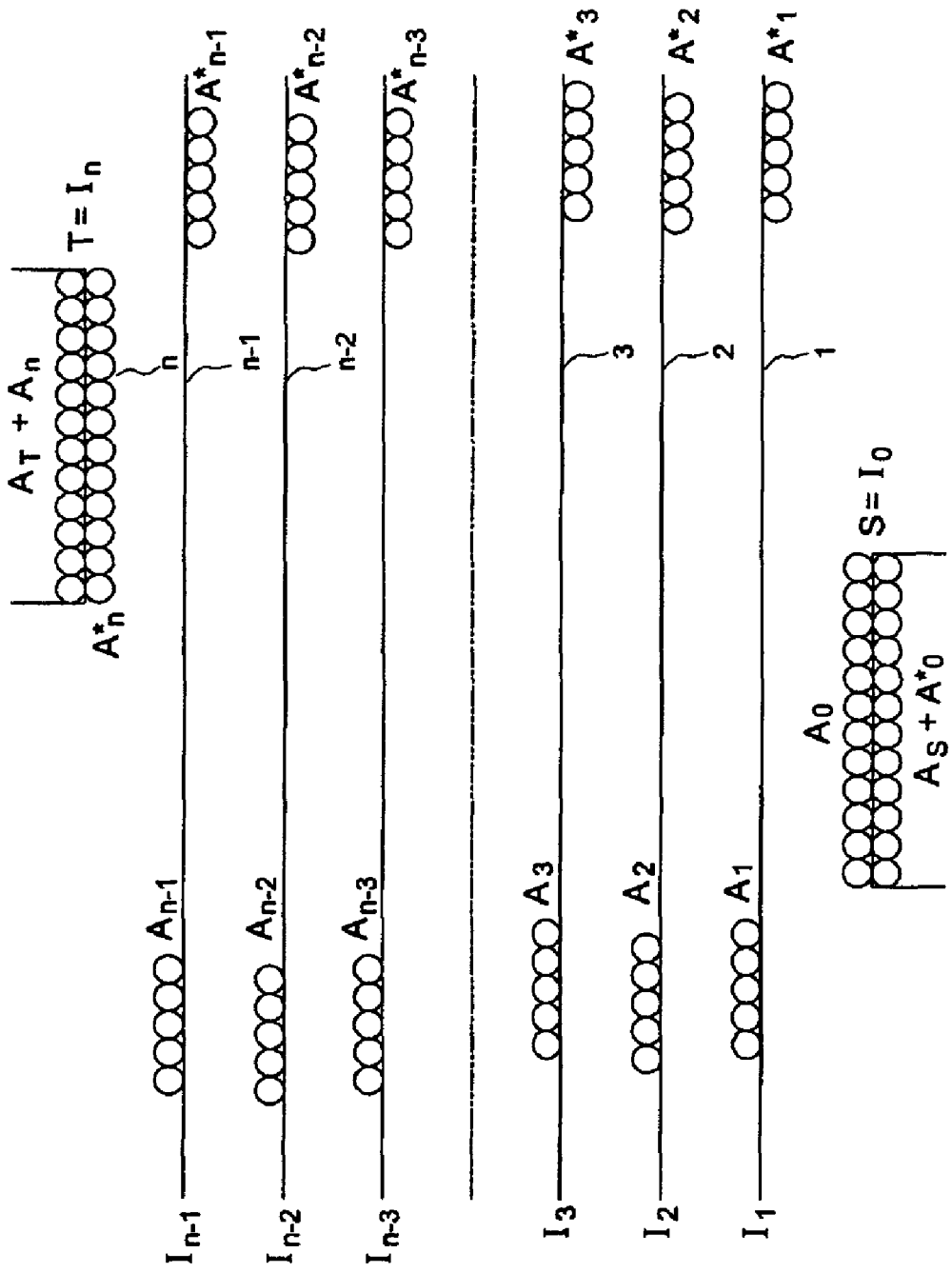

In a second stage, two layers of point sources are introduced at each interface, including S and T, as shown in FIG. 14. With the introduction of these new sources, the total value of the sources below the interface S is equal to $A_S + A^*_0$ and to $A_T + A_n$ above the interface T. In FIG. 14, the interface T is referenced $I_0$ and the interface T is referenced $I_n$. The other interfaces are referenced $I_1$ to $I_{n-1}$, respectively.

The ultrasonic fields in most of the layers are obtained by superimposition of the field generated by two layers of point sources as noted hereinbelow:

Medium 2: Summation of the fields generated by $A^*_1$ and $A_2$.

Medium 3: Summation of the fields generated by $A^*_2$ and $A_3$.

...

...

Medium n−1: Summation of the fields generated by $A^*_{n-2}$ and $A_{n-1}$.

In contrast, in the lower half-spaces (medium 1, above the face S) and upper half-spaces (medium n, below the face T), the total field is generated by three point sources:

Medium 1: Summation of the fields generated by $A^*_0$, $A_1$ and $A_S$.

Medium n: Summation of the fields generated by $A^*_{n-1}$, $A_n$ and $A_T$.

Within the medium formed by a transducer (under the face S and over the face T), the field is produced by a single layer of point sources:

Inside the transducer S: The field is generated by $A_0$ sources only.

Inside the transducer T: The field is generated by $A^*_n$ sources only.

The value of the sources is determined from the boundary conditions at the interfaces in the following manner.

The following boundary conditions at the interfaces (IBCs) must be satisfied. When crossing the n−1 central passive interfaces ($I_1, I_2, \ldots I_{n-1}$), the pressure (P) and the normal velocity (V), in other words the component of velocity in the direction locally normal to the interface in question, has to be continuous. Similarly, when crossing the interfaces $S(I_0)$ and $T(I_n)$ the pressure (P) and the component of velocity in the direction locally normal to the interface in question (V), must be continuous, as is the case for all the other n−1 interfaces.

The velocity being denoted V=M.A, and the pressure P=Q.A, the continuity conditions lead to the following equations:

$$M^*_{00} A^*_0 + M_{0S} A_S + M_{01} A_1 = M_{00} A_0 \quad \text{on } I_0 \quad (32)$$

$$Q^*_{00} A^*_0 + Q_{0S} A_S + Q_{01} A_1 = Q_{00} A_0 \quad \text{on } I_0$$

$$M^*_{10} A^*_0 + M_{1S} A_S + M_{11} A_1 = M^*_{11} A^*_1 + M_{12} A_2 \quad \text{on } I_1$$

$$Q^*_{10} A^*_0 + Q_{1S} A_S + Q_{11} A_1 = Q^*_{11} A^*_1 + Q_{12} A_2 \quad \text{on } I_1$$

$$M^*_{21} A^*_1 + M_{22} A_2 = M^*_{22} A^*_2 + M_{23} A_3 \quad \text{on } I_2$$

$$Q^*_{21} A^*_1 + Q_{22} A_2 = Q^*_{22} A^*_2 + Q_{23} A_3 \quad \text{on } I_2$$

$$\vdots$$

$$M^*_{(n-1)(n-2)} A^*_{(n-2)} + M_{(n-1)(n-1)} A_{(n-1)} = M^*_{(n-1)(n-1)} A^*_{(n-1)} + M_{(n-1)n} A_n + M_{(n-1)T} A_T \quad \text{on } I_{n-1}$$

$$Q^*_{(n-1)(n-2)} A^*_{(n-2)} + Q_{(n-1)(n-1)} A_{(n-1)} = Q^*_{(n-1)(n-1)} A^*_{(n-1)} + Q_{(n-1)n} A_n + Q_{(n-1)T} A_T \quad \text{on } I_{n-1}$$

$$M^*_{n(n-1)} A^*_{(n-1)} + M_{nn} A_n + M_{nT} A_T A_T = M^*_{nn} A^*_n \quad \text{on } I_n$$

$$Q^*_{n(n-1)} A^*_{(n-1)} + Q_{nn} A_n + Q_{nT} A_T = Q^*_{nn} A^*_n \quad \text{on } I_n$$

In matrix form, writing (n−j) in the form nj, j=1, 2, 3 ..., these equations can be written:

$$\begin{bmatrix} -M_{00} & M^*_{00} & M_{01} & 0 & 0 & 0 & 0 & 0 & \ldots & 0 & 0 & 0 & 0 & 0 & 0 \\ -Q_{00} & Q^*_{00} & Q_{01} & 0 & 0 & 0 & 0 & 0 & \ldots & 0 & 0 & 0 & 0 & 0 & 0 \\ 0 & M^*_{10} & M_{11} & -M^*_{11} & -M_{12} & 0 & 0 & 0 & \ldots & 0 & 0 & 0 & 0 & 0 & 0 \\ 0 & Q^*_{10} & Q_{11} & -Q^*_{11} & -Q_{12} & 0 & 0 & 0 & \ldots & 0 & 0 & 0 & 0 & 0 & 0 \\ 0 & 0 & 0 & M^*_{21} & M_{22} & -M^*_{22} & -M_{23} & 0 & \ldots & 0 & 0 & 0 & 0 & 0 & 0 \\ 0 & 0 & 0 & Q^*_{21} & Q_{22} & -Q^*_{22} & -Q_{23} & 0 & \ldots & 0 & 0 & 0 & 0 & 0 & 0 \\ \ldots & \ldots & \ldots & \ldots & \ldots & \ldots & \ldots & \ldots & \ldots & \ldots & \ldots & \ldots & \ldots & \ldots & \ldots \\ \ldots & \ldots & \ldots & \ldots & \ldots & \ldots & \ldots & \ldots & \ldots & \ldots & \ldots & \ldots & \ldots & \ldots & \ldots \\ \ldots & \ldots & \ldots & \ldots & \ldots & \ldots & \ldots & \ldots & \ldots & \ldots & \ldots & \ldots & \ldots & \ldots & \ldots \\ \ldots & \ldots & \ldots & \ldots & \ldots & \ldots & \ldots & \ldots & \ldots & \ldots & \ldots & \ldots & \ldots & \ldots & \ldots \\ 0 & 0 & 0 & 0 & 0 & 0 & 0 & 0 & \ldots & 0 & M^*_{n1n2} & M_{n1n1} & -M^*_{n1n1} & -M_{n1n} & 0 \\ 0 & 0 & 0 & 0 & 0 & 0 & 0 & 0 & \ldots & 0 & Q^*_{n1n2} & Q_{n1n1} & -Q^*_{n1n1} & -Q_{n1n} & 0 \\ 0 & 0 & 0 & 0 & 0 & 0 & 0 & 0 & \ldots & 0 & 0 & 0 & M^*_{nn1} & M_{nn} & -M^*_{nn} \\ 0 & 0 & 0 & 0 & 0 & 0 & 0 & 0 & \ldots & 0 & 0 & 0 & Q^*_{nn1} & Q_{nn} & -Q^*_{nn} \end{bmatrix} \times \quad (33)$$

$$\begin{Bmatrix} A_0 \\ A_0^* \\ A_1 \\ A_1^* \\ A_2 \\ A_2^* \\ A_3 \\ \vdots \\ \vdots \\ \vdots \\ \vdots \\ A_{n1} \\ A_{n1}^* \\ A_n \\ A_n^* \end{Bmatrix} = \begin{Bmatrix} -M_{0S}A_S \\ -Q_{0S}A_S \\ -M_{1S}A_S \\ -Q_{1S}A_S \\ 0 \\ 0 \\ 0 \\ \vdots \\ \vdots \\ \vdots \\ 0 \\ -M_{n1T}A_T \\ -Q_{n1T}A_T \\ -M_{nT}A_T \\ -Q_{nT}A_T \end{Bmatrix}$$

In order to count the number of equations and unknowns, it is assumed that at each of the interfaces $I_1, I_2, \ldots I_{n-1}$ there are N point sources above the interface in question and N point sources below this interface. On the lower ($I_0$) and upper ($I_{n+1}$) interfaces, there are respectively $2M_1$ and $2M_2$ point sources counting the two layers of sources above the surface S and below the surface T. Thus, the total number of unknown sources at the n+1 interfaces (including the surfaces S and T) is equal to $2[(n-1)N+M_1+M_2]$ and, in addition to these unknown sources, there are $M_1+M_2$ known sources $A_S$ and $A_T$ which are obtained using the equation (31). The total number of equations is also equal to $2[(n-1)N+M_1+M_2]$ because, at each common point on the interface in question, two conditions must be satisfied and the total number of common points considered for all the interfaces is equal to $[(n-1)N+M_1+M_2]$. Accordingly, this system of equations is solved in a unique manner.

The matrix equation (33) may be written in the symbolic form:

$$[M]\{A\} = \{V_0\} \Rightarrow \{A\} = [M]^{-1}\{V_0\} \tag{33A}$$

As stated hereinabove, the dimension of the matrix M is equal to $2[(n-1)N+M_1+M_2] \times 2[(n-1)N+M_1+M_2]$. Le number of unknown source vectors is also equal to $2[(n-1)N+M_1+M_2]$. The result of this is that global source vector is obtained in a unique manner.

Figure 15:
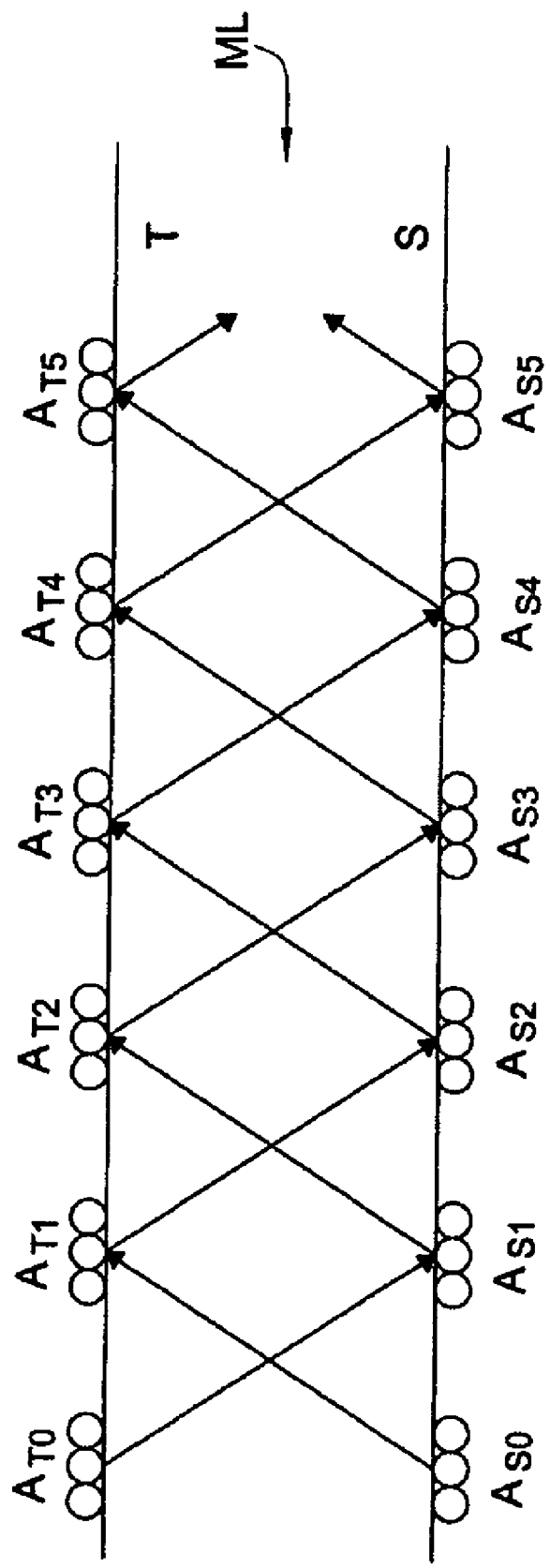

The interference phenomena occurring between two transducers will now be examined with reference to FIG. 15 and, more particularly, the phenomena of multiple reflections between two consecutive interfaces.

A very simple example, illustrated in FIG. 15, will firstly be examined: two transducers S and T disposed facing each other and separated by a homogeneous medium ML. The active face of each transducer can comprise active regions and passive regions. In an active region, the surface velocity of the waves $V_{OS}$ (or $V_{OT}$) in the absence of any interface effect is specified. In a passive region, the surface velocity is zero when it is not influenced by any other source.

$A_{S0}$ and $A_{T0}$ are point sources distributed over the transducers S and T when the effect of interaction between them is ignored. In other words, $A_{S0}$ and $A_{T0}$ represent distributions of point sources used to model the field generated by a transducer in a homogeneous medium in the absence of any other transducer or scattering body.

The field $A_{S0}$ is reflected by the transducer T. This field is modeled by introducing a new layer of sources $A_{T1}$ distributed over the transducer T. Writing the equation for the velocity vectors on the surface S which are produced by the sources $A_{T1}$ and those due to the reflection of the field $A_{S0}$ leads to:

$$M_{TT}A_{T1} = R_T M_{TS} A_{S0} \Rightarrow A_{T1} = [M_{TT}]^{-1} R_T M_{TS} A_{S0} = BA_{S0} \tag{35}$$

The field generated by $A_{T1}$ is subsequently reflected by the transducer S. This field is modeled by introducing a layer of sources $A_{S2}$ distributed over the surface of the transducer S. Writing an equation for the velocity vectors on the surface S which are generated by the sources $A_{S2}$ and those due to the reflection of the field $A_{T1}$ leads to:

$$M_{SS}A_{S2} = R_S M_{ST} A_{T1} \Rightarrow A_{S2} \tag{36}$$
$$= [M_{SS}]^{-1} R_S M_{ST} A_{T1}$$
$$= CA_{T1}$$
$$= CBA_{S0}$$

Repeating these operations for all the other reflections leads to:

$A_{T3} = BCBA_{S0}$ $A_{S4} = CBCBA_{S0}$ $A_{T5} = BCBCBA_{S0}$ $A_{S6} = CBCBCBA_{S0} \tag{37}$ In a similar manner, starting from the sources $A_{T0}$ and combining the field on the surface S coming from $A_{S1}$ and that reflected by $A_{T0}$ leads to:

$$M_{SS}A_{S1} = R_S M_{ST} A_{T0} \Rightarrow A_{S1} \qquad (38)$$

$$= [M_{SS}]^{-1} R_S M_{ST} A_{T0}$$

$$= CA_{T0}$$

and:

$$A_{T2} = BCA_{T0}$$

$$A_{S3} = CBCA_{T0}$$

$$A_{T4} = BCBCA_{T0}$$

$$A_{S5} = CBCBCA_{T0} \qquad (39)$$

Consequently, the source vectors on the transducers S and T may be expressed as follows:

$$\begin{Bmatrix} A_S \\ A_T \end{Bmatrix} = \begin{Bmatrix} A_{S0} + A_{S1} + A_{S2} + A_{S3} + \ldots \\ A_{T0} + A_{T1} + A_{T2} + A_{T3} + \ldots \end{Bmatrix} \qquad (40)$$

$$= \left[ \begin{pmatrix} 1 & 0 \\ 0 & 1 \end{pmatrix} + \begin{pmatrix} 0 & C \\ B & 0 \end{pmatrix} + \begin{pmatrix} CB & 0 \\ 0 & BC \end{pmatrix} + \right.$$

$$\left. \begin{pmatrix} 0 & CBC \\ BCB & 0 \end{pmatrix} + \begin{pmatrix} CBCB & 0 \\ 0 & BCBC \end{pmatrix} + \ldots \right]$$

$$\begin{Bmatrix} A_{S0} \\ A_{T0} \end{Bmatrix} \Rightarrow \begin{Bmatrix} A_S \\ A_T \end{Bmatrix}$$

$$= [D_0 + D_1 + D_2 + D_3 + \ldots] A_0$$

$$= DA_0$$

The velocity vectors and the distribution of the pressure can then be obtained from the following equations:

$$\begin{Bmatrix} V_S \\ V_T \end{Bmatrix} = \begin{bmatrix} M_{SS} & M_{ST} \\ M_{TS} & M_{TT} \end{bmatrix} \begin{Bmatrix} A_S \\ A_T \end{Bmatrix} \qquad (41)$$

$$= M_0 A$$

$$= M_0 D A_0$$

$$= M A_0$$

$$\begin{Bmatrix} P_S \\ P_T \end{Bmatrix} = \begin{bmatrix} Q_{SS} & Q_{ST} \\ Q_{TS} & Q_{TT} \end{bmatrix} \begin{Bmatrix} A_S \\ A_T \end{Bmatrix} \qquad (42)$$

$$= Q_0 A$$

$$= Q_0 D A_0$$

$$= Q A_0$$

If the velocity of the waves emitted by the transducer is invariant, the source vector is obtained from the equation (41):

$$A_0 = M^{-1} \begin{Bmatrix} V_S \\ V_T \end{Bmatrix} \qquad (43)$$

If the surface area of the active region differs from the total surface area of the transducer and if only the velocity vector is specified on the surface of the active region, then:

$$V = \begin{Bmatrix} V_S \\ V_T \end{Bmatrix} = W \begin{Bmatrix} V_S \\ V_T \end{Bmatrix} + \overline{W} \begin{Bmatrix} V_S \\ V_T \end{Bmatrix} \qquad (44)$$

It will be noted that $W + \overline{W}$ must be an identity matrix. The equation (44) may also be written:

$$V = \begin{Bmatrix} V_S \\ V_T \end{Bmatrix} = WM_0 D \begin{Bmatrix} A_{S0} \\ A_{T0} \end{Bmatrix} + \overline{W} M_0 D \begin{Bmatrix} A_{S0} \\ A_{T0} \end{Bmatrix} \qquad (45)$$

with:

$$\begin{Bmatrix} V_S \\ V_T \end{Bmatrix}_{Active} = W \begin{Bmatrix} V_S \\ V_T \end{Bmatrix} \qquad (46)$$

$$\begin{Bmatrix} A_{S0} \\ A_{T0} \end{Bmatrix}_{Active} = W \begin{Bmatrix} A_{S0} \\ A_{T0} \end{Bmatrix}$$

consequently:

$$\begin{Bmatrix} V_S \\ V_T \end{Bmatrix}_{Active} = WM_0 DW \begin{Bmatrix} A_{S0} \\ A_{T0} \end{Bmatrix} + \overline{W} M_0 D \overline{W} \begin{Bmatrix} A_{S0} \\ A_{T0} \end{Bmatrix} \qquad (47)$$

$$= WM_0 DW \begin{Bmatrix} A_{S0} \\ A_{T0} \end{Bmatrix}$$

Given that $A_{S0}$ and $A_{T0}$ are zero in the passive regions, the second term of this equation is zero. By then eliminating the columns with zero content in the expression for $WM_0DW$ and by defining it as a matrix E, the following simplified equation is obtained:

$$\begin{Bmatrix} V_S \\ V_T \end{Bmatrix}_{Active} = E \begin{Bmatrix} A_{S0} \\ A_{T0} \end{Bmatrix}_{Active} \qquad (48)$$

$$\Rightarrow \begin{Bmatrix} A_{S0} \\ A_{T0} \end{Bmatrix}_{Active} = E^{-1} \begin{Bmatrix} V_S \\ V_T \end{Bmatrix}_{Active}$$

Figure 16:
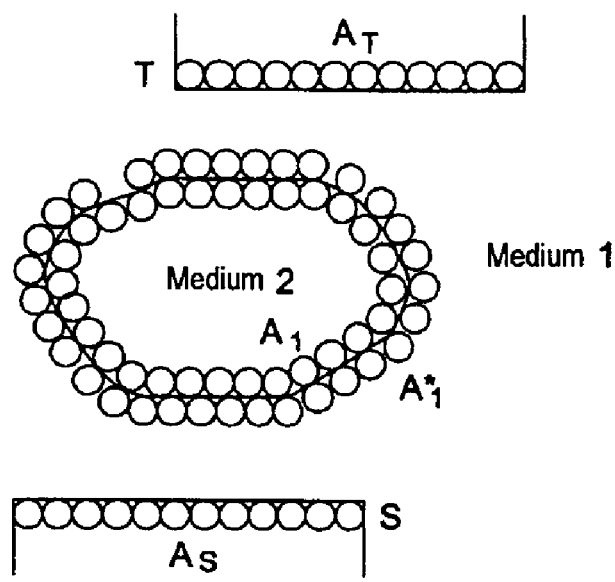

The method of the invention is also applicable to the case of scattering and, in particular, when the scattering body has any given shape and is assumed to be homogeneous, as illustrated in FIG. 16. Such a scattering body may be an inclusion, within a layer of homogeneous medium (called medium 1), or of a material (called medium 2). In such a case, two layers of point sources are implemented: a first layer ($A_1$) inside the scattering body, in contact with its external surface, and a second layer ($A_1^*$) on the external surface of this scattering body, in the medium 1. In addition to these two layers of sources, two layers of point sources $A_S$ and $A_T$ modeling the transducers S and T are taken into account. The total value of the field within the medium 1 is obtained by superimposing three layers of sources $A_S$, $A_T$ and $A_1$, whereas the field within the medium 2 is due to a single layer of sources $A_1^*$. Applying the boundary conditions on the surfaces of the two transducers and the continuity conditions when crossing the interface between the two media in question leads to:

$$M_{SS}A_S + M_{ST}A_T + M_{S1}A_1 = V_{S0}$$

$$M_{TS}A_S + M_{TT}A_T + M_{T1}A_1 = V_{T0}$$

$$M_{1S}A_S + M_{1T}A_T + M_{11}A_1 = M^*_{11}A^*_1$$

$$Q_{1S}A_S + Q_{1T}A_T + Q_{11}A_1 = Q^*_{11}A^*_1 \qquad (49)$$

This equation may be written in the matrix form:

$$\begin{bmatrix} M_{SS} & M_{S1} & 0 & M_{ST} \\ M_{1S} & M_{11} & -M_{11}^* & M_{1T} \\ Q_{1S} & Q_{11} & -Q_{11}^* & Q_{1T} \\ M_{TS} & M_{T1} & 0 & M_{TT} \end{bmatrix} \begin{Bmatrix} A_S \\ A_1 \\ A_1^* \\ A_T \end{Bmatrix} = \begin{Bmatrix} V_{S0} \\ 0 \\ 0 \\ V_{T0} \end{Bmatrix} \quad (50)$$

This matrix equation is solved for the source vectors $A_S$, $A_T$, $A_1$ and $A_1^*$.

The method presented hereinabove allows, in principle, the problem of modeling the interactions in the presence of a scattering body to be solved. However, the problem of the masking due to such an inclusion remains to be solved. Thus, any given point in the medium 1 (hereinafter referred to as 'point in question') does not "see" all the point sources of the layer $A_1$, and it may not be able to see all the point sources of the two transducers. In the previous examples (illustrated by FIGS. 9 to 15), for objects only comprising plane interfaces, this problem did not exist owing to the fact that the point in question was never located in a masked region. In order to get round this difficulty, the point sources are assumed to radiate energy in only one direction, namely into one half-space, whereas the other half-space remains masked, and if the inclusion hinders the path of the rays emitted by a point source of a transducer from reaching this point in question, the contribution of this point source is ignored. This procedure has been illustrated in FIG. 17, again using the same references as in FIG. 16.

Figure 17:
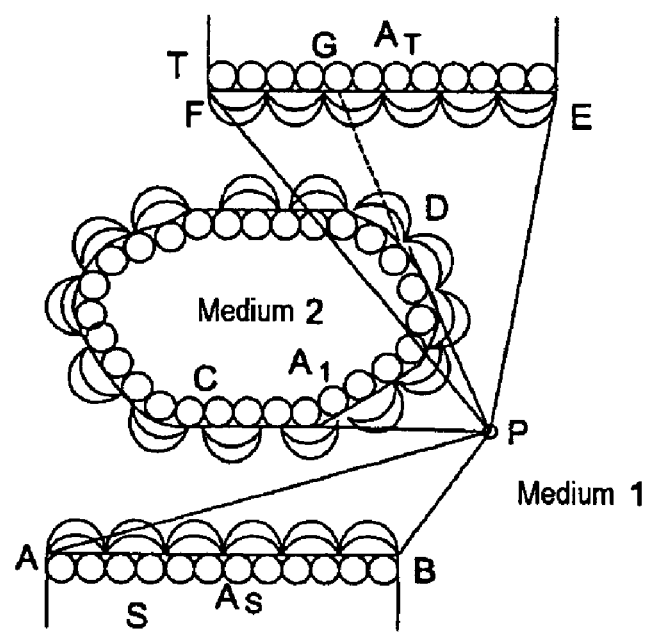

In FIG. 17 the point in question, marked P and situated in the medium 1, is shown together with three layers of point sources ($A_S$, $A_1$ and $A_T$) that contribute to the generation of the field calculated at the point P. If these three layers of point sources only radiate into the front half-space and if the rear half-space remains masked, the radiation pattern relating to these three layers of point sources is such as is represented by the small crescents in FIG. 17. The point P then receives radiation coming from all the point sources $A_S$ situated between the points A and B and also from some of the point sources $A_1$ situated between the points C and D (on the medium 2) and from all the point sources $A_T$ situated between the point E and F. However, in fact, because of the presence of the scattering body between the point P and a part of the point sources $A_T$ situated between the points F and G, the point P is excited only by the point sources $A_T$ situated between the points E and G (the ray joining P to G is tangent to the medium 2). Thus, in order to implement the method of the invention in such a case, it must be determined which point sources can excite the field at the point P and, subsequently, the contributions of all the other point sources are set at zero for this field.

An alternative method, which is easier using a calculation program, for this same case of inclusion of a scattering body will be described with reference to FIG. 18.

Figure 18:
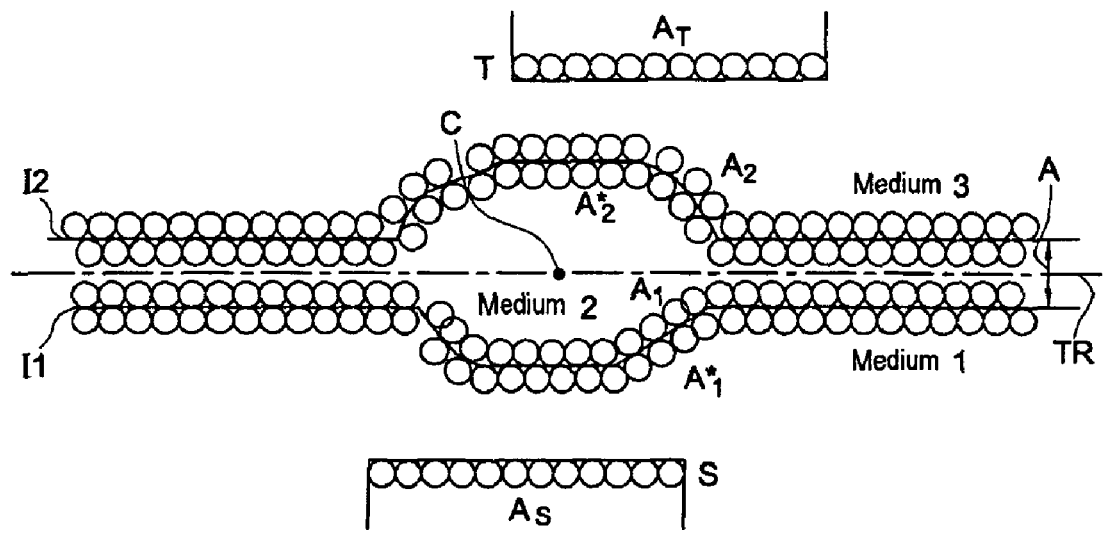

In FIG. 18, between the transducers S and T, three media are shown instead of the two media in FIG. 17. The medium 2 comprises the same inclusion as that in FIG. 17, and is extended by plane layers. This medium 2 is bounded by two interfaces I1, I2 circumventing the inclusion and extending along plane surfaces parallel to the active faces of the transducers S and T and separated from one another by a distance D less than the maximum thickness of the inclusion (maximum thickness of the inclusion, such as determined along a perpendicular to the active faces of the transducers). The mid-plane of these plane surfaces of the interfaces I1, I2 passes substantially through the center C of the medium 2 (it is traced by the line TR passing through C in the drawing).

Medium 1 is that located between the transducer S and the interface I1, and medium 3 that located between the transducer T and the interface I2.

The values of the fields in the media 1, 2 and 3 are obtained by adding the contributions of two layers of point sources, as follows:

Medium 1: Summation of the fields produced by $A_S$ and $A_1$

Medium 2: Summation of the fields produced by $A^*_1$ and $A_2$

Medium 3: Summation of the fields produced by $A^*_2$ and $A_T$

By complying with the boundary conditions on the active faces of the two transducers S and T, and the continuity conditions when crossing the two interfaces respectively separating the media 1 and 2, on the one hand, and the media 2 and 3 on the other, the following is obtained:

$$M_{SS}A_S + M_{S1}A_1 = V_{S0}$$

$$M_{TT}A_T + M^*_{T2}A^*_2 = V_{T0}$$

$$M_{1S}A_S + M_{11}A_1 = M^*_{11}A^*_1 + M_{12}A_2$$

$$Q_{1S}A_S + Q_{11}A_1 = Q^*_{11}A^*_1 + Q_{12}A_2$$

$$M^*_{21}A^*_1 + M_{22}A_2 = M^*_{22}A^*_2 + M_{2T}A_T$$

$$Q^*_{21}A^*_1 + Q_{22}A_2 = Q^*_{22}A^*_2 + Q_{2T}A_T \quad (51)$$

It will be noted that in the example shown in FIG. 18, only a few points of a small region can be located in a masked region, and not taking this into account will only introduce a negligible error.

Figure 19:
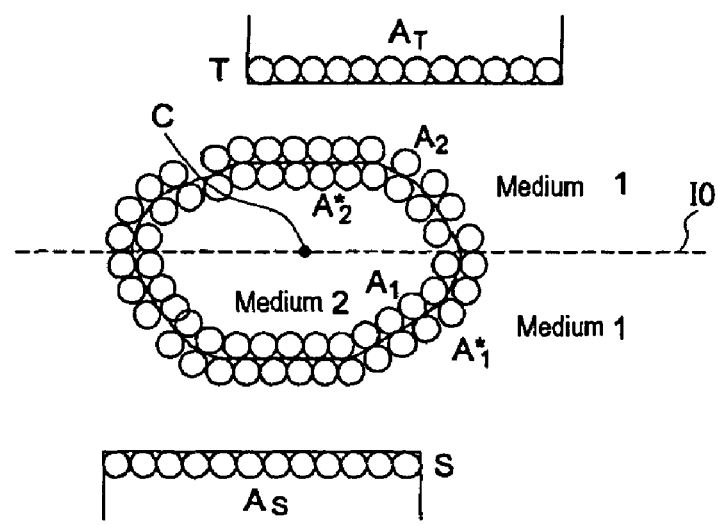

If the properties of the medium 3 are the same as those of the medium 1 and if the distance D is zero, the example in FIG. 18 becomes that shown in FIG. 19. In this FIG. 19, the same elements as those in FIG. 18 are assigned the same references, and owing to the fact that, by assumption, the media 1 and 3 have the same properties and the distance D is zero, the medium 2 is completely surrounded by the medium 1, and the two interfaces I1 and I2 are reduced to one virtual interface I0 passing through the center C of the medium 2 and parallel to the active faces of T and S. The difference with respect to the case shown in FIG. 16 resides in the determination of the point sources. Accordingly, in FIG. 16, the four layers of sources are $A_S$, $A_T$, $A_1$ and $A^*_1$, whereas in FIG. 19, the layers $A_S$ and $A_T$ are identical to those in FIG. 16, while the layer $A_1$ in FIG. 16 is divided into two layers $A_1$ and $A_2$ in FIG. 19, and the layer $A^*_1$ in FIG. 16 is divided into two layers $A_2$ and $A^*_1$ in FIG. 19.

The equation (51) is modified in the following manner to adapt it to the case in FIG. 19:

$$M_{SS}A_S + M_{S1}A_1 + 0 \cdot A^*_2 = V_{S0}$$

$$M_{TT}A_T + 0 \cdot A_1 + M^*_{T2}A^*_2 = V_{T0}$$

$$M_{1S}A_S + M_{11}A_1 + 0 \cdot A^*_2 = M^*_{11}A^*_1 + M_{12}A_2$$

$$Q_{1S}A_S + Q_{11}A_1 + 0 \cdot A^*_2 = Q^*_{11}A^*_1 + Q_{12}A_2$$

$$M^*_{21}A^*_1 + M_{22}A_2 = M^*_{22}A^*_2 + 0 \cdot A_1 + M_{2T}A_T$$

$$Q^*_{21}A^*_1 + Q_{22}A_2 = Q^*_{22}A^*_2 + 0 \cdot A_1 + Q_{2T}A_T \quad (52)$$

which gives:

$$M_{SS}A_S + \begin{bmatrix} M_{S1} & 0 \end{bmatrix} \begin{Bmatrix} A_1 \\ A^*_2 \end{Bmatrix} = V_{S0} \quad (53)$$

-continued $$M_{TT}A_T + \begin{bmatrix} 0 & M_{T2}^* \end{bmatrix} \begin{Bmatrix} A_1 \\ A_2^* \end{Bmatrix} = V_{T0}$$

$$M_{1S}A_S + \begin{bmatrix} M_{11} & 0 \end{bmatrix} \begin{Bmatrix} A_1 \\ A_2^* \end{Bmatrix} = \begin{bmatrix} M_{11}^* & M_{12} \end{bmatrix} \begin{Bmatrix} A_1^* \\ A_2 \end{Bmatrix}$$

$$Q_{1S}A_S + \begin{bmatrix} Q_{11} & 0 \end{bmatrix} \begin{Bmatrix} A_1 \\ A_2^* \end{Bmatrix} = \begin{bmatrix} Q_{11}^* & Q_{12} \end{bmatrix} \begin{Bmatrix} A_1^* \\ A_2 \end{Bmatrix}$$

$$\begin{bmatrix} M_{21}^* & M_{22} \end{bmatrix} \begin{Bmatrix} A_1^* \\ A_2 \end{Bmatrix} = \begin{bmatrix} 0 & M_{22}^* \end{bmatrix} \begin{Bmatrix} A_1 \\ A_2^* \end{Bmatrix} + M_{2T}A_T$$

$$\begin{bmatrix} Q_{21}^* & Q_{22} \end{bmatrix} \begin{Bmatrix} A_1^* \\ A_2 \end{Bmatrix} = \begin{bmatrix} 0 & Q_{22}^* \end{bmatrix} \begin{Bmatrix} A_1 \\ A_2^* \end{Bmatrix} + Q_{2T}A_T$$

The equation (53) may be written in the following matrix form:

$$\begin{bmatrix} M_{SS} & [M_{S1}\ 0] & [0\ 0] & 0 \\ \begin{Bmatrix} M_{1S} \\ 0 \end{Bmatrix} & \begin{bmatrix} M_{11} & 0 \\ 0 & M_{22}^* \end{bmatrix} & -\begin{bmatrix} M_{11}^* & M_{12} \\ M_{21}^* & M_{22} \end{bmatrix} & \begin{Bmatrix} 0 \\ M_{2T} \end{Bmatrix} \\ \begin{Bmatrix} Q_{1S} \\ 0 \end{Bmatrix} & \begin{bmatrix} Q_{11} & 0 \\ 0 & Q_{22}^* \end{bmatrix} & -\begin{bmatrix} Q_{11}^* & Q_{12} \\ Q_{21}^* & Q_{22} \end{bmatrix} & \begin{Bmatrix} 0 \\ Q_{2T} \end{Bmatrix} \\ 0 & [0\ M_{T2}^*] & [0\ 0] & M_{TT} \end{bmatrix} \begin{Bmatrix} A_S \\ \begin{Bmatrix} A_1 \\ A_2^* \end{Bmatrix} \\ \begin{Bmatrix} A_1^* \\ A_2 \end{Bmatrix} \\ A_T \end{Bmatrix} = \begin{Bmatrix} V_{S0} \\ \begin{Bmatrix} 0 \\ 0 \end{Bmatrix} \\ \begin{Bmatrix} 0 \\ 0 \end{Bmatrix} \\ V_{T0} \end{Bmatrix}$$ (54)

In contrast to the solution of the equation (50), the solution of the equation (54) allows the problems associated with the masked regions to be solved.

One embodiment of the method of the invention in the field of electromagnetism and, more particularly, in the field of Foucault currents, when the system possesses several domains, will be described hereinbelow.

Green's theory constitutes one of the numerous calculation techniques that may be used in the field of electromagnetism with a view to solving equations relating to non-homogeneous waves [Ney], such as:

$$\nabla^2 \vec{A} + k^2 \vec{A} = -\mu \cdot \vec{J}$$ (55)

In this equation, $\vec{A}$ represents the magnetic vector potential, and $\vec{J}$ the current density, with:

$$k^2 = \omega^2 \mu \in -j\omega\mu$$ (56)

in which expression:

$\in = \in_0 \cdot \in_r$ with $\in_0 = \frac{1}{36\pi} \cdot 10^{-9}$ $\mu = \mu_0 \cdot \mu_r$ with $\mu_0 = 4\pi \cdot 10^{-7}$ It will be noted that, in the case of a conducting medium, $\omega\sigma\mu \gg \omega^2\mu\in$, which leads to $\sigma \gg \omega\in$, which gives: $k^2 \cong -j\omega\sigma\mu$, and $$k \cong (1-j)\sqrt{\frac{\omega\sigma\mu}{2}},$$

from which the depth of the skin effect can be deduced:

$$\delta = \sqrt{\frac{2}{\omega\sigma\mu}}.$$

Scattering equations are then obtained.

In the opposite case, if the medium is not conducting, $k^2 \cong \omega^2\mu\in$ and if $k \cong \omega\sqrt{\in\mu} = \omega/c$, c being the velocity of the waves, then these are propagation equations, and the wavelength can be defined: $\lambda = 2\pi/k = 2\pi c/\omega$.

Green's theory allows the problem to be formulated in a global fashion, which dovetails perfectly with the DPSM method of the invention according to which, as stated hereinabove, the contributions from all the point sources radiating within the medium in question are summed.

Let $G(\vec{r}, \vec{r}')$ be the pulse response of a medium to a Dirac pulse in a Helmholtz equation and its boundary conditions, which may be written:

$$\nabla^2 G(\vec{r},\vec{r}') + k^2 G(\vec{r},\vec{r}') = \delta(\vec{r}-\vec{r}')$$ (57)

The particular solution is then:

$$\nabla^2 \phi(\vec{r}) + k^2 \phi(\vec{r}) = f(\vec{r})$$ (58)

$\phi$ being an unknown, and where f is the excitation. $\phi$ is given by:

$$\varphi(\vec{r}) = \iiint_V G(\vec{r},\vec{r}') \cdot f(\vec{r}') \cdot dv'$$ (59)

$G(\vec{r}, \vec{r}')$ being the Green's function or the elementary solution associated with the equation (F-4), and f the source in the volume v.

The case of a homogeneous free space will now be examined, for which there is a current density $\vec{J}(\vec{r})$ in a volume v. The magnetic vector potential is then the solution of the equation (F-1). Starting from the equation (57), the Green's function can be obtained in spherical coordinates [Ney]:

$$\frac{1}{R^2}\frac{\partial}{\partial R}\left(R^2 \frac{\partial G(R)}{\partial R}\right) + k^2 G(R) = \delta(r)$$ (60)

$R = \|\vec{r} - \vec{r}'\|$ being the distance between the point of observation and the point of excitation.

The Green's function, solution of the equation (60), is:

$$G(R) = -\frac{e^{-jkR}}{4\pi R}$$ (61)

This solution may be considered as a spherical wave, decreasing with 1/R and having a singularity at the point $R \to 0$.

The particular solution to the excitation $\vec{J}(\vec{r})$ can be obtained by applying the convolution integral (59). This solution, taken with the right-hand side of the equation (55) and with the Green's function (61) may be written as follows:

$$\vec{A}(\vec{r}) = \mu \cdot \int\int_V\int \vec{J}(\vec{r}') \cdot G(R) \cdot dv' \qquad (62)$$
$$= \frac{\mu}{4\pi} \cdot \int\int_V\int \vec{J}(\vec{r}') \cdot \frac{e^{-jkR}}{R} \cdot dv'$$

The magnetic field $\vec{B}$ and the electric field $\vec{E}$ can be deduced from the equation (62). In addition, this equation represents the contribution of the totality of the sources within the volume v' at the point of observation $\vec{r}$. There is an obvious similarity between the Green's formulation and that according to DPSM, except for the fact that the DPSM sources are point sources. It will be noted that, in the equation (62), $\vec{J}(\vec{r}')$ is a current density expressed in A/m².

According to the formulation of the DPSM method, the term $\vec{J}$ represents a finite sum of Ns point sources:

$$\vec{J}(\vec{r}') = \sum_{i=1}^{Ns} \vec{J}_i \cdot \delta(\vec{r}' - \vec{r}_i) \qquad (63)$$

If the equation (F-9) is inserted into the equation (F-8), this leads to:

$$\vec{A}(\vec{r}) = \mu \cdot \sum_{i=1}^{Ns} \vec{J}_i \cdot \int\int_V\int G(\vec{r} - \vec{r}') \cdot \delta(\vec{r}' - \vec{r}_i) dv \qquad (64)$$
$$= \mu \cdot \sum_{i=1}^{Ns} \vec{J}_i \cdot G(\vec{r} - \vec{r}_i)$$

It will be noted that, in the equation (64), considered with the equation (62), $\vec{J}_i$ is equivalent to the current density $\vec{J}(\vec{r})$ which has been integrated into an elementary volume dv and which represents an elementary source vector (triplet source, in other words with three elementary Cartesian components in current units multiplied by a length, namely in A.m in the m.k.s. system).

In Cartesian coordinates, the vector potential, calculated at a point with coordinates $\vec{r}$, is expressed by:

$$\vec{A}(\vec{r}) = \begin{vmatrix} \frac{\mu}{4\pi} \cdot \sum_i Jx_i \cdot \frac{e^{-jkRi}}{R_i} \\ \frac{\mu}{4\pi} \cdot \sum_i Jy_i \cdot \frac{e^{-jkRi}}{R_i} \\ \frac{\mu}{4\pi} \cdot \sum_i Jz_i \cdot \frac{e^{-jkRi}}{R_i} \end{vmatrix} = \begin{vmatrix} Ax(\vec{r}) \\ Ay(\vec{r}) \\ Az(\vec{r}) \end{vmatrix} \qquad (65)$$

with:

$$\vec{R}_i = \vec{r} - \vec{r}_i = \begin{vmatrix} x - Cx_i \\ y - Cy_i \\ z - Cz_i \end{vmatrix}$$

and:

$$\|\vec{R}_i\| = R_i = \sqrt{(x-Cx_i)^2 + (y-Cy_i)^2 + (z-Cz_i)^2}$$

using the point source with coordinates $(Cx_i, Cy_i, Cz_i)$ and the point of observation P with coordinates (x, y, z).

The DPSM method of the invention carries out the summation of the contributions of all the point sources in a given array of points of observation P. If there are for example Np points of observation, for each value of $r_j$, the magnetic vector potential $\vec{A}(\vec{r}_j)$ is composed of three vectors: $\vec{Ax}$, $\vec{Ay}$ and $\vec{Az}$. For example, $\vec{Ax}$ is given by the expression:

$$\vec{Ax} = \frac{\mu}{4\pi} \begin{bmatrix} \frac{e^{-jkR_{11}}}{R_{11}} & \cdots & \cdots & \frac{e^{-jkR_{1Ns}}}{R_{1Ns}} \\ \vdots & & & \vdots \\ \vdots & & & \vdots \\ \frac{e^{-jkR_{Np1}}}{R_{Np1}} & \cdots & \cdots & \frac{e^{-jkR_{NpNs}}}{R_{NpNs}} \end{bmatrix} \cdot \vec{Jx} \Leftrightarrow \vec{Ax} = [Wxx] \cdot \vec{Jx} \qquad (66a)$$

In this expression, $R_{ji}$ is the distance between the points of excitation i and the point of observation j.

Finally, for the vector A comprising all the coordinates x, y and z of A, the following is obtained:

$$\vec{A} = \begin{vmatrix} \vec{Ax} \\ \vec{Ay} \\ \vec{Az} \end{vmatrix} = \begin{bmatrix} Wxx & 0 & 0 \\ 0 & Wyy & 0 \\ 0 & 0 & Wzz \end{bmatrix} \cdot \begin{bmatrix} \vec{Jx} \\ \vec{Jy} \\ \vec{Jz} \end{bmatrix} = W \cdot \vec{J} \qquad (66b)$$

It may also be noted that the components of the elementary triplet $Jx_i$, $Jy_i$, $Jz_i$ are not situated at exactly the same point $\vec{r}_i$ and that the matrix Wxx, Wyy, and Wzz may be slightly different.

Accordingly, the magnetic field $\vec{B}(\vec{r})$ at a given point $\vec{r}$ is obtained with the equation: $\vec{B}(\vec{r}) = \overrightarrow{rot}\, \vec{A}(\vec{r})$ And then:

$$\overrightarrow{rot}\, \vec{A}(\vec{r}) = \begin{vmatrix} \frac{\partial Az}{\partial y} - \frac{\partial Ay}{\partial z} \\ \frac{\partial Ax}{\partial z} - \frac{\partial Az}{\partial x} \\ \frac{\partial Ay}{\partial x} - \frac{\partial Ax}{\partial y} \end{vmatrix}$$

being:

$$\vec{A}(\vec{r}) = \begin{vmatrix} \frac{\mu}{4\pi} \cdot \sum_i Jx_i \cdot \frac{e^{-jkRi}}{R_i} \\ \frac{\mu}{4\pi} \cdot \sum_i Jy_i \cdot \frac{e^{-jkRi}}{R_i} \\ \frac{\mu}{4\pi} \cdot \sum_i Jz_i \cdot \frac{e^{-jkRi}}{R_i} \end{vmatrix} \Leftrightarrow \frac{4\pi}{\mu} \cdot \vec{A}(\vec{r}) = \sum_{i=1}^{Ns} \begin{vmatrix} Jx_i \cdot \frac{e^{-jkRi}}{R_i} \\ Jy_i \cdot \frac{e^{-jkRi}}{R_i} \\ Jz_i \cdot \frac{e^{-jkRi}}{R_i} \end{vmatrix} \qquad (67)$$

Let $\vec{A}(\vec{r})$ be the curvilinear coordinates such that:

$$\vec{rot}\vec{A}(\vec{r}) = \begin{vmatrix} rotAx \\ rotAy \\ rotAz \end{vmatrix}$$

with:

$$rotAx = \frac{\partial Az}{\partial y} - \frac{\partial Ay}{\partial z}$$

$$rotAy = \frac{\partial Ax}{\partial z} - \frac{\partial Az}{\partial x}$$

$$rotAz = \frac{\partial Ay}{\partial x} - \frac{\partial Ax}{\partial y}$$

For a single source i, the partial derivatives give:

$$\frac{\partial R_i}{\partial y} = \frac{y - Cy_i}{R_i} \Rightarrow \frac{\partial(e^{-jkR_i}/R_i)}{\partial y}$$

$$= \frac{-(1/R_i + jk) \cdot (y - Cy_i) \cdot e^{-jkR_i}}{R_i^2}$$

or:

$$\frac{4\pi}{\mu} \cdot \frac{\partial Az_i}{\partial y} = \frac{Jz_i \cdot e^{-jk \cdot R_i}}{R_i^2}\left[-j \cdot k - \frac{1}{R_i}\right] = (y - Cy_i) \cdot Jz_i \cdot \alpha_i$$

$$\frac{4\pi}{\mu} \cdot \frac{\partial Ay_i}{\partial z} = \frac{Jy_i \cdot e^{-jk \cdot R_i}}{R_i^2}\left[-j \cdot k - \frac{1}{R_i}\right] = (z - Cz_i) \cdot Jy_i \cdot \alpha_i$$

with $$\alpha_i = -\frac{e^{-jk \cdot R_i}}{R_i^2}\left[j \cdot k + \frac{1}{R_i}\right]$$

Hence, for the coordinate rotAx, this leads to:

$$\frac{4\pi}{\mu} \cdot rotAx = \sum_i \alpha_i \cdot ((z - Cz_i) \cdot Jy_i - (y - Cy_i) \cdot Jz_i)$$

The same holds for the coordinates rotAy and rotAz:

$$\frac{4\pi}{\mu} \cdot rotAy = \sum_i \alpha_i \cdot ((x - Cx_i) \cdot Jz_i - (z - Cz_i) \cdot Jx_i)$$

$$\frac{4\pi}{\mu} \cdot rotAz = \sum_i \alpha_i \cdot ((y - Cy_i) \cdot Jx_i - (x - Cx_i) \cdot Jy_i)$$

and finally:

$$\vec{B}(\vec{r}) = \sum_i \begin{vmatrix} \frac{\alpha_i \cdot \mu}{4\pi} \cdot [-(z - Cz_i) \cdot Jy_i + (y - Cy_i) \cdot Jz_i] \\ \frac{\alpha_i \cdot \mu}{4\pi} \cdot [-(x - Cx_i) \cdot Jz_i + (z - Cz_i) \cdot Jx_i] \\ \frac{\alpha_i \cdot \mu}{4\pi} \cdot [-(y - Cy_i) \cdot Jx_i + (x - Cx_i) \cdot Jy_i] \end{vmatrix} \quad (68a)$$

again with:

$$\alpha_i = -\frac{e^{-jk \cdot R_i}}{R_i^2}\left[j \cdot k + \frac{1}{R_i}\right]$$

This equation may also be written in matrix form, as in the case of the equation (F-12b), for an array of Np points of observation:

$$\vec{B} = \begin{vmatrix} \vec{Bx} \\ \vec{By} \\ \vec{Bz} \end{vmatrix} = \begin{bmatrix} 0 & -Bzy & Byz \\ Bzx & 0 & -Bxz \\ -Byx & Bxy & 0 \end{bmatrix} \cdot \begin{bmatrix} \vec{Jx} \\ \vec{Jy} \\ \vec{Jz} \end{bmatrix} = X \cdot \vec{J} \quad (68b)$$

In this equation, $B_{\alpha\beta}$ are matrix-blocks in which the indices $\alpha$ and $\beta$ respectively indicate the axis of differentiation and the axis of orientation of the components of the elementary point sources.

It will be noted that, in the static case ($\omega$=0), exactly the same result as with the Biot and Savart equation is obtained:

$$\vec{B} = -\frac{\mu}{4\pi} \cdot \frac{i \cdot d\vec{l} \wedge \vec{R}}{R^3}$$

taking:

$$\vec{J} = \begin{vmatrix} Jx \\ Jy \\ Jz \end{vmatrix} = i \cdot d\vec{l} = \begin{bmatrix} i \cdot dx \\ i \cdot dy \\ i \cdot dz \end{bmatrix} \quad (68c)$$

Finally, in the case with no electrostatic components, the electrostatic field $\vec{E}$ is obtained by the relationship:

$$\vec{E} = -\frac{\partial \vec{A}}{\partial t} = -j\omega\vec{A} \quad (69a)$$

Using a different gauge, for example a Lorentz gauge (see above, just before the description of FIG. 9, the paragraph relating to the gauges), the following is obtained:

$$\vec{E} = -j\omega\left(\vec{A} + \frac{1}{\omega^2\mu\varepsilon} \cdot \overrightarrow{grad}(div(\vec{A}))\right) \quad (69b)$$

The equations (68) and (69) express the electric and magnetic fields according to the DPSM method of the invention. Green's theory has been adapted to the DPSM method in order to implement the concept of point sources. Hereinbelow, the boundary conditions are described with a view to imposing the continuity of the potential when crossing the surfaces in the formulation DPSM/Green. It will be noted that one of the important features in the DPSM formulation consists in placing, on either side of an interface, arrays of virtual point sources (triplets of current sources in the case of electromagnetism) in order to synthesize the fields within the media separated by this interface. Thanks to the formulation using global matrices, the method of the invention is not limited to simple geometries, but may be applied to all kinds of surfaces and to objects comprising several interfaces.

Boundary Conditions

According to the DPSM method of the invention, whether it be in the fields of ultrasonics, of magnetostatics or of electrostatics, for example, the boundary conditions are satisfied by imposing the continuity of a potential and of its first derivative along the normal $\vec{n}$ to the surface of separation. In the application to electromagnetism, this formulation leads to imposing the continuity of the magnetic vector potential $\vec{A}$ and of its first derivative along the normal $\vec{n}$ at each point of the interface $$\frac{1}{\mu} \cdot \frac{\partial \vec{A}}{\partial \vec{n}}.$$

Figure 20:
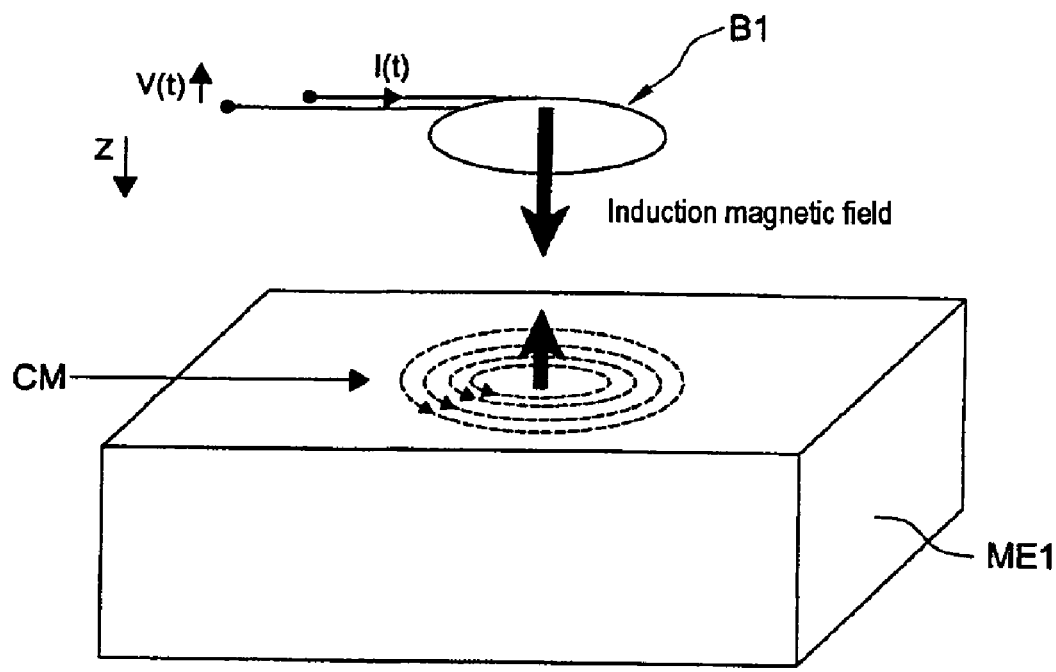
FIGS. 20 to 27 are schematic diagrams relating to the application of the method of the invention to non-destructive tests using Foucault currents.
Figure 21:
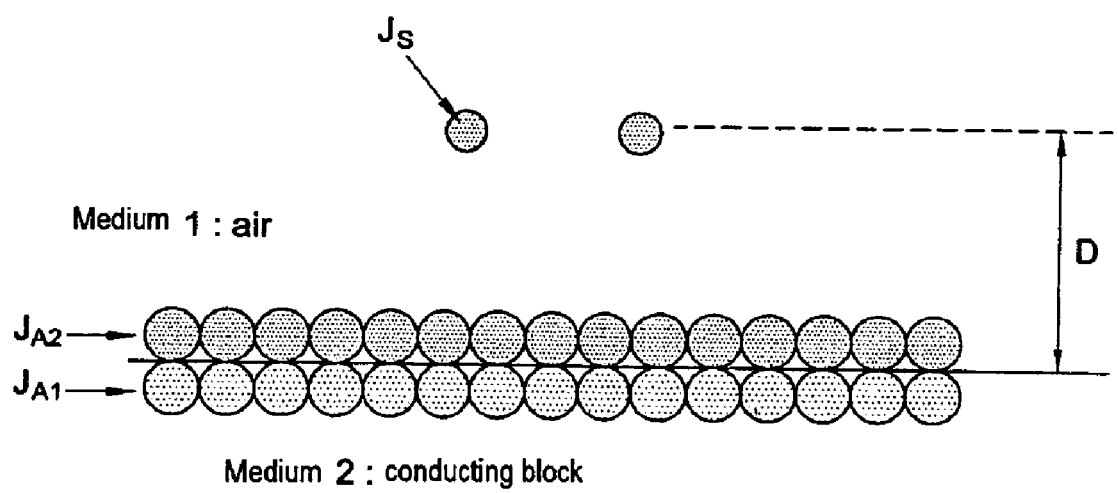

For example, for the case illustrated in FIGS. 20 and 21, the magnetic potential $\vec{A_1}$ is calculated in the medium 1 by superimposing the effects of the sources $\vec{J}_S$ and $\vec{J}_{A1}$, whereas the magnetic potential $\vec{A_2}$ in the medium 2 results solely from the sources $\vec{J}_{A2}$. Accordingly, the following can be written:

$$\begin{cases} \vec{A_1} = \vec{A_2} \\ \frac{1}{\mu_1} \cdot \frac{\partial \vec{A}}{\partial \vec{n}} = \frac{1}{\mu_2} \cdot \frac{\partial \vec{A_2}}{\partial \vec{n}} \end{cases} \quad (70)$$

The variations of the vector potential $\vec{A}$ along the normal $\vec{n}$ to the interface may be expressed, in the general case:

$$\frac{\partial \vec{A}(\vec{r})}{\partial \vec{n}} = \begin{bmatrix} \frac{\partial Ax}{\partial x} & \frac{\partial Ax}{\partial y} & \frac{\partial Ax}{\partial z} \\ \frac{\partial Ay}{\partial x} & \frac{\partial Ay}{\partial y} & \frac{\partial Ay}{\partial z} \\ \frac{\partial Az}{\partial x} & \frac{\partial Az}{\partial y} & \frac{\partial Az}{\partial z} \end{bmatrix} \cdot \begin{bmatrix} n_x \\ n_y \\ n_z \end{bmatrix} \quad (71)$$

In the particular case shown in FIG. 20, the vector $\vec{n}$ coincides with the z-axis, which means that the preceding equation becomes:

$$\frac{\partial \vec{A}(\vec{r})}{\partial \vec{z}} = \begin{bmatrix} \frac{\partial Ax}{\partial x} & \frac{\partial Ax}{\partial y} & \frac{\partial Ax}{\partial z} \\ \frac{\partial Ay}{\partial x} & \frac{\partial Ay}{\partial y} & \frac{\partial Ay}{\partial z} \\ \frac{\partial Az}{\partial x} & \frac{\partial Az}{\partial y} & \frac{\partial Az}{\partial z} \end{bmatrix} \cdot \begin{bmatrix} 0 \\ 0 \\ 1 \end{bmatrix} \quad (72a)$$

$$= \begin{bmatrix} \frac{\partial Ax}{\partial z} \\ \frac{\partial Ay}{\partial z} \\ \frac{\partial Az}{\partial z} \end{bmatrix}$$

$$= \sum_i \begin{vmatrix} \frac{\alpha_i \cdot \mu}{4\pi} \cdot [(z - Cz_i) \cdot Jx_i] \\ \frac{\alpha_i \cdot \mu}{4\pi} \cdot [(z - Cz_i) \cdot Jy_i] \\ \frac{\alpha_i \cdot \mu}{4\pi} \cdot [(z - Cz_i) \cdot Jz_i] \end{vmatrix}$$

Let $$\frac{\partial \vec{A}(\vec{r})}{\partial \vec{n}} = \overrightarrow{dn\vec{A}}(\vec{r}).$$

Using the same derivatives and notations as for the equations (66b) and (68b), and for a given array of Np points of observation, for this particular case for which $\vec{n} = \vec{z}$, the following may be written:

$$\overrightarrow{dnA} = \begin{vmatrix} dn\vec{A}x \\ dn\vec{A}y \\ dn\vec{A}z \end{vmatrix} = \begin{bmatrix} Yzx & 0 & 0 \\ 0 & Yzy & 0 \\ 0 & 0 & Yzz \end{bmatrix} \cdot \begin{bmatrix} J\vec{x} \\ J\vec{y} \\ J\vec{z} \end{bmatrix} = Y \cdot \vec{J} \quad (72b)$$

In FIG. 21, a configuration is shown for which there are sources $\vec{J}_S$ (situated within the medium 1), an interface between the media with their associated layers of DPSM sources $\vec{J}_{A1}$ and $\vec{J}_{A2}$ (respectively oriented toward the outside so as to radiate into the medium 1 and toward the inside so as to radiate into the medium 2). The boundary conditions according to the method of the invention then become:

Potential $\overrightarrow{A_{1S}}$ and its first derivative $\overrightarrow{dnA_{1S}}$ induced on the face "1" of the interface and created by the sources $\vec{J}_S$ (inductor):

$$\overrightarrow{A_{1S}} = W_{1S} \cdot \vec{J}_S$$

$$\overrightarrow{dnA_{1S}} = Y_{1S} \cdot \vec{J}_S \quad (73a)$$

Potential $\overrightarrow{A_{11}}$ and its first derivative $\overrightarrow{dnA_{11}}$ induced on the face "1" of the interface and created by the sources $\vec{J}_{A1}$ (external DPSM layer):

$$\overrightarrow{A_{11}} = W_{11} \cdot \vec{J}_{A1}$$

$$\overrightarrow{dnA_{11}} = Y_{11} \cdot \vec{J}_{A1} \quad (73b)$$

Potential $\overrightarrow{A_{22}}$ and its first derivative $\overrightarrow{dnA_{22}}$ induced on the face "1" of the interface and created by the sources $\vec{J}_{A2}$ (internal DPSM layer):

$$\vec{A_{22}} = W_{22} \cdot \vec{J_{A2}}$$

$$\overrightarrow{dnA_{22}} = Y_{22} \cdot \vec{J_{A2}} \quad (73c)$$

The values of $\vec{A}$ and of $\overrightarrow{dnA}$ along the interface must satisfy the following equations:

$$W_{1S} \cdot \vec{J_S} + W_{11} \cdot \vec{J_{A1}} - W_{22} \cdot \vec{J_{A2}} = 0$$

$$1/\mu_1 \cdot Y_{1S} \cdot \vec{J_S} + 1/\mu_1 \cdot Y_{11} \cdot \vec{J_{A1}} - 1/\mu_2 \cdot Y_{22} \cdot \vec{J_{A2}} = 0 \quad (74a)$$

Given that $J_S$ is well known, the following can be written: $J_S = I \cdot J_S$, I being the identity 3Ns×3Ns matrix, which gives:

$$\begin{bmatrix} \vec{J_S} \\ \vec{0} \\ \vec{0} \end{bmatrix} = \begin{bmatrix} I & 0 & 0 \\ W_{1S} & W_{11} & -W_{22} \\ 1/\mu_1 * Y_{1S} & 1/\mu_1 * Y_{11} & -1/\mu_2 * Y_{22} \end{bmatrix} * \begin{bmatrix} \vec{J_S} \\ \vec{J_{A1}} \\ \vec{J_{A2}} \end{bmatrix} \quad (74b)$$

As explained hereinabove in more detail, the unknowns $\vec{J}_{A1}$ and $\vec{J}_{A2}$ are obtained by inversion of the equation (74b), in which the global matrix is always square, owing to the fact that $W_{1S}$ is a matrix of dimension 3Np×3Ns, that $W_{11}$ is a matrix of dimension 3Np×3Np and that $W_{22}$ is a matrix of dimension 3Np×3Np, which means that the global matrix is square and of dimension 3(Ns+Np+Np)×3(Ns+Np+Np).

Given that all the values of the point sources are well known, the fields in given discretized regions of space are calculated in order to observe the results of the modeling according to the invention.

The results obtained with the experimental device in FIG. 20 are described here. It will however be noted that this, apparently simple, problem is very difficult to solve analytically [Dodd 68], even when the induction loop is parallel to the plane surface of the interface. Furthermore, in other scenarios, for example when the induction loop is inclined with respect to the interface, the analytical calculation becomes even more complex, whereas the DPSM solution remains just as simple.

In FIG. 20 is shown a block of electrically-conducting material ME1 considered as having a semi-infinite thickness above which is disposed, at a distance D from the upper face of the block, a conducting loop B1 powered by a voltage V(t). The block ME1 here has the shape of a rectangular parallelepiped and it is considered as being semi-infinite given that its upper face is that facing the loop B1 and its dimensions are greater than the wavelength of the voltage V(t). The loop B1 induces a magnetic field CM in the block ME1.

Figure 22:
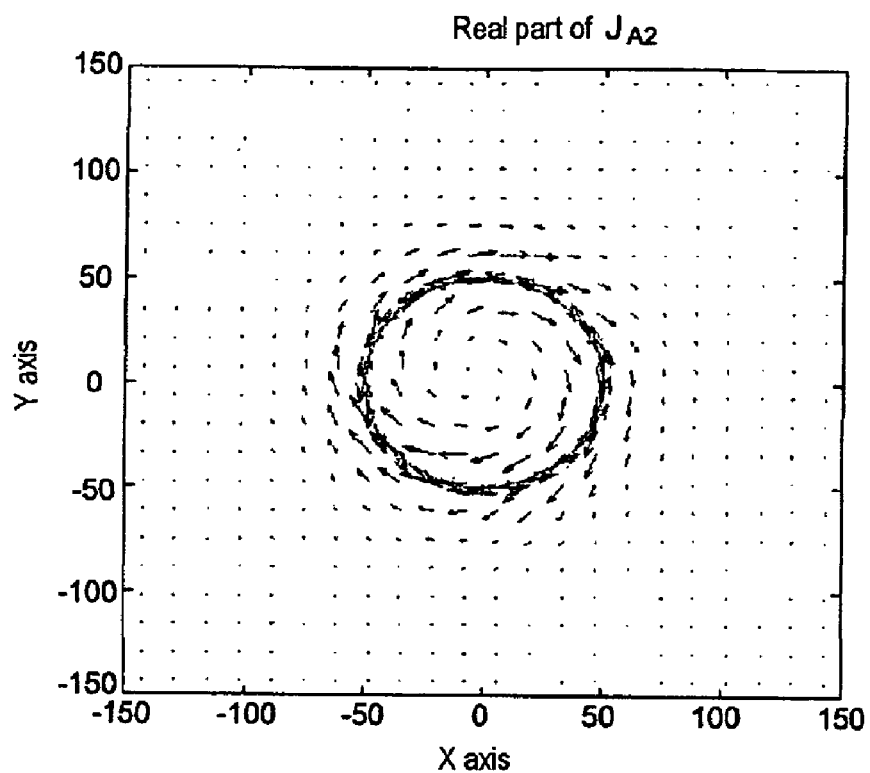
Figure 23:
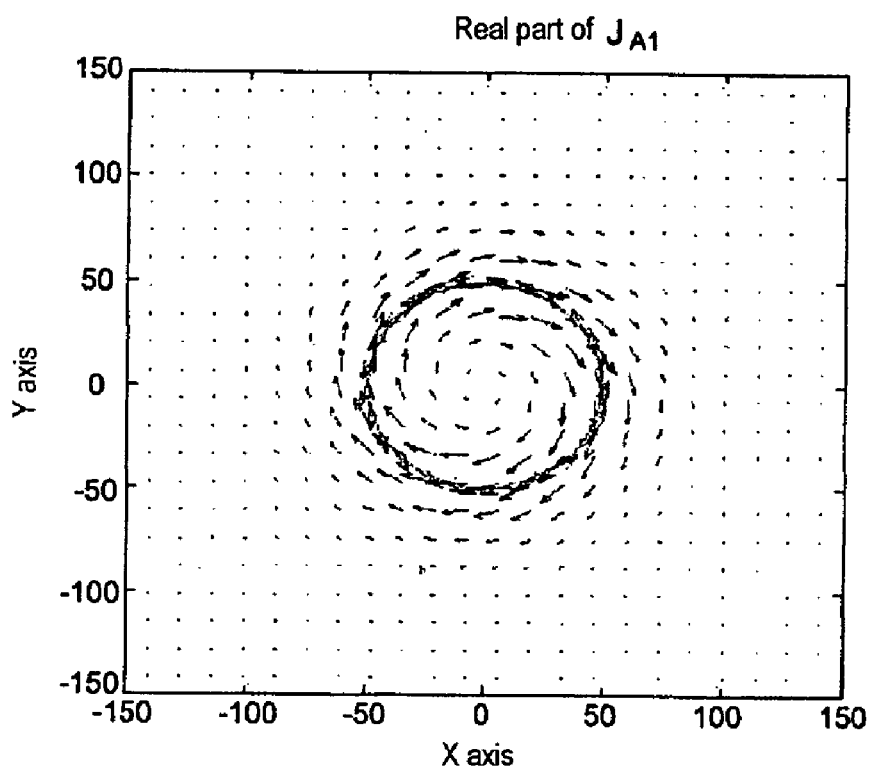

According to one exemplary embodiment, to which the FIGS. 22 and 23 relate, the loop B1 has a diameter of 50 mm, is mesh modeled by $N_S$ current elements $J_S$ (virtual excitation sources) and is firstly parallel to the upper face of the block ME1, at a distance of D=20 mm from the latter; the upper face of the block ME1 is a square of 300×300 mm and the air/block interface is mesh modeled by $N_P$=22×22=484 triplets of elementary sources $$\vec{J}_i = \begin{vmatrix} \vec{J}_{xi} \\ \vec{J}_{yi} \\ \vec{J}_{zi} \end{vmatrix}$$

on either side of this interface.

In FIG. 21, the distribution of the virtual point sources according to the method of the invention is shown schematically. In order to model the loop, a layer of excitation primary point sources $J_S$ in the plane of the loop B1, and layers of secondary point sources $\vec{J_{A1}}$ and $\vec{J_{A2}}$ on either side of the air/block interface ME1 are shown, the sources $\vec{J_{A2}}$ being on the exterior, air side, as stated hereinabove. It will be noted that the pitch of the sources $J_S$ is greater than that of the other sources owing to the fact that the loop B1 is a single turn.

In FIGS. 22 and 23 a top view is shown of the distribution of the real part of the sources $\vec{J_{A1}}$ and $\vec{J_{A2}}$ respectively, in a plane parallel to the air/block interface ME1, the block B1 being made of aluminum and the frequency of the voltage V(t) being 1000 Hz. In an analogous manner, in FIGS. 24 and 25 is shown the distribution of these sources in the case where the loop B1 is inclined at 10°, the distance between the center of the loop and the block being 50 mm, and the frequency of the voltage V(t) being 100 Hz.

Figure 24:
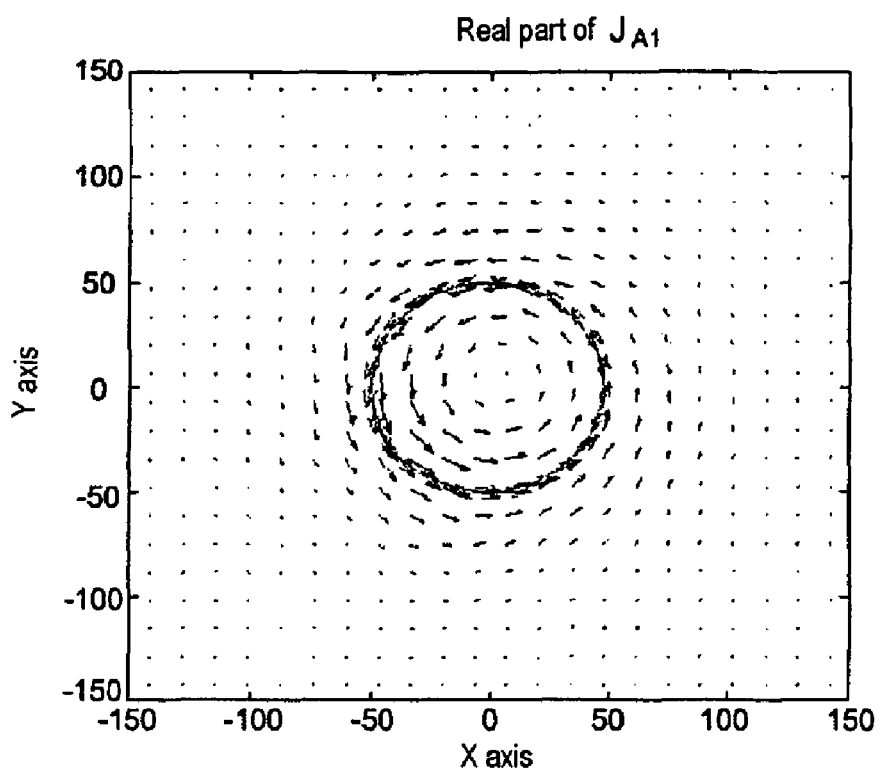
Figure 25:
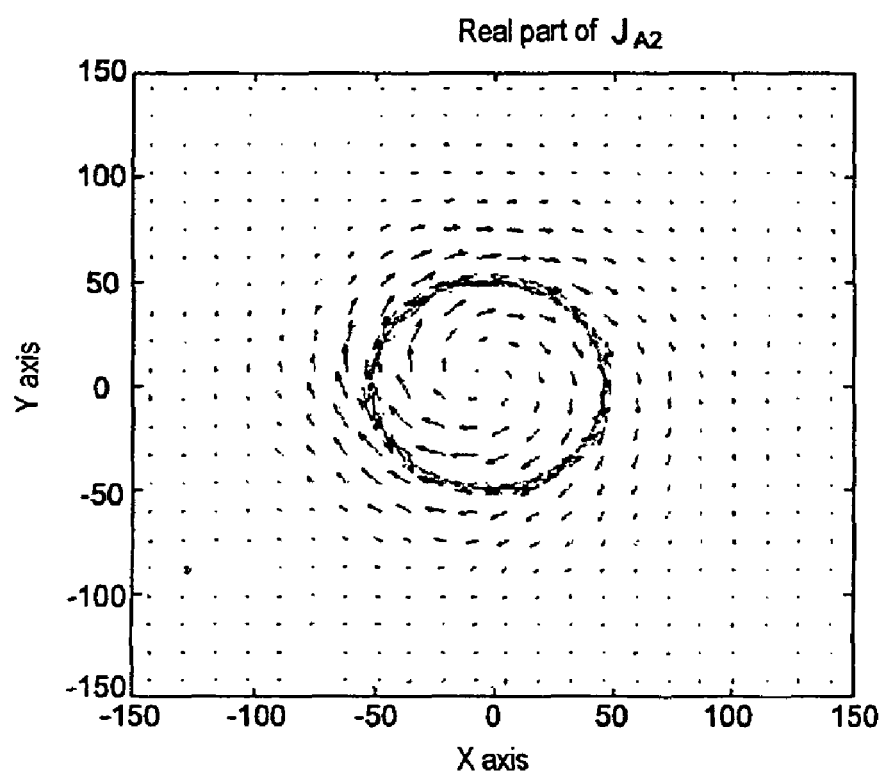
Figure 26:
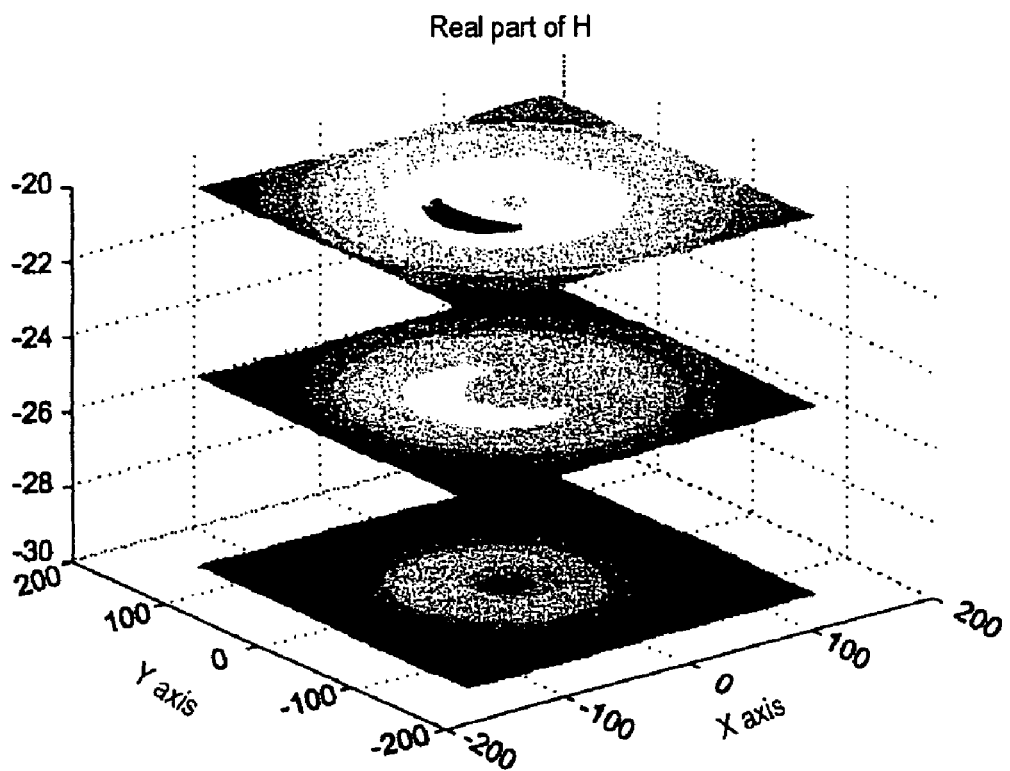
Figure 27:
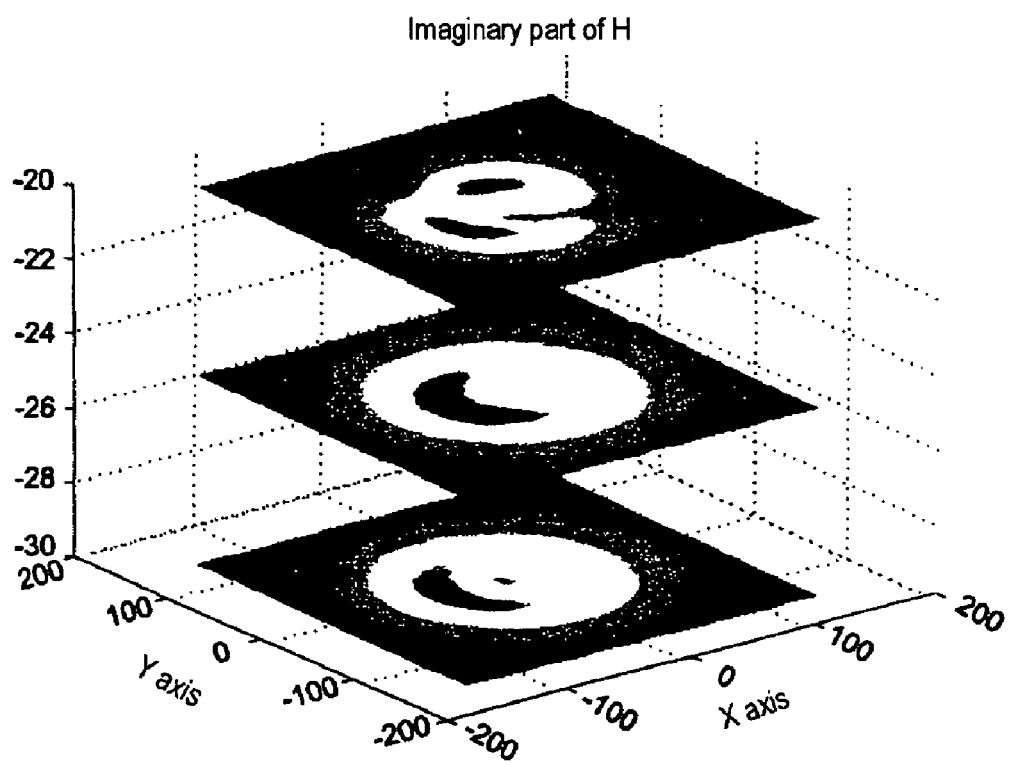

Finally, in FIGS. 26 and 27, for the case corresponding to FIGS. 24 and 25, the real and imaginary parts of the magnetic field H are shown at three different levels, namely in the plane of the upper face of the block ME1, in a plane situated at 5 mm from this face, inside the block and at 10 mm from this face, again inside the block. All the coordinates of these FIGS. 22 to 27 are graduated in millimeters.

Of course, the invention can be implemented for anisotropic media, for which the elementary characteristic functions can also be obtained analytically.

The DPSM sources are, in the majority of cases, "fictitious" sources, since they are disposed (on either side of the interfaces notably) with the sole aim of synthesizing a physical quantity within a given region of space, in place of the real influence of the objects that compose the system to be modeled.

There exist some cases, however, where these DPSM sources are no longer fictitious to this extent. In electrostatics, for example, the distribution of DPSM charges in the neighborhood of a surface can sometimes represent reasonably faithfully the real distribution of electrostatic charges accumulated at the surface of the object: the case of the capacitor electrodes illustrates well this property. These charges then obey the same laws as the real electrostatic charges.

This interesting property may be illustrated with the aid of an example that consists in calculating the potential acquired by objects that are said to be "at floating potential" in an electrostatic field by observing that, since they are electrically isolated, their total charge remains zero.

Hereinbelow, a simplified example is shown in which two conducting objects A and B are placed in a homogeneous medium. The potential v1 is applied to the object A (the 0 reference potential being situated at infinity). The charges appearing on A create an electrostatic field which displaces the free charges of the conductor B to its surface in order to ensure an electric field of zero inside the conductor. The conductor B therefore has a uniform potential v2 and keeps a charge sum of zero.

Theoretically, the potential v2 has a value determined by the capacitance coefficients of the system (see "*Study, design, fabrication and test of an RF MEMS variable capacitance for*

*the processing of frequencies between 0.5 and 20 GHz*" thesis Aurélie Cruau, January 2005—Chapter 4, p 120 and p 125):

$$qt_2 = 0 \Rightarrow v_2 = -\frac{c_{21}}{c_{22}} \cdot v_1.$$

For the DPSM method, each conductor is represented by an assembly of point sources Ai (internal sources radiating to the exterior—light gray squares) and a corresponding assembly of test points placed at the surface, where the boundary conditions apply (black dots).

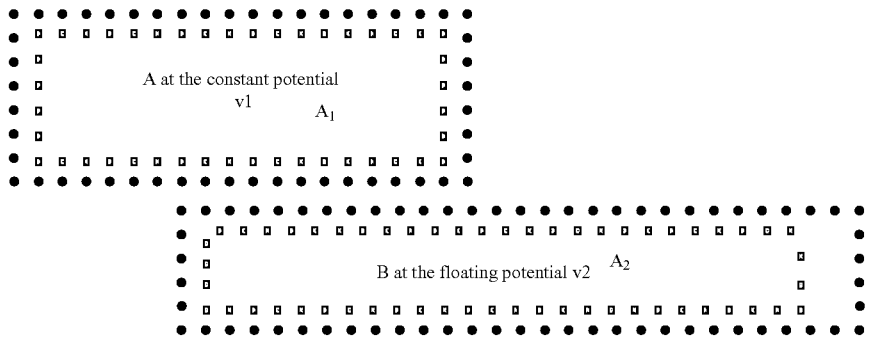

In this example, the objects A and B have been respectively mesh modeled with N1 and N2 test points, and respectively comprise N1 and N2 point sources (layers $A_1$ and $A_2$) which here are electrostatic charges. Let $P_1$ be the vector containing the values of the potential at all the test points on the object A ($P_1$ is fixed by the user), and $P_2$ the vector containing the values of the potential at all the test points on the object B. Now, the assumption made here is that the object B is conducting, and the consequence is the uniformity of the potential at its surface: $P_2$ may be written:

$$P_2 = v_2 * \begin{bmatrix} 1 \\ \vdots \\ 1 \end{bmatrix} = \begin{bmatrix} v_2 \\ \vdots \\ v_2 \end{bmatrix}$$

(The same goes for $P_1$ if the user decides to apply the same potential at all the test points on the object A).

In order to solve the problem, the boundary conditions fixed by the user on the object A must be taken into account and the value of the sources $A_1$ and $A_2$, together with the potential $P_2$ on the object B, must be calculated. Therefore: N1+N2+1 equations are needed, since there are N1+N2+1 unknowns.

The DPSM method represents this problem by the following system of equations, taking into account the properties stated above:

$$\begin{cases} Q_{11} \cdot A_1 + Q_{12} \cdot A_2 = P_1 \\ Q_{21} \cdot A_1 + Q_{22} \cdot A_2 = P_2 = \begin{bmatrix} v_2 \\ \vdots \\ v_2 \end{bmatrix} \\ \sum_{n_2} A_2 = 0 \end{cases}$$

in which Ai is the internal charge vector of the conductor i, Qij the DPSM coupling matrices, and Pi the potential vector of the conductor i.

The unknown values are $A_1$, $A_2$ and $v_2$.

The following matrix is obtained, which just needs to be inverted in order to obtain the result:

$$\begin{array}{cccc} P_1 & Q_{11} & Q_{12} & 0_{n_1,1} & A_1 \\ 0_{n_2,1} = & Q_{21} & Q_{22} & 1_{n_2,1} & A_2 \\ 0_{1,1} & 0_{1,n_1} & 1_{1,n_2} & 0_{1,1} & v_2 \end{array}$$

REFERENCES

[DODD 68]: C. V. Dodd and W. E. Deed, '*Analytical solutions to eddy current probe-coil problems*', Journal of Applied Physics, 39(6), pages 2829 à 2838, 1968.

[Ney]: Michel Ney, 'Bases de l'électromagnétisme', Techniques de l'Ingénieur, ref. E1020.

The invention claimed is:

1. A method for modeling interactions within a system between at least one wave and at least two objects, a surface of each object defining an interface between at least two media, wherein this method comprises the following steps:
   a user entering into a computer a set of elementary characteristic functions for a computer model that correspond to a field of the interactions,
   the user entering into the computer model physical properties of each medium in the system,
   the user entering into the computer model a geometrical structure of each object of the system and the computer modeling the geometrical structure as a mesh, the computer positioning at least one test point at a surface of each element of the mesh,
   the user defining at each test point, at least one test quantity for each medium,
   the user associating at least one elementary point source with a side of each mesh element, the user positioning the objects in the computer model with respect to one another within a volume in the computer model, the user associating in the computer model the physical properties of a one of the media with the volumes bounded by the objects, the user entering into the computer model a type of boundary condition for each interface, the computer constructing a global matrix for the interactions between the objects, the global matrix being formed from at least one matrix block characterizing the interactions between the objects taken in pairs, the interactions based on a propagation of the wave in the medium of the objects using the characteristic elementary functions chosen, the global matrix comprising, at the most, as many blocks as there are possible combinations between all the objects taken in pairs, a content of each block comprising the defined test quantity at the test points of the respective pair of objects, and on the geometrical configuration of each pair of objects, inverting the global matrix, the computer multiplying the inverted matrix by a column matrix containing values for boundary conditions imposed by the user, and, zeros for intrinsic boundary conditions, to obtain a column matrix that contains values of all of the elementary point sources, the computer calculating at points in a display space, physical quantities representing the interactions between the at least one wave and at least two objects, based on the values of all of the elementary point sources, wherein the physical quantities are at least one of electromagnetic, magnetic, acoustic, optical, geophysical, Foucault currents, or thermal quantities, and the computer displaying the physical quantities representing the interactions.

2. The method as claimed in claim 1, wherein the test points are distributed randomly from one mesh element to a next mesh element in such a manner as to avoid favoring at least one particular direction of propagation of the at least one wave.

3. The method as claimed in claim 1, wherein macroscopic quantities are calculated in at least one part of the system.

4. The method as claimed in claim 1, wherein at least one of the objects is an open-volume object the surface of which is open representing an interface between semi-infinite media.

5. The method as claimed in claim 4, wherein, the open-volume object is laterally bounded by a set of boundaries which define the volume.

6. The method as claimed in claim 1, wherein the intrinsic boundary conditions represent continuity of scalar and/or vector quantities when crossing an interface between two media with determined or determinable properties, and the boundary conditions fixed by the user, represent a priori knowledge that the user has of the scalar and/or vector quantity for an interface.

7. The method as claimed in claim 6, wherein the boundary conditions fixed by the user are satisfied by a single set of elemental sources situated on one side of the interface.

8. The method as claimed in claim 1, wherein the characteristic functions are calculated in an anisotropic medium.

9. The method as claimed in claim 1, wherein at least one of the elementary characteristic functions is a Green's function.

10. The method as claimed in claim 1, wherein at least one object is a closed-volume object the surface of which is closed and forms a boundary between the medium external to the object and a medium internal to the object.

* * * * *